United States Patent
Maruyama et al.

(10) Patent No.: US 7,174,629 B2
(45) Date of Patent: Feb. 13, 2007

(54) INTEGRATED CIRCUIT CONTACTOR, AND METHOD AND APPARATUS FOR PRODUCTION OF INTEGRATED CIRCUIT CONTACTOR

(75) Inventors: Shigeyuki Maruyama, Kawasaki (JP); Makoto Haseyama, Kawasaki (JP); Futoshi Fukaya, Kawasaki (JP); Susumu Moriya, Kawasaki (JP); Naomi Miyaji, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 411 days.

(21) Appl. No.: 10/369,711

(22) Filed: Feb. 21, 2003

(65) Prior Publication Data

US 2003/0132027 A1    Jul. 17, 2003

Related U.S. Application Data

(62) Division of application No. 09/267,928, filed on Mar. 10, 1999, now Pat. No. 6,555,764.

(30) Foreign Application Priority Data

Mar. 12, 1998  (JP)  .............................. 10-061594
May 20, 1998  (JP)  .............................. 10-139040

(51) Int. Cl.
*H01R 9/00* (2006.01)
*H05K 3/00* (2006.01)
*B23K 31/00* (2006.01)
*B23K 31/02* (2006.01)

(52) U.S. Cl. ..................... 29/842; 29/825; 29/850; 228/180.5

(58) Field of Classification Search ............... 29/842, 29/844, 845, 863–867, 825, 843, 850; 228/4.5, 228/180.5
See application file for complete search history.

(56) References Cited

U.S. PATENT DOCUMENTS 5,629,837 A     5/1997  Barabi et al. ............... 361/767

(Continued)

FOREIGN PATENT DOCUMENTS

JP         7-55839        3/1995

(Continued)

OTHER PUBLICATIONS

Korean Patent Office Action in corresponding Korean Patent application dated Dec. 13, 2000.

(Continued)

*Primary Examiner*—Eric W. Thomas
*Assistant Examiner*—Jeremy C. Norris
(74) *Attorney, Agent, or Firm*—Armstrong, Kratz, Quintos, Hanson & Brooks, LLP

(57) ABSTRACT

An integrated circuit contactor includes a base of an insulating material, the base being elastically deformable. A plurality of pads of a first conductive material are bonded to the base at positions corresponding to positions of terminals on an integrated circuit. A plurality of contacts of a second conductive material are bonded to the plurality of pads, respectively, the terminals of the integrated circuit being electrically connected to the contacts only when a pressure is exerted onto the contacts by the terminals of the integrated circuit, each contact having a projecting edge with a roughness produced by pulling a wire of the second conductive material apart from a corresponding one of the plurality of pads after the wire is bonded to the corresponding pad.

19 Claims, 33 Drawing Sheets

U.S. PATENT DOCUMENTS

| | | | |
|---|---|---|---|
| 5,831,441 A | 11/1998 | Motooka et al. | 324/754 |
| 5,838,160 A * | 11/1998 | Beaman et al. | 324/754 |
| 6,336,269 B1 * | 1/2002 | Eldridge et al. | 29/885 |

FOREIGN PATENT DOCUMENTS

| | | |
|---|---|---|
| JP | 7-72172 | 3/1995 |
| JP | 7-122560 | 5/1995 |
| JP | 7-287031 | 10/1995 |
| JP | 8-220140 | 8/1996 |
| JP | 8-306749 | 11/1996 |
| JP | 9-82718 | 3/1997 |
| JP | 9-113578 | 5/1997 |
| JP | 9-178777 | 7/1997 |
| JP | 9-260417 | 10/1997 |
| JP | 9-274066 | 10/1997 |

OTHER PUBLICATIONS

Japanese Patent Office Action for corresponding Japanese Patent Application No. 10-139040 dated Nov. 12, 2002.

* cited by examiner

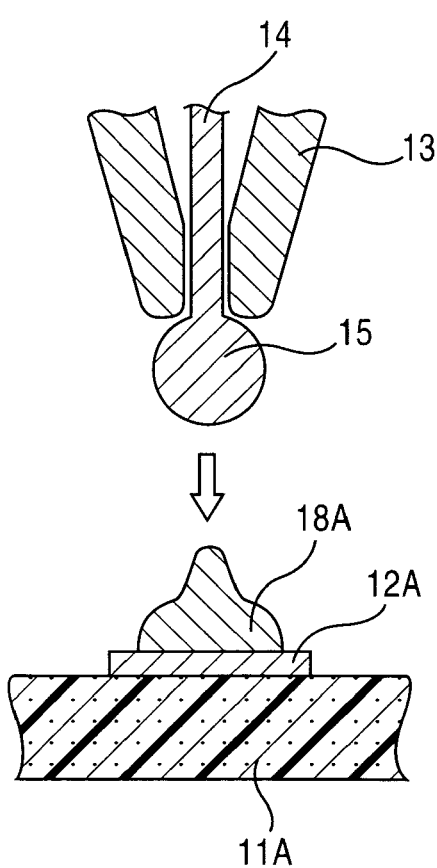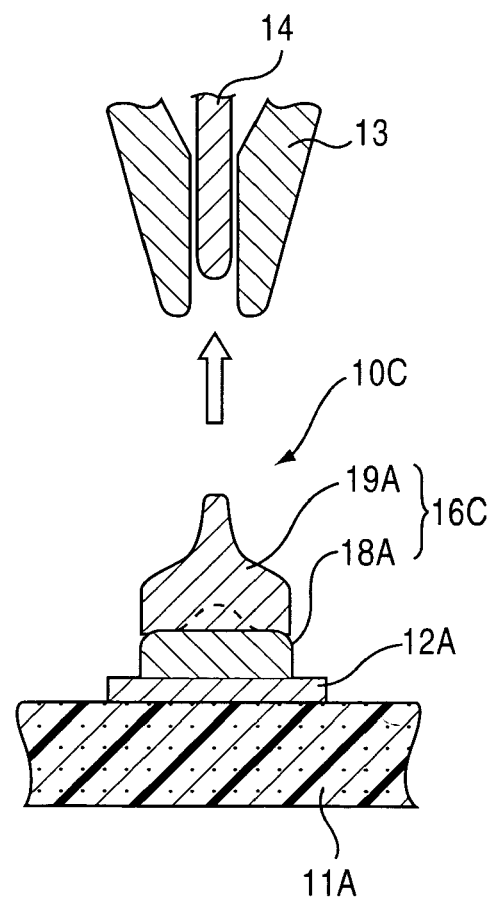

FIG. 21
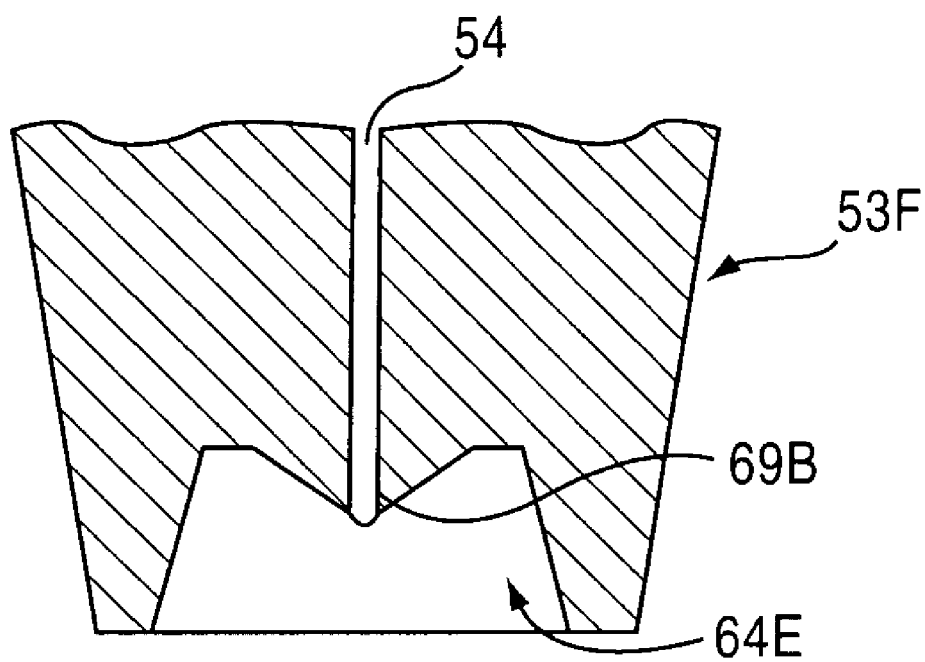
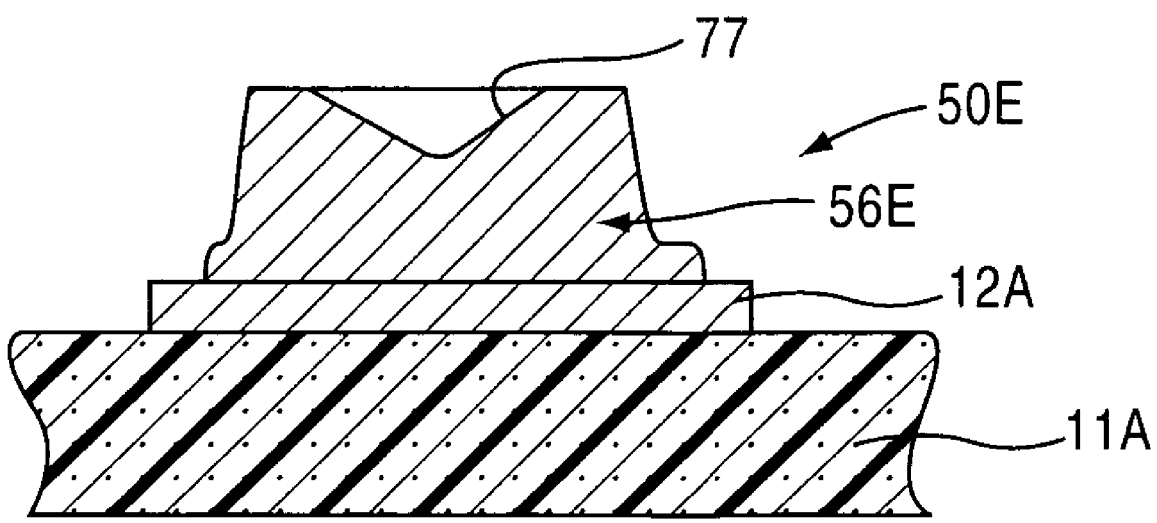

INTEGRATED CIRCUIT CONTACTOR, AND METHOD AND APPARATUS FOR PRODUCTION OF INTEGRATED CIRCUIT CONTACTOR

This application is a division of prior application Ser. No. 09/267,928 filed Mar. 10, 1999 now U.S. Pat. No. 6,555,764.

BACKGROUND OF THE INVENTION (1) Field of the Invention

The present invention relates to an integrated circuit contactor, and a method and apparatus for production of the integrated circuit contactor, the integrated circuit contactor used to electrically test an integrated circuit of a large-scale integration (LSI) device with terminals of the integrated circuit being connected to contacts of the integrated circuit contactor. Further, the present invention relates to a method of testing an integrated circuit having terminals by using an integrated circuit contactor.

Recently, there is an increasing demand for an LSI device having a high operating speed and a high integration level. In conformity with this demand, it is needed to achieve fine-pitch interconnects of terminals on the LSI device and contacts of a testing device. Hence, it is desired to provide an integrated circuit contactor which is used for electrical testing of an integrated circuit of the LSI device with fine-pitch interconnects of the integrated circuit terminals and contacts of the contactor. Further, it is desired to assure the reliability of electric connections between the integrated circuit terminals and the contactor. When testing the integrated circuit with the integrated circuit contactor, it is necessary that the integrated circuit contactor assures the reliability of electric connections between the terminals of the integrated circuit and the contacts of the contactor.

(2) Description of the Related Art

FIG. 40 shows a conventional integrated circuit contactor which has been developed to electrically test an integrated circuit of an LSI device with terminals of the integrated circuit being connected to contacts of the integrated circuit contactor. The conventional integrated circuit testing device of FIG. 40 is also called a membrane contactor. Hereinafter, the conventional integrated circuit testing device of FIG. 40 will be called the contactor 1.

The contactor 1 of FIG. 40 includes a base 2 of an insulating material (such as a polyimide resin), a plurality of pads 4 of a conductive material (such as copper Cu), and a plurality of contacts 3 of another conductive material (such as nickel Ni). For the sake of convenience of description, a single contact 3 and a single pad 4 are shown in FIG. 40.

In the contactor 1 of FIG. 40, the contacts 3 of the conductive material, such as nickel, are formed on the pads 4 as the metal projections on the base 2 by using a plating technique. When testing an integrated circuit with the contactor 1, terminals of the integrated circuit are connected to the contacts 3 of the contactor 1. To assure electric connections between the integrated circuit terminals and the contacts 3, the contacts 3 of the contactor 1 are covered by a plating of gold (Au). In the contactor 1, external terminals (not shown) are provided on the periphery of the base 2, and the pads 4 are connected to the external terminals by a wiring (not shown). As the contacts 3 are electrically connected through the pads 4 to the external terminals, electric signals on the integrated circuit terminals can be respectively detected from the external terminals of the contactor 1 when testing the integrated circuit with the contactor 1.

In a conventional LSI socket, a leaf spring or the like is provided therein to ensure electric connections between the integrated circuit terminals and the conventional LSI socket. It is difficult for the conventional LSI socket to achieve fine pitch interconnects of terminals of an LSI device and contacts of the conventional LSI socket. However, the contactor 1 having the contacts 3 is useful to achieve fine pitch interconnects of the terminals of the LSI device and the contacts 3 of the contactor 1.

In the contactor 1 of FIG. 40, the contacts 3 can be easily formed with accuracy of the positions thereof, and a large number of contacts can be simultaneously formed on the base 2 by using the plating technique.

However, the production of the membrane contactor 1 of FIG. 40 is considerably expensive. In a case of the contactor 1, the contacts 3 are formed on the pads 4 by using the plating technique. It takes several hours (for example, four hours in a certain case) to completely produce the contacts 3 by plating of the conductive material. The production period of the contactor 1 is relatively long, and the manufacturing cost is considerably high. Hence, the productivity of the membrane contactor 1 for volume production becomes low. In order to increase the productivity, it is necessary to increase the number of plating baths and/or the number of masking machines.

Further, it is difficult that the membrane contactor 1 of FIG. 40 is continuously supplied to the production line of LSI devices so as to keep up with the start of volume production of the LSI devices because the production period of the contactor 1 is long. In order to suit the requirements of recent LSI devices, such as a multi-chip module, various designs of integrated circuit contactors for testing bare chips or wafers are required. However, the membrane contactor 1 of FIG. 40 is difficult to meet the requirements of such LSI devices.

Further, it is difficult that the membrane contactor 1 of FIG. 40 provides adequate flexibility for the configuration of the contacts 3 on the base 2. In the case of the contactor 1, the contacts 3 are formed on the pads 4 by using the plating technique. The contacts 3 are often formed with a flat surface or a hemispherical surface by the plating. To ensure reliability of electric connections between terminals of an LSI device and contacts of an integrated circuit contactor, it is desirable that the contacts of the contactor are formed with a projecting edge having a roughness which can be stably held in contact with the terminals of the LSI device.

SUMMARY OF THE INVENTION

An object of the present invention is to provide an improved integrated circuit contactor in which the above-mentioned problems are eliminated.

Another object of the present invention is to provide an integrated circuit contactor which assures good reliability of electric connections between terminals of an integrated circuit and contacts of the integrated circuit contactor, and achieves an increased productivity of the contactor with low cost.

Still another object of the present invention is to provide an integrated circuit contactor production method which assures good reliability of electric connections between terminals of an integrated circuit and contacts of an integrated circuit contactor, and achieves an increased productivity of the contactor with low cost.

A further object of the present invention is to provide an integrated circuit contactor production apparatus which assures good reliability of electric connections between terminals of an integrated circuit and contacts of an integrated circuit contactor, and achieves an increased productivity of the contactor with low cost.

Another object of the present invention is to provide an integrated circuit testing method, using an integrated circuit contactor, which assures good reliability of electric connections between terminals of an integrated circuit and contacts of the contactor during testing.

The above-mentioned objects of the present invention are achieved by an integrated circuit contactor for testing an integrated circuit having terminals, including: a base of an insulating material, the base being elastically deformable; a plurality of pads of a first conductive material which are bonded to the base at positions corresponding to positions of the terminals on the integrated circuit; a plurality of contacts of a second conductive material which are bonded to the plurality of pads, respectively, the terminals of the integrated circuit being electrically connected to the contacts only when a pressure is exerted onto the contacts by the terminals of the integrated circuit, each contact having a projecting edge with a roughness produced by pulling a wire of the second conductive material apart from a corresponding one of the plurality of pads after the wire is bonded to the corresponding pad.

The above-mentioned objects of the present invention are achieved by an integrated circuit contactor for testing an integrated circuit having terminals, including: a base of an insulating material, the base being elastically deformable; a plurality of pads of a first conductive material which are bonded to the base at positions corresponding to positions of the terminals on the integrated circuit; a plurality of contacts of a second conductive material which are bonded to the plurality of pads, respectively, the terminals of the integrated circuit being electrically connected to the contacts only when a pressure is exerted onto the contacts by the terminals of the integrated circuit, each contact having a projecting edge with a roughness produced by forming a piece of the second conductive material with a bonding head after the piece is bonded to a corresponding one of the plurality of pads.

The above-mentioned objects of the present invention are achieved by a method of production of an integrated circuit contactor for testing an integrated circuit having terminals, the terminals of the integrated circuit being electrically connected to the contactor only when a pressure is exerted onto the contactor by the terminals of the integrated circuit, the method including the steps of: preparing a base of an insulating material on which a plurality of pads of a first conductive material are bonded at positions corresponding to positions of the terminals on the integrated circuit; and bonding a wire of a second conductive material to each of the plurality of pads, and pulling the wire apart from a corresponding one of the plurality of pads so as to form a plurality of contacts of the second conductive material bonded to the plurality of pads, respectively, each contact having a projecting edge with a roughness produced by the step of bonding and pulling of the wire.

The above-mentioned objects of the present invention are achieved by a method of production of an integrated circuit contactor for testing an integrated circuit having terminals, the terminals of the integrated circuit being electrically connected to the contactor only when a pressure is exerted onto the contactor by the terminals of the integrated circuit, the method including the steps of: preparing a base of an insulating material on which a plurality of pads of a first conductive material are bonded at positions corresponding to positions of the terminals on the integrated circuit; transporting a plurality of pieces of a second conductive material above the plurality of pads on the base by using a bonding head, the bonding head including a holding part for holding the pieces thereon and a bonding part for bonding the pieces to the plurality of pads, the pieces being held by the holding part of the bonding head during the transport of the pieces; bonding the plurality of pieces of the second conductive material to the plurality of pads by using the bonding part of the bonding head respectively; and forming the plurality of pieces bonded to the plurality of pads so as to produce a plurality of contacts of the second conductive material bonded to the plurality of pads, each contact having a projecting edge with a roughness produced by the step of forming of the pieces.

The above-mentioned objects of the present invention are achieved by an apparatus for production of an integrated circuit contactor for testing an integrated circuit having terminals, the contactor being produced from a base of an insulating material on which a plurality of pads of a first conductive material bonded at positions corresponding to positions of the terminals on the integrated circuit, the apparatus including: a conveyor which transports the base on which the plurality of pads are bonded; a bonding head which bonds a wire of a second conductive material to one of the plurality of pads, and pulls the wire apart from one of the plurality of pads so as to form a plurality of contacts of the second conductive material bonded to the plurality of pads, respectively; and a forming tool which forms one of the plurality of contacts of the second conductive material into a predetermined shape after one of the plurality of contacts is bonded to a corresponding one of the plurality of pads, wherein the bonding head and the forming tool are fixed to each other with no relative movement, and the bonding head and the forming tool are simultaneously operated for two of the plurality of pads while the base is transported by the conveyor.

The above-mentioned objects of the present invention are achieved by an apparatus for production of an integrated circuit contactor for testing an integrated circuit having terminals, the contactor being produced from a base of an insulating material on which a plurality of pads of a first conductive material bonded at positions corresponding to positions of the terminals on the integrated circuit, the apparatus including: a dispenser which dispenses a molten drop of a second conductive material to one of the plurality of pads on the base; and a forming tool which forms the drop of the second conductive material on one of the plurality of pads into one of a plurality of contacts of the second conductive material bonded to the plurality of pads, each contact having a projecting edge with a roughness produced by the forming of the drops.

The above-mentioned objects of the present invention are achieved by a method of testing an integrated circuit having terminals by using an integrated circuit contactor, the contactor including: a base of an insulating material, the base being elastically deformable; a plurality of pads of a first conductive material bonded to the base at positions corresponding to positions of the terminals on the integrated circuit; a plurality of contacts of a second conductive material bonded to the plurality of pads, respectively, the terminals being electrically connected to the contacts only when a pressure is exerted onto the contacts by the terminals, each contact having a projecting edge with a roughness produced by pulling a wire of the second conductive material apart from a corresponding one of the plurality of pads after the wire is bonded to the corresponding pad, the method including the steps of: positioning the integrated circuit to the contactor so that the positions of the terminals on the integrated circuit match the positions of the contacts on the contactor; applying a pressure to the integrated circuit so that the integrated circuit is face-down bonded to the contactor, the terminals being pressed onto the contacts of the contactor to establish electrical connections between the contacts and the terminals; and electrically testing the integrated circuit by using the contactor, the base acting to absorb the pressure exerted on the integrated circuit during the testing.

The above-mentioned objects of the present invention are achieved by a method of testing an integrated circuit having terminals by using an integrated circuit contactor, the contactor including: a base of an insulating material, the base being elastically deformable; a plurality of pads of a first conductive material bonded to the base at positions corresponding to positions of the terminals on the integrated circuit; a plurality of contacts of a second conductive material bonded to the plurality of pads, respectively, the terminals of the integrated circuit being electrically connected to the contacts only when a pressure is exerted onto the contacts by the terminals of the integrated circuit, each contact having a projecting edge with a roughness produced by forming a piece of the second conductive material with a bonding head after the piece is bonded to a corresponding one of the plurality of pads, the method including the steps of: positioning the integrated circuit to the contactor so that the positions of the terminals on the integrated circuit match the positions of the contacts on the contactor; applying a pressure to the integrated circuit so that the integrated circuit is face-down bonded to the contactor, the terminals being pressed onto the contacts of the contactor to establish electrical connections between the contacts and the terminals; and electrically testing the integrated circuit by using the contactor, the base acting to absorb the pressure exerted on the integrated circuit during the testing.

In the integrated circuit contactor of a preferred embodiment of the present invention, the contacts are produced as stud bumps from the wire of the second conductive material, and it is possible to achieve fine-pitch interconnects of the integrated circuit terminals with the contacts. Each of the contacts has a projecting edge with a roughness produced by pulling a wire of the second conductive material apart from a corresponding one of the plurality of pads after the wire is bonded to the corresponding pad. It is possible to assure good reliability of electric connections between the terminals and the contacts of the integrated circuit contactor, and achieve an increased productivity of the contactor with low cost.

In the production method of the integrated circuit contactor of the present invention, a wire of a second conductive material is bonded to each of a plurality of pads, and the wire is pulled apart from a corresponding one of the plurality of pads so as to form a plurality of contacts of the second conductive material bonded to the plurality of pads, respectively, each contact having a projecting edge with a roughness produced by the bonding and pulling of the wire. It is possible to assure good reliability of electric connections between the terminals and the contacts of the integrated circuit contactor, and achieve an increased productivity of the contactor with low cost.

In the production apparatus of the integrated circuit contactor of the present invention, the bonding head and the forming tool are fixed to each other with no relative movement, and the bonding head and the forming tool are simultaneously operated for two of the plurality of pads while the base is transported by the conveyor. It is possible to assure good reliability of electric connections between the terminals and the contacts of the integrated circuit contactor, and achieve an increased productivity of the contactor with low cost.

In the integrated circuit testing method of a preferred embodiment of the present invention, each of the contacts has a projecting edge with a roughness produced by pulling a wire of the second conductive material apart from a corresponding one of the plurality of pads after the wire is bonded to the corresponding pad. The base acts to absorb the pressure exerted on the integrated circuit during the testing. It is possible to assure good reliability of electric connections between the terminals of the integrater circuit and the contacts of the contactor during the testing.

BRIEF DESCRIPTION OF THE DRAWINGS

Other objects, features and advantages of the present invention will become more apparent from the following detailed description when read in conjunction with the accompanying drawings in which:

FIG. 3A and FIG. 3B are diagrams for explaining a third embodiment of the integrated circuit contactor of the present invention and a production method thereof;

FIG. 21 is a diagram for explaining a twenty-first embodiment of the integrated circuit contactor of the present invention and a production method thereof;

DESCRIPTION OF THE PREFERRED EMBODIMENTS

A description will now be given of the preferred embodiments of the present invention with reference to the accompanying drawings.

Figure 1A:
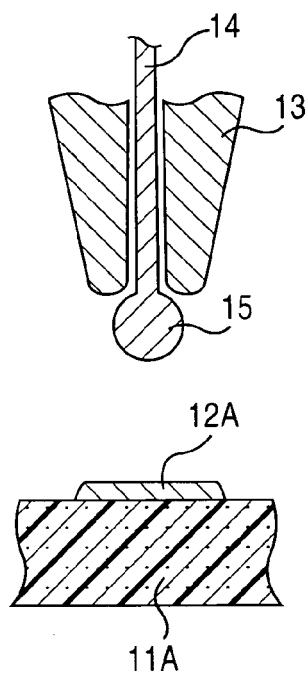
FIG. 1A, FIG. 1B and FIG. 1C are diagrams for explaining a first embodiment of an integrated circuit contactor of the present invention and a production method thereof.
Figure 1B:
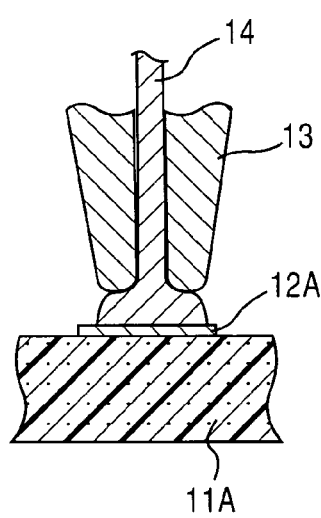
Figure 1C:
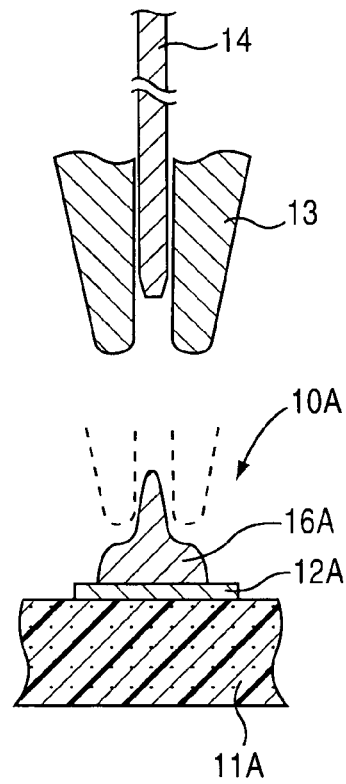

FIG. 1A, FIG. 1B and FIG. 1C show a first embodiment of an integrated circuit contactor of the present invention and a production method thereof. Suppose that the integrated circuit contactor of the present invention is adapted for testing an LSI device 40 having terminals 41 (see FIG. 5A).

FIG. 1C shows a configuration of the integrated circuit contactor 10A in the present embodiment. As shown in FIG. 1C, the contactor 10A includes a base 11A, a plurality of pads 12A bonded to the base 11A, and a plurality of contacts 16A bonded to the pads 12A respectively. In FIG. 1C, only a single pad 12A and a single contact 16A are shown for the sake of simplicity of description.

Figure 5A:
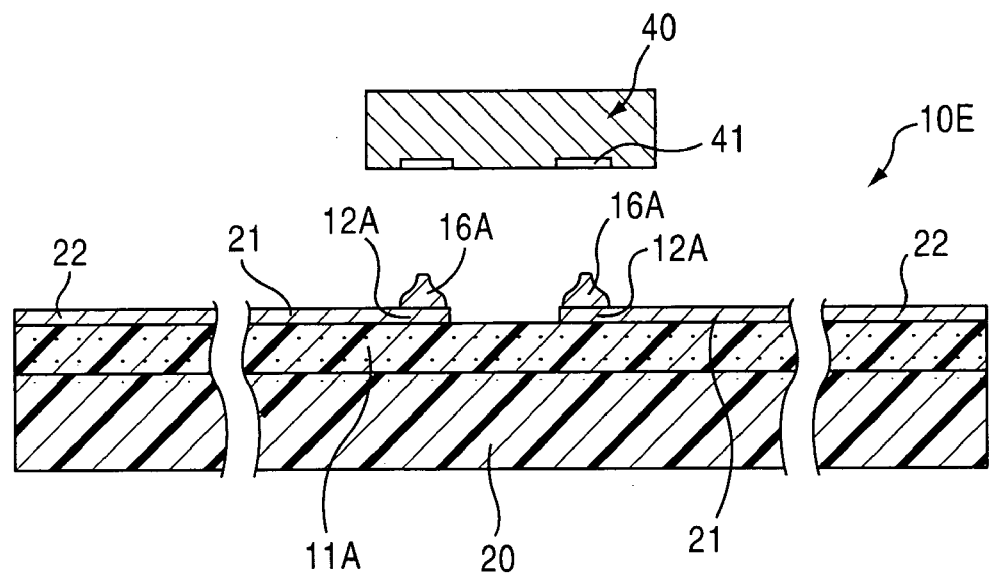
FIG. 5A and FIG. 5B are diagrams for explaining a fifth embodiment of the integrated circuit contactor of the present invention.

The base 11A is made of an elastic insulating material, such as a polyimide (PI) resin. The base 11A is elastically deformable. The pads 12A are bonded to the base 11a at positions corresponding to positions of terminals 41 on an LSI device 40 (FIG. 5A). The pads 12A are made of a conductive material, such as copper (Cu). In the contactor 10A, external terminals (not shown) are provided on the periphery of the base 11A, and the pads 12A are connected to the external terminals by a wiring (not shown).

The contacts 16A are produced as stud bumps on the pads 12A from a wire of a conductive material. The contactor 10A of the present embodiment having the contacts 16A is different from a conventional LSI socket having a leaf spring or the like in that the contactor 10A achieves very fine pitch interconnects of the integrated circuit terminals with the contacts 16A.

The contacts 16A are made of a conductive material, and the conductive material of the contacts 16A has a hardness larger than a hardness of the terminals of the LSI device. In the contactor 10A of the present embodiment, the conductive material of the contacts 16A is selected depending on the kind of the conductive material of the terminals of the LSI device as follows.

(a) When the terminals of the LSI device are made of aluminum (Al), the conductive material of the contacts 16A is a metal selected from among gold (Au), copper (Cu), palladium (Pd), nickel (Ni), etc. or an alloy containing, as a major constituent of the alloy, the metal selected from among these metallic elements. The hardness of these metallic elements is larger than the hardness of aluminum.

(b) When the terminals of the LSI device are made of a solder alloy, the conductive material of the contacts 16A is a metal selected from among metallic elements having a hardness larger than a hardness of the solder alloy, or an alloy containing, as a major constituent of the alloy, the metal selected from among the metallic elements. For example, the conductive material of the contacts 16A in this case is aluminum (Al), silver (Ag), or a solder alloy. The solder alloy as the conductive material of the contacts 16A is, for example, Pb—Ag, Pb—Bi, Pb—Sb, Pb—Sn—Bi, Pb—Sn—Sb, Pb—In, or Sn-3Ag.

As described above, in the contactor 10A of the present embodiment, the conductive material of the contacts 16A has a hardness larger than a hardness of the terminals of the LSI device. When the LSI device has a large number of pins (or the terminals) or when the pressure exerted on the contactor 10A by the terminals of the LSI device is high, it is possible to prevent damaging of the contacts 16A of the contactor 10A by the terminals of the LSI device. Generally, a number of LSI devices are repetitively connected to the contacts 16A of the integrated circuit contactor 10A. However, it is possible for the contactor 10A of the present embodiment to prevent damaging of the contacts 16A by the terminals of the LSI devices even when the pressure exerted on the contacts 16A of the contactor 10A by the terminals of the LSI devices is high. Hence, it is possible to assure good reliability of electric connections between the terminals and the contacts 16A of the contactor 10A.

In addition, in the contactor 10A of the present embodiment, the conductive material of the contacts 16A is not limited to the above-mentioned materials. In order to increase the durability of the contacts 16A, it is desirable that the conductive material of the contacts 16A is selected as follows: (A) a metal selected from among metallic elements (Fe, Co, Ni, Ru, Rh, Pd, Os, Ir, Pt) of group VIII in a periodic table; an alloy containing, as a major constituent of the alloy, a metal selected from among metallic elements of group VIII in the periodic table; (C) an alloy containing gold (Au) as a major constituent of the alloy; and (D) an alloy containing gold (Au) and silver (Ag) as major constituents of the alloy.

Further, as described above, in the contactor 10A of the present embodiment, it is necessary to produce the contacts 16A from a wire of a conductive material. Taking account of this point, it is desirable that the conductive material of the contacts 16A is a metal selected from among palladium (Pd), nickel (Ni), rhodium (Rh), platinum (Pt), gold (Au), and silver (Ag), or an alloy containing, as a major constituent of the alloy, a metal selected from among these metallic elements.

Figure 40:
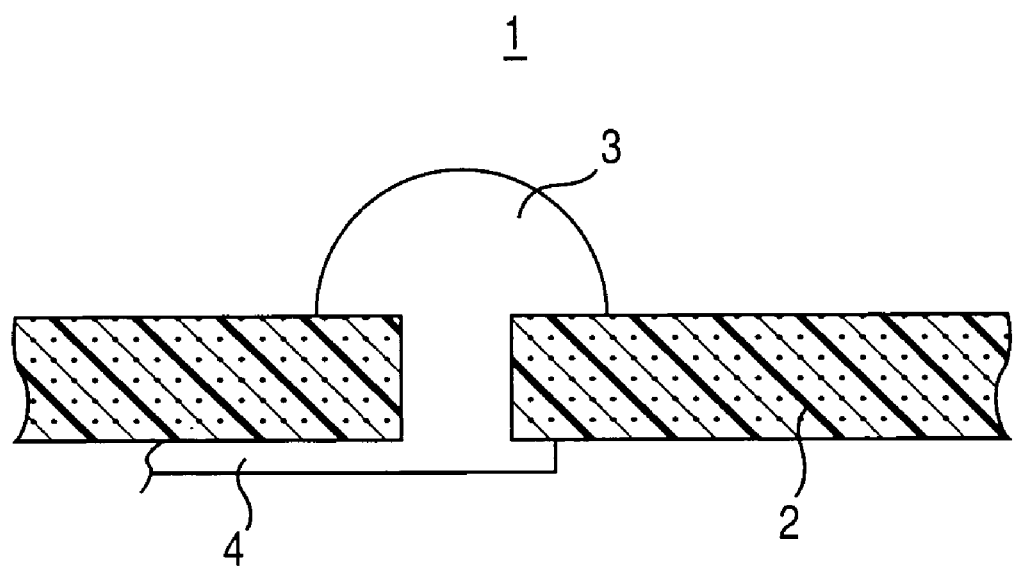
FIG. 40 is a diagram for explaining a conventional integrated circuit contactor.

The contacts 16A are not produced by plating as in the conventional membrane contactor 1 of FIG. 40 which requires a comparatively long time. Each of the contacts 16A is produced by bonding the wire to a corresponding one of the pads 12A and pulling the wire apart from the corresponding pad 12A. The contacts 16A can be speedily formed as stud bumps, and each contact has a projecting edge with a roughness produced by the bonding and pulling of the wire. The contacts 16A are supported on the base 11A through the pads 12A, and the base 11A is elastically deformable when a pressure is exerted on the contactor 10A by the terminals of the LSI device. Even when there are variations of the height of the contacts 16A, they may be absorbed by the elastic deformation of the base 11A. Hence, it is possible to assure good reliability of electric connections between the terminals of the LSI device and the contacts 16A.

Further, in the contactor 10A of the present embodiment, the terminals of the LSI device are electrically connected to the contacts 16A only when a pressure is exerted onto the contacts 16A by the terminals of the LSI device, and the terminals of the LSI device are separated from the contacts 16A when no pressure is exerted onto the contacts 16A.

When testing an integrated circuit of the LSI device using the contactor 10A of the present embodiment, the integrated circuit testing method is carried out as follows. First, the integrated circuit is positioned to the contactor 10A so that the positions of the terminals on the integrated circuit match the positions of the contacts 16A on the contactor 10A. Second, a pressure is applied to the integrated circuit so that the integrated circuit is face-down bonded to the contactor 10A, the terminals being pressed onto the contacts 16A of the contactor 10A to establish electrical connections between the contacts 16A and the terminals. Then, the integrated circuit is electrically tested by using the contactor 10A, the base 11A acting to absorb the pressure exerted on the integrated circuit during the testing. It is possible to assure good reliability of electric connections between the terminals of the LSI device and the contacts 16A during the testing.

Next, a production method of the contactor 10A of the present embodiment will be explained with reference to FIG. 1A through FIG. 1C.

As shown in FIG. 1A, a base 11A on which a plurality of pads 12A are bonded at positions corresponding to positions of the terminals on the LSI device is prepared. In FIG. 1A, only one pad 12A is shown for the sake of simplicity of description. A bonding head 13 in which a wire 14 of the conductive material is inserted is placed above a center of the pad 12A on the base 11A. A ball 15 is formed at the leading edge of the wire 14 by using a welding torch (not shown).

As shown in FIG. 1B, the bonding head 13 is lowered to the pad 12A, and a thermosonic bonding is performed with the bonding head 13 so that the ball 15 is bonded to the pad 12A. In the thermosonic bonding, the wire 14 is compressed while the bonding head 13 is ultrasonically vibrated.

As shown in FIG. 1C, the bonding head 13 is lifted, and the wire 14 is pulled apart from the pad 12A so as to form a contact 16A bonded to the pad 12A. The contact 16A has a projecting edge with a roughness produced by the bonding and pulling of the wire 14. The above procedure is repeated with respect to each of the plurality of pads 12A on the base 11A, and a plurality of contacts 16A bonded to the pads 12A are produced. Each of the contacts 16A has a projecting edge with a roughness produced by the bonding and pulling of the wire 14.

As described above, according to the production method of the integrated circuit contactor 10A in the present embodiment, the contactor 10A having the contacts 16A can be produced by utilizing existing wire bonding equipment. It is not necessary to use a newly prepared production equipment. Hence, it is possible to achieve an increased productivity of the integrated circuit contactor with low cost.

According to the production method of the integrated circuit contactor 10A in the present embodiment, the size and height of the contacts 16A being produced, the diameter of the wire 14 being used, and the bonding conditions (including the diameter of the ball 15, the bonding pressure being exerted on the pad 12A, the heating temperature, and the ultrasonic energy input) may be controlled so as to form a desired shape of the contacts 16A and suit the requirement of the LSI device.

According to the production method of the integrated circuit contactor 10A in the present embodiment, the contacts 16A can be speedily formed as stud bumps, and each contact has a projecting edge with a roughness produced by the bonding and pulling of the wire. This is effective in increasing the reliability of electric connections between the terminals of the LSI device and the contacts 16A of the contactor 10A. Although the diameter of the leading edges of the contacts 16A may be increased when the terminals of the LSI device are connected to the contactor 10A, the diameter of the leading edges of the contacts 16A that can be produced according to the production method of the present embodiment is on the order of 15–20 µm.

Figure 2:
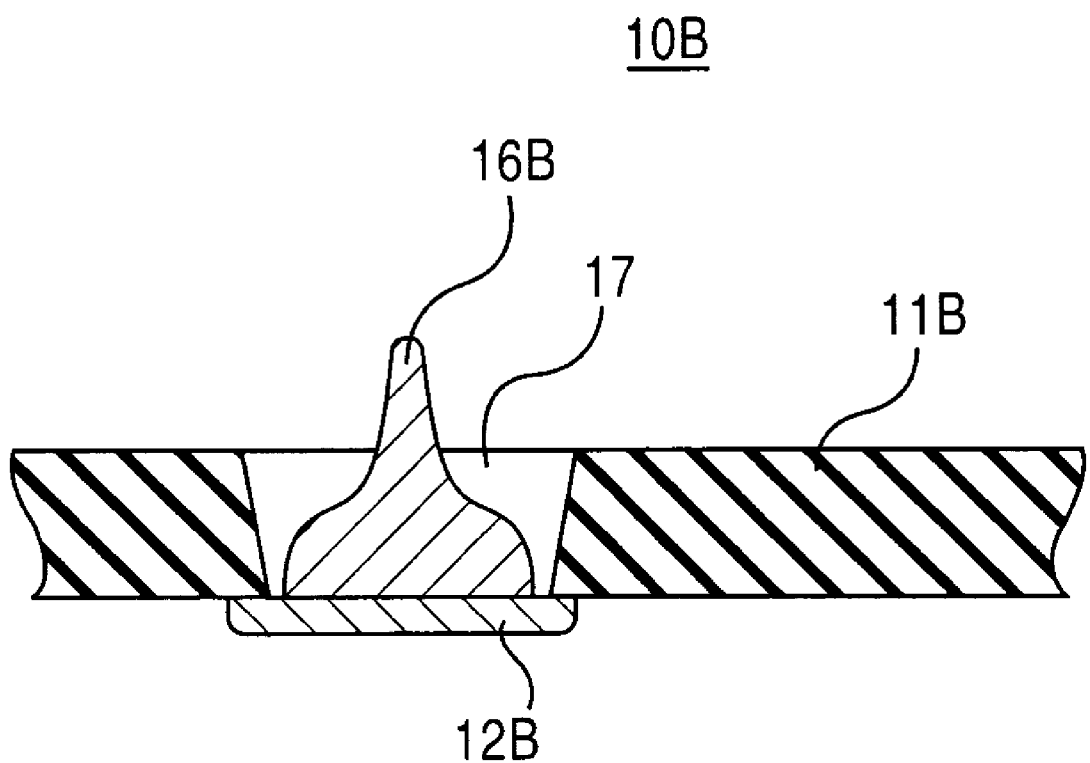
FIG. 2 is a diagram for explaining a second embodiment of the integrated circuit contactor of the present invention.

FIG. 2 shows a second embodiment of the integrated circuit contactor of the present invention.

As shown in FIG. 2, the integrated circuit contactor 10B of,the present embodiment includes a plurality of openings 17 in a base 11B at positions corresponding to positions of the terminals 41 on the LSI device 40 (see FIG. 5A). Similar to the embodiment of FIG. 1C, the contactor 10B includes the base 11B, a plurality of pads 12B bonded to the base 11B, and a plurality of contacts 16B bonded to the pads 12B respectively. The pads 12B are provided on a bottom surface of the base 11B such that the openings 17 are closed by the pads 12B. The contacts 16B are respectively provided within the openings 17. In FIG. 2, only a single opening 17, a single pad 12B and a single contact 16B are shown for the sake of simplicity of description.

Source materials and configuration of the base 11B, the pads 12B and the contacts 16B, and a production method of the contactor 10B of the present embodiment are essentially the same as those of the embodiment of FIGS. 1A through 1C. The openings 17 may be formed in the base 11B by a press forming, an etching or a laser cutting.

In the contactor 10B of the present embodiment, the contacts 16B are respectively provided within the openings 17. When a pressure is exerted onto the contactor 10B by the terminals of the LSI device, the LSI device is brought into contact with a top surface of the base 11B while the terminals of the LSI device are connected to the contacts 16B. It is possible to prevent the contacts 16B from being excessively compressed by the pressure of the terminals of the LSI device. It is possible for the contactor 10B of the present embodiment to prevent damaging of the contacts 16B by the terminals of the LSI device even when the pressure exerted on the contacts 16B of the contactor 10B by the terminals of the LSI devices is high.

FIG. 3A and FIG. 3B show a third embodiment of the integrated circuit contactor of the present invention and a production method thereof. In FIG. 3A and FIG. 3B, the elements which are essentially the same as corresponding elements in FIG. 1A through FIG. 1C are designated by the same reference numerals, and a description thereof will be omitted.

FIG. 3B shows a configuration of the integrated circuit contactor 10C in the present embodiment. As shown in FIG. 3B, the contactor 10C includes the base 11A, the plurality of pads 12A bonded to the base 11A, and a plurality of contacts 16C bonded to the pads 12A respectively. In the present embodiment, each of the contacts 16C is constituted by two pieces of the same conductive material which are laminated together. In FIG. 3B, only a single pad 12A and a single contact 16C are shown for the sake of simplicity of description. The contact 16C is constituted by a first bump 18A and a second bump 19A which are of the same conductive material and laminated together.

In the present embodiment, each of the contacts 16C is constituted by the two bumps 18A and 19A of the same conductive material. However, the contactor of the present invention is not limited to this embodiment, and each of the contacts 16C may be constituted by three or more bumps of the same conductive material.

As shown in FIG. 3A, an integrated circuit contactor in which a plurality of first bumps 18A are bonded to the pads 12A on the base 11A is prepared (which is essentially the same as the contactor 10A of FIG. 1C). The bonding head 13 in which the wire 14 of the conductive material is inserted is placed above a center of the first bump 18A on the pad 12A on the base 11A. A ball 15 is formed at the leading edge of the wire 14 by using a welding torch (not shown). The bonding head 13 is lowered to the first bump 18A as indicated by the arrow in FIG. 3A, and a thermosonic bonding is performed with the bonding head 13 so that the ball 15 is bonded to the firs)t bump 18A.

As shown in FIG. 3B, the bonding head 13 is lifted, and the wire 14 is pulled apart from the first bump 18A so as to form a contact 16C bonded to the pad 12A. The contact 16C is constituted by the first bump 18A and the second bump 19A which are of the same conductive material and laminated together, and has a projecting edge with a roughness produced by the bonding and pulling of the wire 14. The shape of the second bump 19A shown in FIG. 3B is essentially the same as the shape of the first bump 18A shown in FIG. 3A. The above procedure is repeated with respect to each of the plurality of pads 12A on the base 11A, and a plurality of contacts 16C bonded to the pads 12A are produced. Each of the contacts 16C has a projecting edge with a roughness produced by the bonding and pulling of the wire 14.

As described above, according to the production method of the integrated circuit contactor 10C in the present embodiment, the contactor 10C having the contacts 16C can be produced by utilizing existing wire bonding equipment. It is not necessary to use a newly prepared production equipment. Hence, it is possible to achieve an increased productivity of the integrated circuit contactor with low cost.

According to the production method of the integrated circuit contactor 10C in the present embodiment, the size and height of the contacts 16C being produced, the diameter of the wire 14 being used, and the bonding conditions (including the diameter of the ball 15, the bonding pressure being exerted on the pad 12A, the heating temperature, and the ultrasonic energy input) may be controlled so as to form a desired shape of the contacts 16C and suit the requirement of the LSI device.

According to the production of the integrated circuit contactor 10C in the present embodiment, the height of the contacts 16C can be varied by changing the number of the pieces laminated together. Even when there are variations of the height of the contacts 16C, they may be absorbed by the elastic deformation of the base 11A. Hence, it is possible to assure good reliability of electric connections between the terminals of the LSI device and the contacts 16C.

Figure 4:
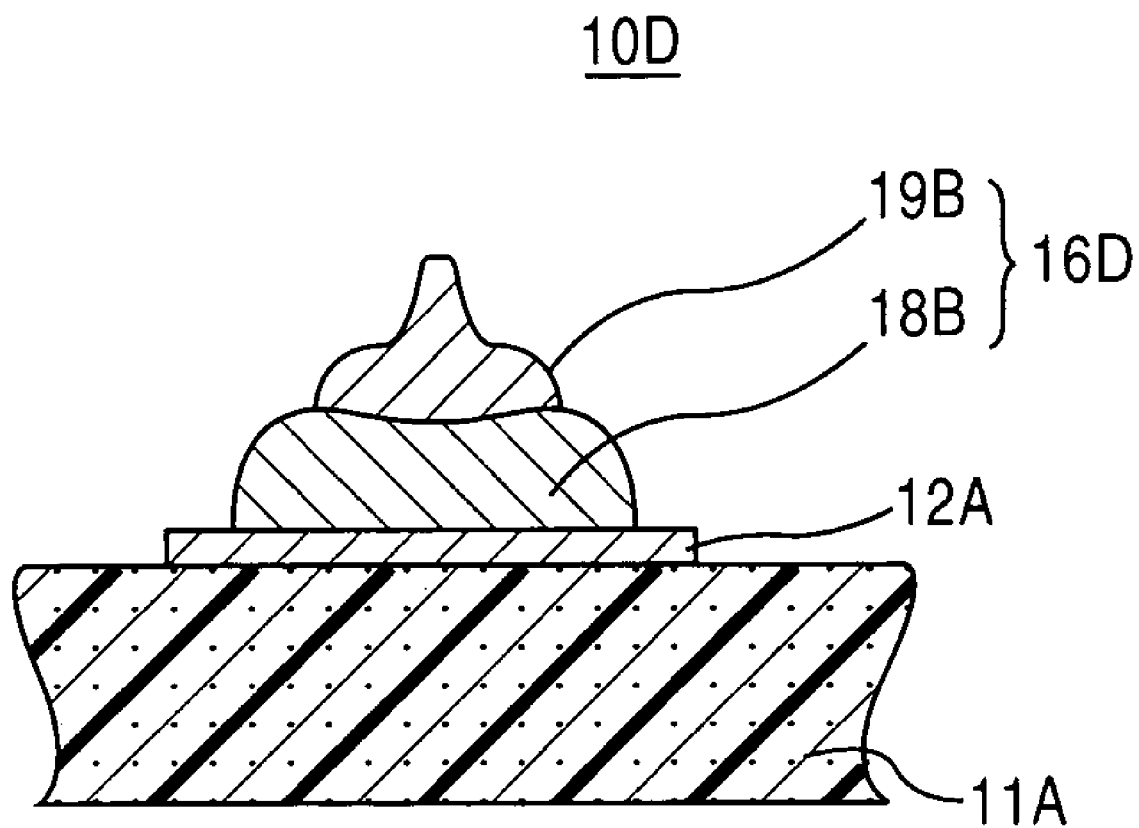
FIG. 4 is a diagram for explaining a fourth embodiment of the integrated circuit contactor of the present invention.

FIG. 4 shows a fourth embodiment of the integrated circuit contactor of the present invention.

As shown in FIG. 4, the integrated circuit contactor 10D of the present embodiment includes the base 11A, the plurality of pads 12A bonded to the base 11A, and a plurality of contacts 16D bonded to the pads 12A respectively. In the present embodiment, each of the contacts 16D is constituted by two pieces of different conductive materials which are laminated together. In FIG. 4, only a single pad 12A and a single contact 16D are shown for the sake of simplicity of description. The contact 16D is constituted by a first bump 18B and a second bump 19B which are of different conductive materials (for example, gold (Au) and palladium (Pd)) and laminated together. The shape of the second bump 19B may be different from the shape of the first bump 18B. In order to prevent damaging of the contacts 16D of the contactor 10D by the terminals of the LSI device, it is desirable that a hardness of the conductive material of the first bump 18B, which is at a lower position, is smaller than a hardness of the conductive material of the second bump 19B, which is at an upper position.

As described above, according to the production method of the integrated circuit contactor 10D in the present embodiment, the contactor 10D having the contacts 16D can be produced by utilizing existing wire bonding equipment. It is not necessary to use a newly prepared production equipment. Hence, it is possible to achieve an increased productivity of the integrated circuit contactor with low cost.

According to the production method of the integrated circuit contactor 10D in the present embodiment, the size and height of the contacts 16D being produced, the diameter of the wire 14 being used, and the bonding conditions (including the diameter of the ball 15, the bonding pressure being exerted on the pad 12A, the heating temperature, and the ultrasonic energy input) may be controlled so as to form a desired shape of the contacts 16D and suit the requirement of the LSI device.

According to the production of the integrated circuit contactor 10D in the present embodiment, the height of the contacts 16D can be varied by changing the number of the pieces laminated together. Even when there are variations of the height of the contacts 16D, they may be absorbed by the elastic deformation of the base 11A. Hence, it is possible to assure good reliability of electric connections between the terminals of the LSI device and the contacts 16D.

In the present embodiment, each of the contacts 16D is constituted by the two bumps 18B and 19B of different conductive materials. However, the contactor of the present invention is not limited to this embodiment, and each of the contacts 16D may be constituted by three or more bumps of different conductive materials.

Figure 5B:
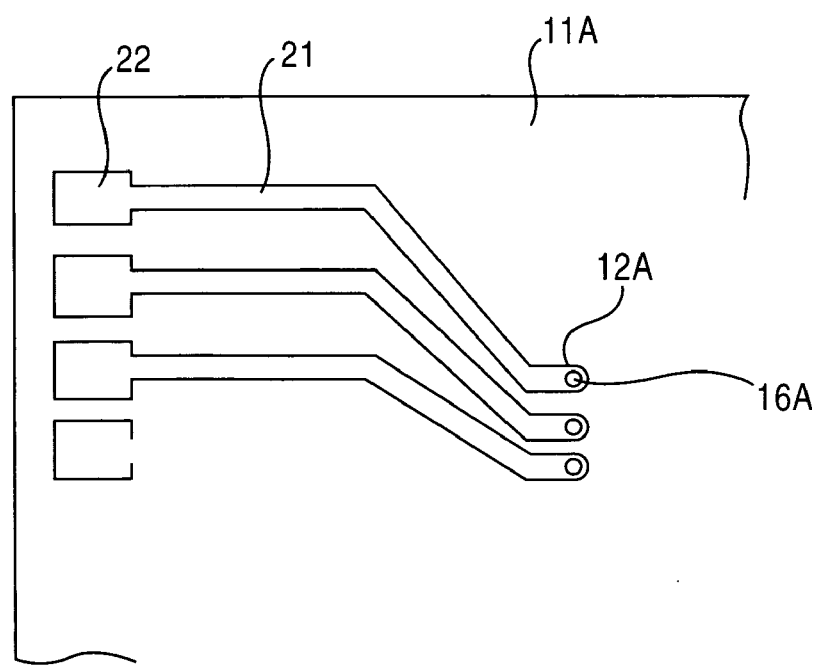

FIG. 5A and FIG. 5B show a fifth embodiment of the integrated circuit contactor of the present invention. FIG. 5A is a side view of the integrated circuit contactor 10E of the present embodiment, and FIG. 5B is a top view of the integrated circuit contactor 10E. In FIG. 5A and FIG. 5B, the elements which are essentially the same as corresponding elements in FIG. 1C are designated by the same reference numerals, and a description thereof will be omitted.

Similar to the embodiment of FIG. 1C, the contactor 10E of the present embodiment includes the base 11A, the plurality of pads 12A bonded to the base 11A, and the plurality of contacts 16A bonded to the pads 12A respectively. The base 11A is made of an elastic insulating material, such as a polyimide (PI) resin. The base 11A is elastically deformable.

In the contactor 10E, an elastic sheet 20 is further, provided, and the base 11A is attached onto the elastic sheet 20. When the pressure exerted on the contactor 10E by terminals 41 of an LSI device 40 is high, the elastic sheet 20 acts to absorb the pressure, and it is possible to prevent damaging of the contacts 16A of the contactor 10E by the terminals of the LSI device.

The pads 12A are bonded to the base 11a at positions corresponding to positions of the terminals 41 on the LSI device 40. The pads 12A are made of a conductive material, such as copper (Cu). As the polyimide resin and copper are commonly used as the source materials of the base 11A and the pads 12A, the contactor 10E of the present embodiment can achieve an increased productivity of the contactor with low cost.

As shown in FIG. 5B, in the contactor 10E of the present embodiment, external terminals 22 are provided on the periphery of the base 11A, and the pads 12A are connected to the external terminals 22 by a pattern of wiring 21. The external terminals 22 are used to detect respective signals on the contacts 16A. The pads 12A, the wiring pattern 21, and the external terminals 22 are formed from a copper layer through etching to remove undesired portions.

Figure 6A:
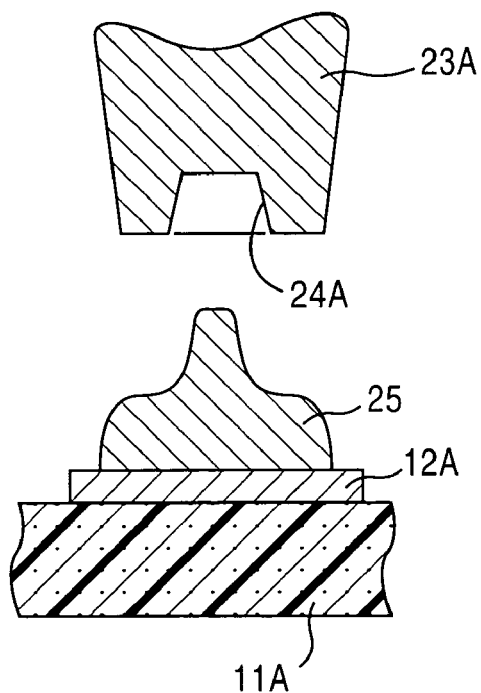
FIG. 6A and FIG. 6B are diagrams for explaining a production method of the integrated circuit contactor of the present invention.
Figure 6B:
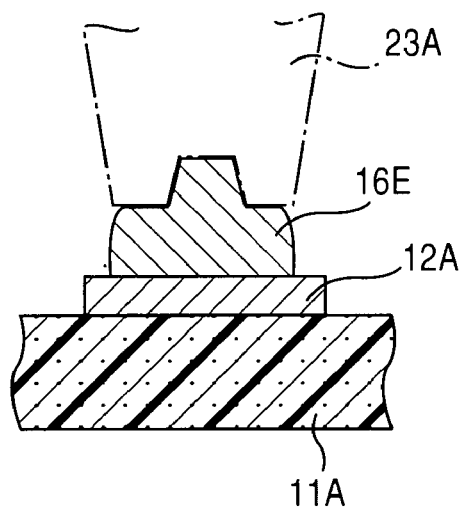

FIG. 6A and FIG. 6B show a production method of the integrated circuit contactor of the present invention.

As shown in FIG. 6A, an integrated circuit contactor in which a plurality of bumps 25 are bonded to the pads 12A on the base 11A (this contactor is essentially the same as the contactor 10A of FIG. 1C) is prepared by using the bonding head 13. In FIG. 6A, only a single pad 12A and a single bump 25 are shown for the sake of simplicity of description. After the bumps 25 bonded to the pads 12A are formed, a forming tool 23A which includes a cavity 24A is placed above a center of a corresponding one of the bumps 25. When the forming tool 23A is lowered, the cavity 24A of the forming tool 23A acts to form the bump 25 into a predetermined shape.

As shown in FIG. 6B, the forming tool 23A is lowered to the bump 25 so as to form a contact 16E bonded to the pad 12A. The bump 25 is formed into the shape of the contact 16E by the cavity 24A of the forming tool 23A. The above procedure is repeated with respect to each of the plurality of pads 12A on the base 11A, and a plurality of contacts 16E bonded to the pads 12A are produced. In order to achieve the forming of the bump 25 into the predetermined shape, a source material of the forming tool 23A has a hardness larger than the hardness of the conductive material of the contacts 16E.

The forming tool 23A in the present embodiment is provided with a heater (not shown) and an ultrasonic vibration source (not shown). The heater supplies a thermal energy to soften the bump 25 when forming the bump 25 into the contact 16E. The ultrasonic vibration source acts to ultrasonically vibrate the bump 25 via the forming tool 23A when forming the bump 25 into the contact 16E.

The forming tool 23A in the present embodiment has, as shown in FIG. 6A, the cavity 24A, and the cavity 24A is used to form one of the bumps 25 into the predetermined shape, the cavity 24A not touching neighboring ones of the bumps 25 when forming the corresponding bump 25 into the contact 16E. The plurality of contacts 16E are sequentially produced one by one by using the forming tool 23A.

As described above, according to the production method of the integrated circuit contactor in the present embodiment, the contactor having the contacts 16E can be produced by utilizing existing wire bonding equipment. It is not necessary to use a newly prepared production equipment. Hence, it is possible to achieve an increased productivity of the integrated circuit contactor with low cost.

According to the production method of the integrated circuit contactor in the present embodiment, the size and height of the contacts 16E being produced, the diameter of the wire 14 being used, and the bonding conditions (including the diameter of the ball 15, the bonding pressure being exerted on the pad 12A, the heating temperature, and the ultrasonic energy input) may be controlled so as to form a desired shape of the contacts 16E and suit the requirement of the LSI device. It is possible for the production method of the present embodiment to produce the contacts 16E with high accuracy by using the forming tool 23A. Hence, it is possible to assure good reliability of electric connections between the terminals of the LSI device and the contacts 16E.

Figure 7:
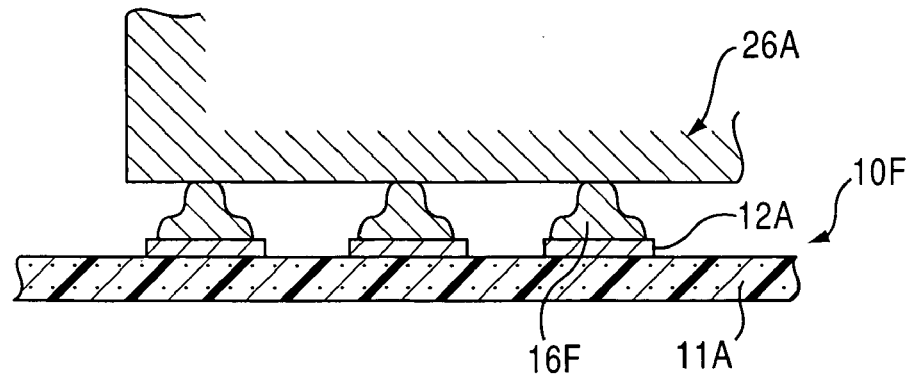
FIG. 7 is a diagram for explaining a sixth embodiment of the integrated circuit contactor of the present invention, and a production method thereof.

FIG. 7 shows a sixth embodiment of the integrated circuit contactor of the present invention, and a production method thereof.

As shown in FIG. 7, the contactor 10F of the present embodiment includes the base 11A, the plurality of pads 12A bonded to the base 11A, and a plurality of contacts 16F bonded to the pads 12A respectively. The plurality of contacts 16F have respective top surfaces which are leveled with each other.

In order to make the heights of the contacts 16F on the base 11A equal to each other, the production method of the integrated circuit contactor 10F of the present embodiment uses a leveling tool 26A when forming the bumps into the contacts 16F. The leveling tool 26A has a flat bottom surface which is placed in contact with the bumps on the pads 12A.

According to the production method of the contactor 10F of the present embodiment, the plurality of contacts 16F are formed by one operation of the leveling tool 26A so that the plurality of contacts 16F have the respective top surfaces leveled with each other. Hence, the production method of the present embodiment is more effective in achieving an increased productivity of the integrated circuit contactor with low cost.

Although the diameter of the leading edges of the contacts 16F may be increased when forming the bumps into the contacts 16F by using the leveling tool 26A, the heights of the contacts 16F on the base 11A that can be produced according to the production method of the present embodiment can be accurately leveled with each other. In addition, the production method of the present embodiment can more speedily produce the contactor 10F than the production method of the embodiment of FIG. 6A and FIG. 6B.

In the production method of the present embodiment, the leveling pressure of the leveling tool 26A exerted on the bumps against the base 11A is controlled depending on the number of the bumps included in the contactor 10F. It is desirable that the leveling pressure of the leveling tool 26A applied during the production is higher than the contact pressure actually exerted on the contactor 10F by the terminals 41 of the LSI device 40 during the testing. Specifically, when the contact pressure is 10 g/pin, the level pressure of the leveling tool 26A is, desirably set at 15 g multiplied by the number of the contacts 16F in the contactor 10F.

The leveling tool 26A in the present embodiment is provided with a heater (not shown) and an ultrasonic vibration source (not shown). The heater supplies a thermal energy to soften the bumps when forming the bumps into the contacts 16F. The ultrasonic vibration source acts to ultrasonically vibrate the bumps via the leveling tool 26A when forming the bumps into the contacts 16F.

Figure 8A:
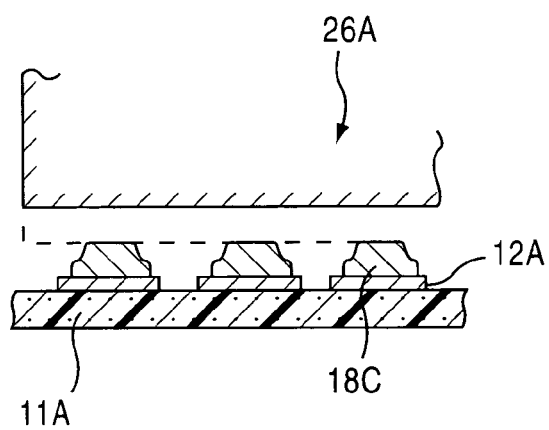
FIG. 8A and FIG. 8B are diagrams for explaining a production method of the integrated circuit contactor of the present invention.
Figure 8B:
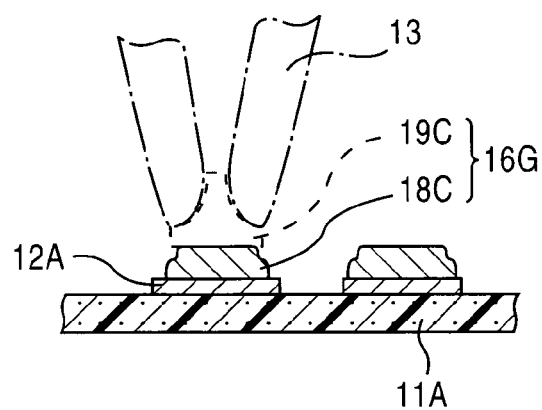

FIG. 8A and FIG. 8B show a production method of the integrated circuit contactor of the present invention.

As shown in FIG. 8A, an integrated circuit contactor in which a plurality of first bumps 18C are bonded to the pads 12A on the base 11A (which is essentially the same as the contactor 10F of FIG. 7) is prepared by using the bonding head 13 and the leveling tool 26A. By using the leveling tool. 26A, the first bumps 18C on the base 11A have respective top surfaces which are leveled with each other. After the first bumps 18C are formed, the leveling tool 26A is lifted and dislocated.

As shown in FIG. 8B, the bonding head 13 in which the wire 14 of the conductive material is inserted is placed above a center of one of the first bumps 18C on the base 11A. The bonding head 13 is lowered to the first bump 18C, and the thermosonic bonding is performed with the bonding head 13 so that the ball at the leading edge of the bonding head 13 is bonded to the first bump 18C. In the thermosonic bonding, the wire 14 is compressed while the bonding head 13 is ultrasonically vibrated.

After a second bump 19C bonded to the first bump 18C is formed through the thermosonic bonding, the bonding head 13 is lifted, and the wire 14 is pulled apart from the second bump 19C so as to form a contact 16G bonded to the pad 12A. The contact 16G has a projecting edge with a roughness produced by the bonding and pulling of the wire 14. The above procedure is repeated with respect to each of the plurality of pads 12A on the base 11A, and a plurality of contacts 16G bonded to the pads 12A are produced. Each of the contacts 16G has a projecting edge with a roughness produced by the bonding and pulling of the wire 14.

As described above, according to the production method of the integrated circuit contactor in the present embodiment, the contactor having the contacts 16G can be produced by utilizing existing wire bonding equipment. It is not necessary to use a newly prepared production equipment. Hence, it is possible to achieve an increased productivity of the integrated circuit contactor with low cost.

According to the production method of the integrated circuit contactor in the present embodiment, the first bumps 18C on the base 11A have the respective top surfaces leveled with each other by using the leveling tool 26A, and the second bumps 19C are bonded to the first bumps by using the bonding head 13, so as to form the plurality of contacts 16G bonded to the pads 12A on the base 11A. Each of the plurality of contacts 16G is constituted by the two pieces 18C and 19C of the same conductive material which are laminated together. As the bonding strength of the second bumps 19C to the first bumps 18C can be increased by the production method of the present embodiment, this makes it possible to increase the mechanical strength of the contacts 16G in the integrated circuit contactor. Hence, it is possible to assure good reliability of electric connections between the terminals 41 of the LSI device 40 and the contacts 16G.

In the present embodiment, each of the contacts 16G is constituted by the two bumps 18C and 19C of the same conductive material. However, the contactor of the present invention is not limited to this embodiment, and each of the contacts 16G may be constituted by three or more pieces of the same conductive material.

Figure 9A:
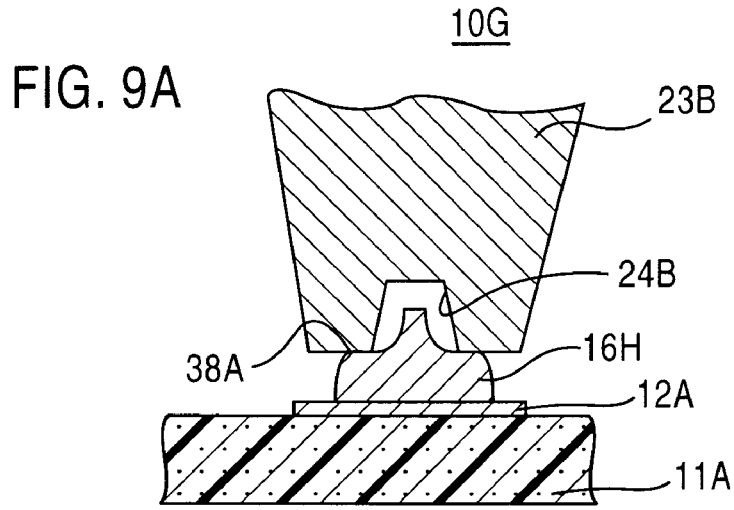
FIG. 9A, FIG. 9B and FIG. 9C are diagrams for explaining seventh, eighth and ninth embodiments of the integrated circuit contactor of the present invention, and production methods thereof.
Figure 9B:
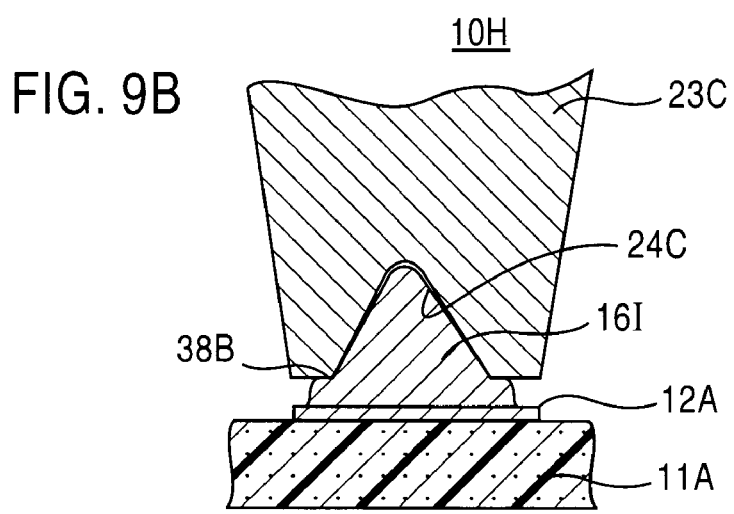
Figure 9C:
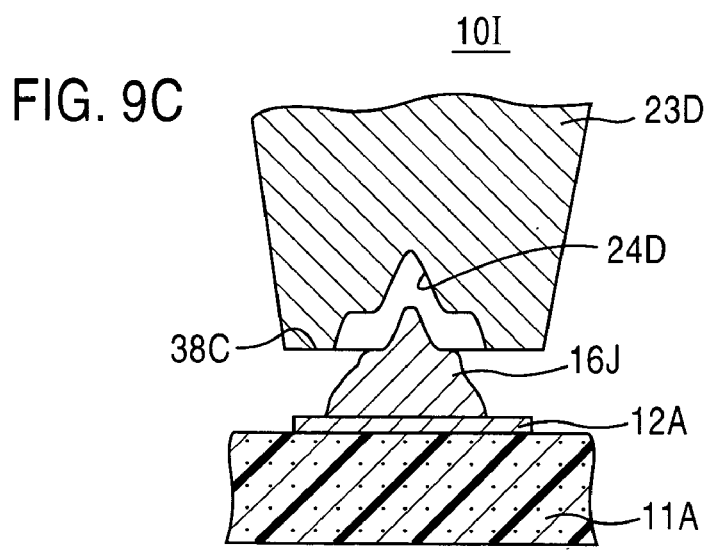

FIG. 9A, FIG. 9B and FIG. 9C show seventh, eighth and ninth embodiments of the integrated circuit contactor of the present invention, and production methods thereof.

In these embodiments of FIG. 9A through FIG. 9C, a forming tool (which is similar to the forming tool 23A of FIG. 6A) includes a recessed cavity and a pressing peripheral portion. The recessed cavity is placed into contact with one of the plurality of contacts on the base of the contactor when forming the corresponding contact into a predetermined shape. The pressing peripheral portion is provided around the recessed cavity in the forming tool. The pressing peripheral portion is used to compress a periphery of the corresponding contact around the center of the contact against the base of the contactor when forming the corresponding contact into the predetermined shape.

The forming tool in these embodiments is provided with a heater (not shown) and an ultrasonic vibration source (not shown). The heater supplies a thermal energy to soften the bump when forming the bump into the contact. The ultrasonic vibration source acts to ultrasonically vibrate the bump via the forming tool when forming the bump into the contact. The use of the forming tool in these embodiments allow the forming of each of the plurality of contacts on the contactor into the predetermined shape with good accuracy. Variations of the shape of the plurality of contacts on the contactor can be eliminated by the use of the forming tool.

In the embodiment of FIG. 9A, the forming tool 23B has a recessed cavity 24B and a pressing peripheral portion 38A. The recessed cavity 24B is formed in the shape of a truncated cone. The recessed cavity 24B is used to form a corresponding bump (similar to the bump 25 of FIG. 6A) on the base 11A into a contact 16H. In the resulting contactor 10G, the contact 16H has a projecting edge with a roughness produced by the bonding and pulling of the wire. The pressing peripheral portion 38A is used to compress a periphery of the corresponding bump around the center of the bump against the base 11A when forming the corresponding bump into the predetermined shape. The cavity 24B does not touch neighboring ones of the bumps on the base 11A when forming the corresponding bump into the contact 16H. The plurality of contacts 16H are sequentially produced one by one by using the forming tool 23B. The contactor 10G of the present embodiment is effective in providing good reliability of electric connections between the terminals 41 of the LSI device 40 and the contacts 16H of the contactor 10G.

In the embodiment of FIG. 9B, the forming tool 23C has a recessed cavity 24C and a pressing peripheral portion 38B. The recessed cavity 24C is formed in the shape of a cone. The recessed cavity 24C acts to form the corresponding bump on the base 11A into a contact 16I. In the resulting contactor 10H, the contact 16I has a projecting edge with a roughness produced by the bonding and pulling of the wire. The pressing peripheral portion 38B is used to compress a periphery of the corresponding bump around the center of the bump against the base 11A when forming the corresponding bump into the predetermined shape. The cavity 24C does not touch neighboring ones of the bumps on the base 11A when forming the corresponding bump into the contact 16I. The plurality of contacts 16I are sequentially produced one by one by using the forming tool 23C. The contactor 10H of the present embodiment is effective in providing good reliability of electric connections between the terminals 41 of the LSI device 40 and the contacts 16I of the contactor 10H.

In the embodiment of FIG. 9C, the forming tool 23D has a recessed cavity 24D and a pressing peripheral portion 38C. The recessed cavity 24D is formed in the shape of a stepped cone. The recessed cavity 24D acts to form the corresponding bump on the base 11A into a contact 16J. In the resulting contactor 10I, the contact 16J has a projecting edge with a roughness produced by the bonding and pulling of the wire. The pressing peripheral portion 38C acts to compress a periphery of the corresponding bump around the center thereof against the base 11A when forming the corresponding bump into the predetermined shape. The cavity 24D does not touch neighboring ones of the bumps on the base 11A when forming the corresponding bump into the contact 16J. The plurality of contacts 16J are sequentially produced one by one by using the forming tool 23C. The contactor 10I of the present embodiment is effective in providing good reliability of electric connections between the terminals 41 of the LSI device 40 and the contacts 16J of the contactor 10I.

Figure 10:
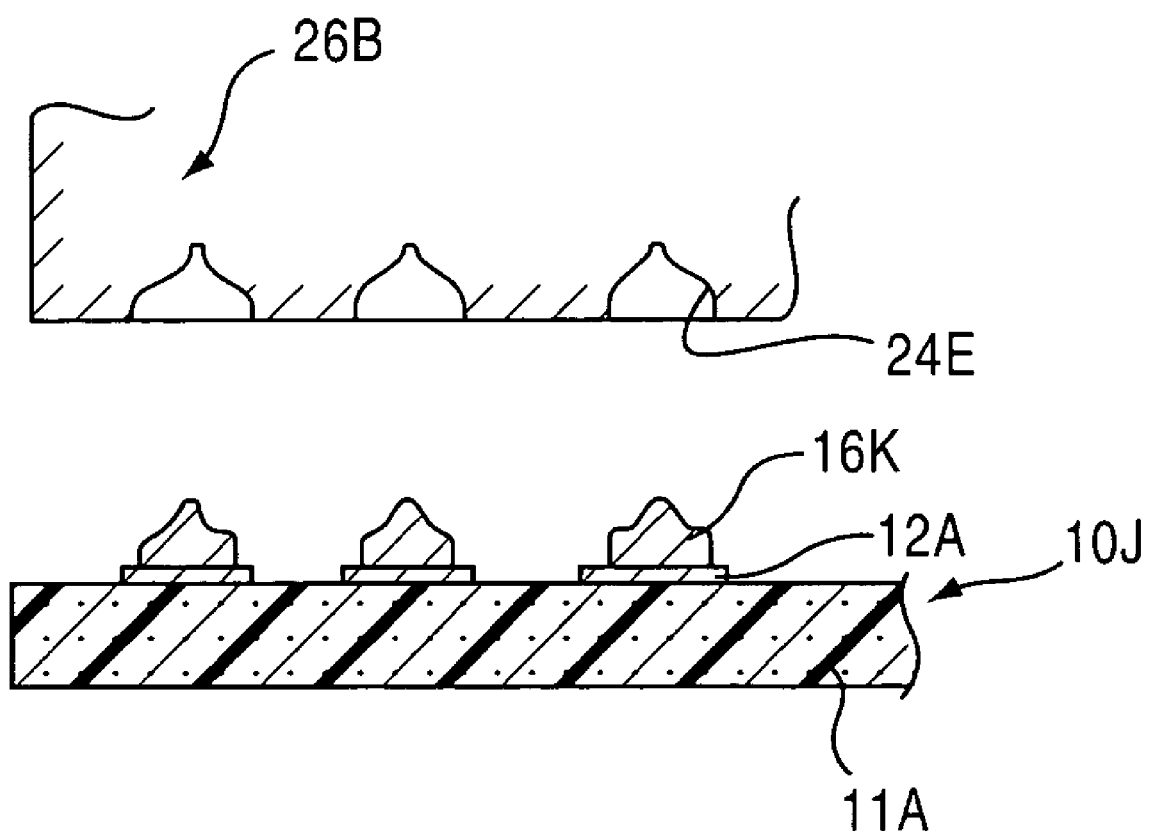
FIG. 10 is a diagram for explaining a tenth embodiment of the integrated circuit contactor of the present invention and a production method thereof.

FIG. 10 shows a tenth embodiment of the integrated circuit contactor of the present invention and a production method thereof.

As shown in FIG. 10, the contactor 10J of the present embodiment includes the base 11A, the plurality of pads 12A bonded to the base 11A, and a plurality of contacts 16K bonded to the pads 12A respectively. The plurality of contacts 16K have respective top surfaces which are leveled with each other, and have the same configuration with good accuracy.

In order to make the heights of the contacts 16K on the base 11A equal to each other, the production method of the contactor 10J of the present embodiment uses a leveling tool 26B when forming the bumps (which are similar to the bump 25 of FIG. 6A) into the contacts 16K. The leveling tool 26B has a plurality of equal cavities 24E on its bottom surface which is placed in contact with the bumps on the pads 12A.

According to the production method of the contactor 10J of the present embodiment, the plurality of contacts 16K are formed by one operation of the leveling tool 26B so that the plurality of contacts 16K have the respective top surfaces leveled with each other and the same configuration with good accuracy. Hence, the production method of the present embodiment is more effective in achieving an increased productivity of the integrated circuit contactor with low cost.

Although the diameter of the leading edges of the contacts 16K may be increased when forming the bumps into the contacts 16K by using the leveling tool 26B, the heights of the contacts 16K on the base 11A that can be produced according to the production method of the present embodiment can be accurately leveled with each other. In addition, the production method of the present embodiment can more speedily produce the contactor 10J than the production method of the embodiment of FIG. 6A and FIG. 6B.

In the production method of the present embodiment, the leveling pressure of the leveling tool 26B exerted on the bumps against the base 11A is controlled depending on the number of the bumps included in the contactor 10J. It is desirable that the leveling pressure of the leveling tool 26B applied during the production is higher than the contact pressure actually exerted on the contactor 10J by the terminals 41 of the LSI device 40 during the testing. Specifically, when the contact pressure is 10 g/pin, the level pressure of the leveling tool 26B is, desirably set at 15 g multiplied by the number of the contacts 16K in the contactor 10J.

The leveling tool 26B in the present embodiment is provided with a heater (not shown) and an ultrasonic vibration source (not shown). The heater supplies a thermal energy to soften the bumps when forming the bumps into the contacts 16K. The ultrasonic vibration source acts to ultrasonically vibrate the bumps via the leveling tool 26B when forming the bumps into the contacts 16K.

Figure 11A:
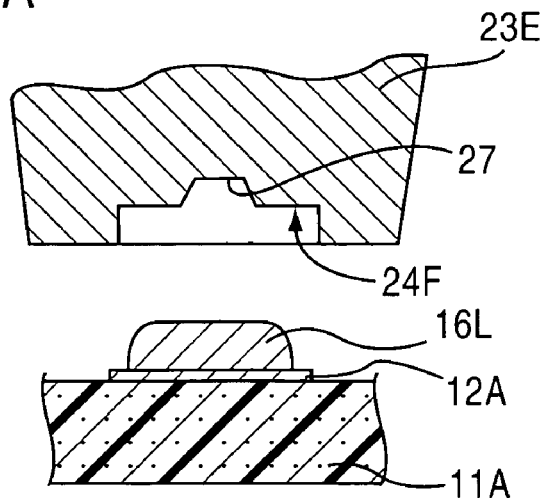
FIG. 11A, FIG. 11B and FIG. 11C are diagrams for explaining an eleventh embodiment of the integrated circuit contactor of the present invention and a production method thereof.
Figure 11B:
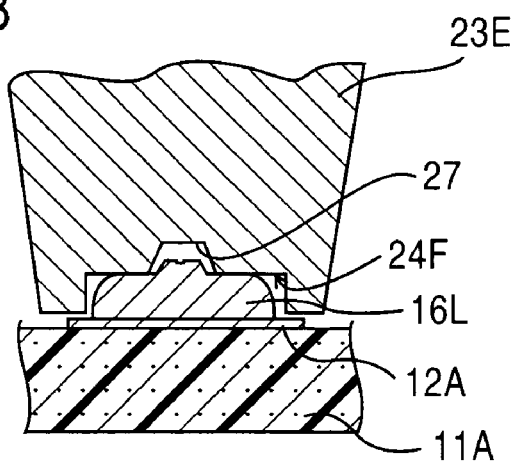
Figure 11C:
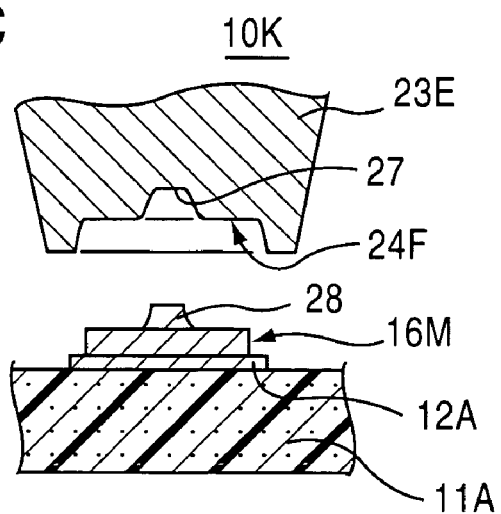

FIG. 11A, FIG. 11B and FIG. 11C show an eleventh embodiment of the integrated circuit contactor of the present invention and a production method thereof.

As shown in FIG. 11A, in an integrated circuit contactor which is repeatedly used with LSI devices over an extended period of time, a plurality of contacts 16L bonded to the pads 12A on the base 11A are rounded. Hereinafter, this contactor will be called the used contactor. The projecting edges of the contacts in the original contactor (which is essentially the same as the contactor 10A of FIG. 1C) are removed from the used contactor of FIG. 11A due to wear of the contacts with the LSI device terminals. The used contactor of FIG. 11A does not provide reliability of electric connections between the LSI device terminals and the contacts 16L.

In the production method of the contactor 10K of the present embodiment, the rounded contacts 16L of the used contactor of FIG. 11A are formed into a plurality of contacts 16M, each having a projecting edge 28 with a roughness, as in the contactor 10K of FIG. 11C. It is possible for the production method of the present embodiment to increase the operating life of the contactor 10K.

As shown in FIG. 11A, a forming tool 23E is placed above a center of a corresponding one of the rounded contacts 16L on the used contactor. The forming tool 23E includes a cavity 24F and a recess 27 in the middle of the cavity 24F. The cavity 24F and the recess 27 are used to form the corresponding rounded contact 16L on the base 11A into a contact 16M having a predetermined shape. When the forming tool 23E is lowered, the cavity 24F and the recess 27 act to form the rounded contact 16L into the contact 16M.

As shown in FIG. 11B, the forming tool 23E is lowered to the rounded contact 16L so as to form the contact 16M on the pad 12A.

As shown in FIG. 11C, the forming tool 23E is lifted from the contact 16M. The rounded contact 16L is formed into the predetermined shape of the contact 16M by the cavity 24F and the recess 27 of the forming tool 23E. The resulting contact 16M has the projecting edge 28 with a roughness produced by the forming of the contact 16M by the forming tool 23E. The above procedure is repeated with respect to each of the plurality of pads 12A on the base 11A, and a plurality of contacts 16M on the pads 12A in the contactor 10K are produced. It is possible for the production method of the present embodiment to increase the operating life of the contactor 10K.

The forming tool 23E in the present embodiment is provided with a heater (not shown) and an ultrasonic vibration source (not shown). The heater supplies a thermal energy to soften the rounded contact 16L when forming the rounded contact 16L into the contact 16M. The ultrasonic vibration source acts to ultrasonically vibrate the rounded contact 16L via the forming tool 23E when forming the rounded contact 16L into the contact 16M.

The forming tool 23E in the present embodiment has, as shown in FIG. 11A, the cavity 24F and the recess 27, and the cavity 24F and the recess 27 are used to form one of the rounded contacts 16L into the predetermined shape of the contact 16M, the cavity 24F not touching neighboring ones of the rounded contacts 16L when forming the corresponding rounded contact 16L into the contact 16M. The plurality of contacts 16M are sequentially produced one by one by using the forming tool 23E.

Figure 12:
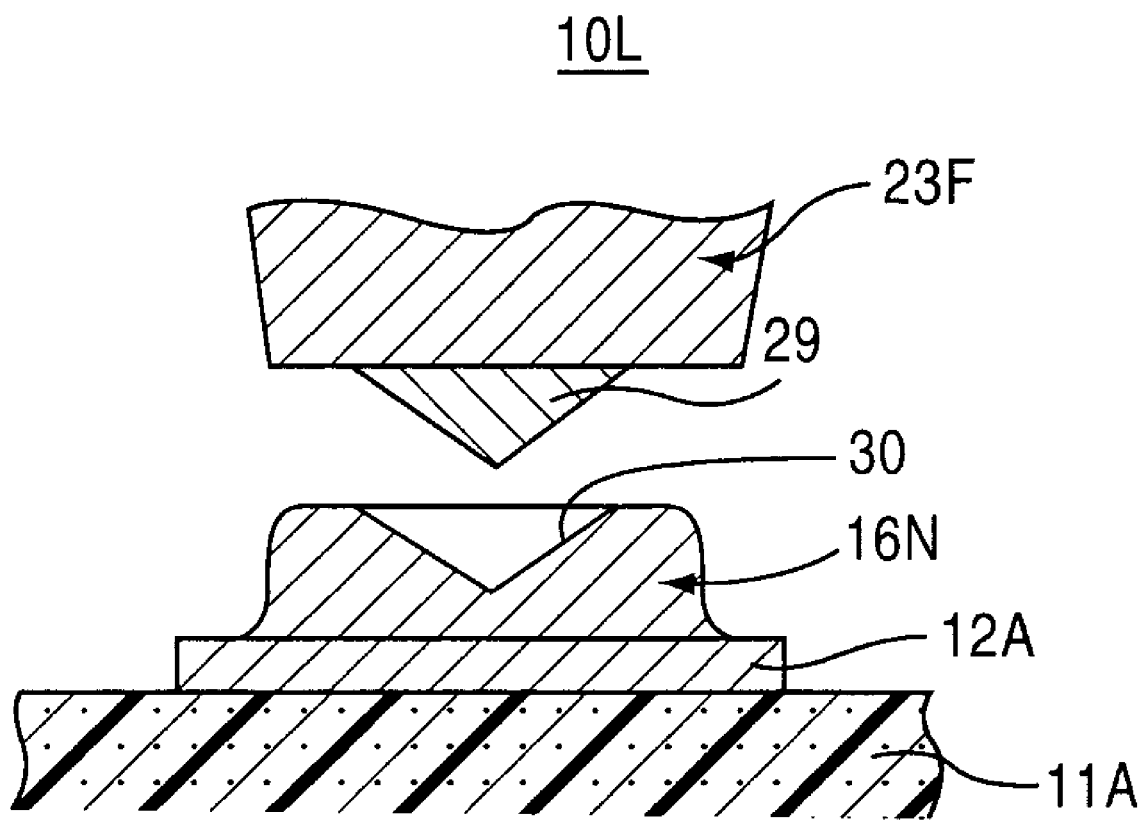
FIG. 12 is a diagram for explaining a twelfth embodiment of the integrated circuit contactor of the present invention and a production method thereof.

FIG. 12 shows a twelfth embodiment of the integrated circuit contactor of the present invention and a production method thereof.

Similar to the contactor 10A of FIG. 1C, an integrated circuit contactor in which a plurality of bumps (similar to the bump 25 of FIG. 6A) are bonded to the pads 12A on the base 11A is prepared by using the bonding head 13. Hereinafter, this contactor will be called the intermediate contactor. As shown in FIG. 12, the contactor 10L of the present embodiment is produced from the intermediate contactor by using a forming tool 23F. In FIG. 12, only a single pad 12A and a single contact 16N are shown for the sake of simplicity of description. After the intermediate contactor is prepared, the forming tool 23F which includes a raised conical portion 29 is placed above a center of a corresponding one of the bumps on the intermediate contactor. When the forming tool 23F is lowered, the raised conical portion 29 of the forming tool 23F acts to form the bump into a predetermined shape.

As shown in FIG. 12, the forming tool 23F is lowered to the bump so as to form a contact 16N on the pad 12A. The bump is formed into the predetermined shape of the contact 16N by the raised conical portion 29 of the forming tool 23F. The resulting contact 16N has a recessed conical portion 30 in the center of the contact 16N. The above procedure is repeated with respect to each of the plurality of pads 12A on the base 11A, and a plurality of contacts 16N on the pads 12A are produced.

The forming tool 23F in the present embodiment is provided with a heater (not shown) and an ultrasonic vibration source (not shown). The heater supplies a thermal energy to soften the corresponding bump when forming the bump into the contact 16N. The ultrasonic vibration source acts to ultrasonically vibrate the corresponding bump via the forming tool 23F when forming the bump into the contact 16N.

The forming tool 23F in the present embodiment has, as shown in FIG. 12, the raised conical portion 29, and the raised conical portion 29 is used to form a corresponding one of the bumps of the intermediate contactor into the predetermined shape of the contact 16N, the raised conical portion 29 not touching neighboring ones of the bumps of the intermediate contactor when forming the corresponding bump into the contact 16N. The plurality of contacts 16N are sequentially produced one by one by using the forming tool 23F.

In a case of an LSI device having ball bumps as the terminals of the LSI device, the ball bumps of the LSI device can be easily connected to the recessed contacts 16N of the contactor 10L, and the contactor 10L of the present embodiment can assure good reliability of electric connections of the LSI device ball bumps and the contacts 16N of the contactor 10L.

In the present embodiment, each of the contacts 16N of the contactor 10L has the recessed conical portion 30 in the center of the contact 16N. However, the present invention is not limited to this embodiment. Alternatively, the contacts 16N of the contactor 10L may be formed into either a recessed hemispherical portion or a recessed truncated conical portion.

Figure 13A:
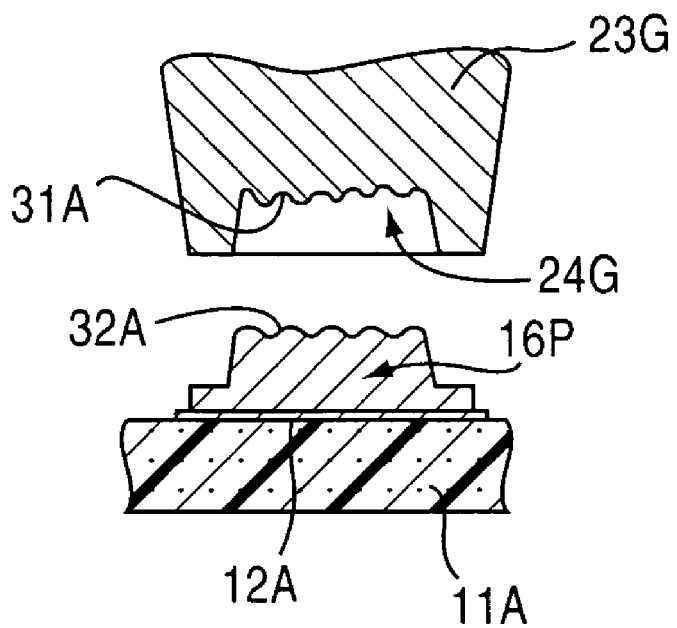
FIG. 13A and FIG. 13B are diagrams for explaining thirteenth and fourteenth embodiments of the integrated circuit contactor of the present invention, and production methods thereof.
Figure 13B:
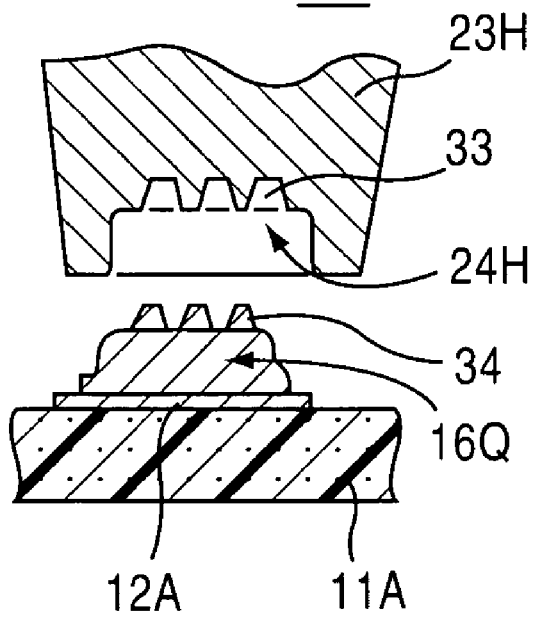

FIG. 13A and FIG. 13B show thirteenth and fourteenth embodiments of the integrated circuit contactor of the present invention, and production methods thereof.

In the embodiment of FIG. 13A, a forming tool 23G (which is similar to the forming tool 23A of FIG. 6A) includes a cavity 24G and a coarse-surface forming portion 31A. The coarse-surface forming portion 31A is placed into contact with one of the plurality of contacts on the base 11A of the intermediate contactor when forming the corresponding contact into a predetermined shape. In the resulting contactor 10M, each of a plurality of contacts 16P on the pads 12A has a top surface 32A which is made coarse by the coarse-surface forming portion 31A. The coarse-surface forming portion 31A is provided at a bottom position of the forming tool 23G. The coarse-surface forming portion 31A is used to compress the corresponding contact against the base 11A of the intermediate contactor when forming the corresponding contact into the predetermined shape.

The forming tool 23G in the embodiment of FIG. 13A is provided with a heater (not shown) and an ultrasonic vibration source (not shown). The heater supplies a thermal energy to soften the bump when forming the bump into the contact 16P. The ultrasonic vibration source acts to ultrasonically vibrate the bump via the forming tool 23G when forming the bump into the contact 16P. The use of the forming tool 23G allows the forming of each of the plurality of contacts on the intermediate contactor into the predetermined shape with good accuracy. Variations of the shape of the plurality of contacts on the contactor can be eliminated by the use of the forming tool 23G.

In the contactor 10M of the present embodiment, the plurality of contacts 16P have the respective top surfaces 32A which are made coarse by using the forming tool 23G. When the terminals 41 of the LSI device 40 are connected to the contacts 16P of the contactor 10M, it is possible to assure good reliability of electric connections between the LSI device terminals 41 and the contacts 16P because of the coarse surfaces 32A.

In the embodiment of FIG. 13B, a forming tool 23H (which is similar to the forming tool 23A of FIG. 6A) includes a cavity 24H and a projection/depression forming portion 33. The projection/depression forming portion 33 is placed into contact with one of the plurality of contacts on the base 11A of the intermediate contactor when forming the corresponding contact into a predetermined shape. In the resulting contactor 10N, each of a plurality of contacts 16Q has a top surface 34 which is formed into projections and depressions by the projection/depression forming portion 33. The projection/depression forming portion 33 is provided at a bottom position of the forming tool 23H. The projection/depression forming portion 33 is used to compress the corresponding contact against the base 11A of the intermediate contactor when forming the corresponding contact into the predetermined shape.

The forming tool 23H in the embodiment of FIG. 13B is provided with a heater (not shown) and an ultrasonic vibration source (not shown). The heater supplies a thermal energy to soften the bump when forming the bump into the contact 16Q. The ultrasonic vibration source acts to ultrasonically vibrate the bump via the forming tool 23H when forming the bump into the contact 16Q. The use of the forming tool 23H allows the forming of each of the plurality of contacts on the intermediate contactor into the predetermined shape with good accuracy. Variations of the shape of the plurality of contacts on the contactor can be eliminated by the use of the forming tool 23H.

In the contactor 10N of the present embodiment, the plurality of contacts 16Q have the respective, top surfaces 34 which are formed into projections and depressions by using the forming tool 23H. When the terminals 41 of the LSI device 40 are connected to the contacts 16Q of the contactor 10N, it is possible to assure good reliability of electric connections between the LSI device terminals 41 and the contacts 16Q because of the projection/depression surfaces 34.

Figure 14:
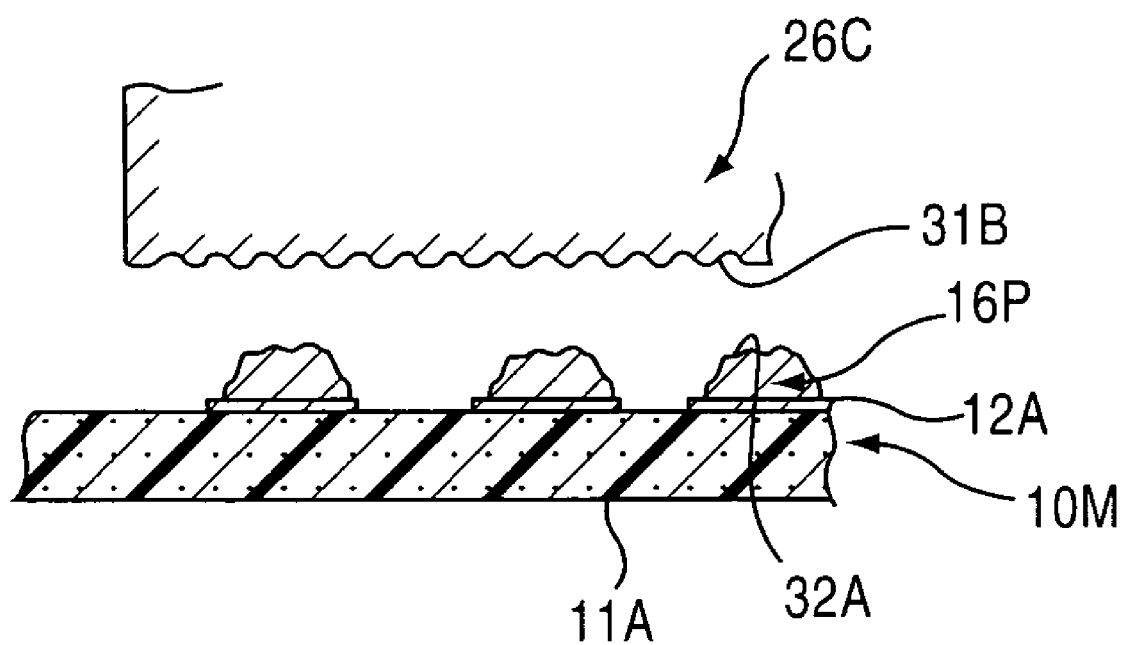
FIG. 14 is a diagram for explaining a production method of the integrated circuit contactor of the present invention.

FIG. 14 shows a production method of the integrated circuit contactor of the present invention.

As shown in FIG. 14, the integrated circuit contactor produced by the production method of the present embodiment is essentially the same as the contactor 10M of FIG. 13A. In order to produce the contacts 16P with the coarse surfaces 32A on the contactor 10M, the production method of the present embodiment uses a leveling tool 26C when forming the bumps (which are similar to the bump 25 of FIG. 6A) into the contacts 16P. The leveling tool 26C has a coarse-surface forming portion 31B on a bottom surface of the leveling tool 26C. The coarse-surface forming portion 31B is placed in contact with the bumps of the intermediate contactor when forming the bumps into the contacts 16P.

According to the production method of the present embodiment, the plurality of contacts 16P are formed by one operation of the leveling tool 26C so that the plurality of contacts 16P have the respective top surfaces which are made coarse by the coarse-surface forming portion 31B. Hence, the production method of the present embodiment is effective in achieving an increased productivity of the integrated circuit contactor with low cost.

The production method of the present embodiment can more speedily produce the contactor 10M than the production method of the embodiment of FIG. 6A and FIG. 6B.

The leveling tool 26C in the present embodiment is provided with a heater (not shown) and an ultrasonic vibration source (not shown). The heater supplies a thermal energy to soften the bumps when forming the bumps into the contacts 16P. The ultrasonic vibration source acts to ultrasonically vibrate the bumps via the leveling tool 26C when forming the bumps into the contacts 16P.

In the above-described embodiments of FIG. 13A through FIG. 14, the coarse surfaces 32A or the projection/depression surfaces 34 are formed on the contacts 16P or 16Q of the contactor 10M or 10N by the compression of the forming tool 23G or 23H or the leveling tool 26C onto the bumps of the intermediate contactor. It is possible for the production methods of these embodiments to speedily and easily produce the contactor 10M and the contactor 10N. The plurality of contacts 16P are formed by one operation of the leveling tool 26C, and it is possible for the production method of the embodiment of FIG. 14 to achieve an increased productivity of the contactor with low cost.

In the above-described embodiments of FIG. 13A through FIG. 14, the production method may include, after the step of forming the plurality of contacts 16P or 16Q having the coarse surfaces 32A or the projection/depression surfaces 34 is performed, a step of hardening a surface layer of each of the plurality of contacts, so that each contact is covered by the hardened surface layer. By the hardened surface layer, it is possible for the production method to assure good reliability of electric connections between the LSI device terminals 41 and the contacts 16P or 16Q even when the LSI device terminals are covered by a metal oxide film.

Figure 15:
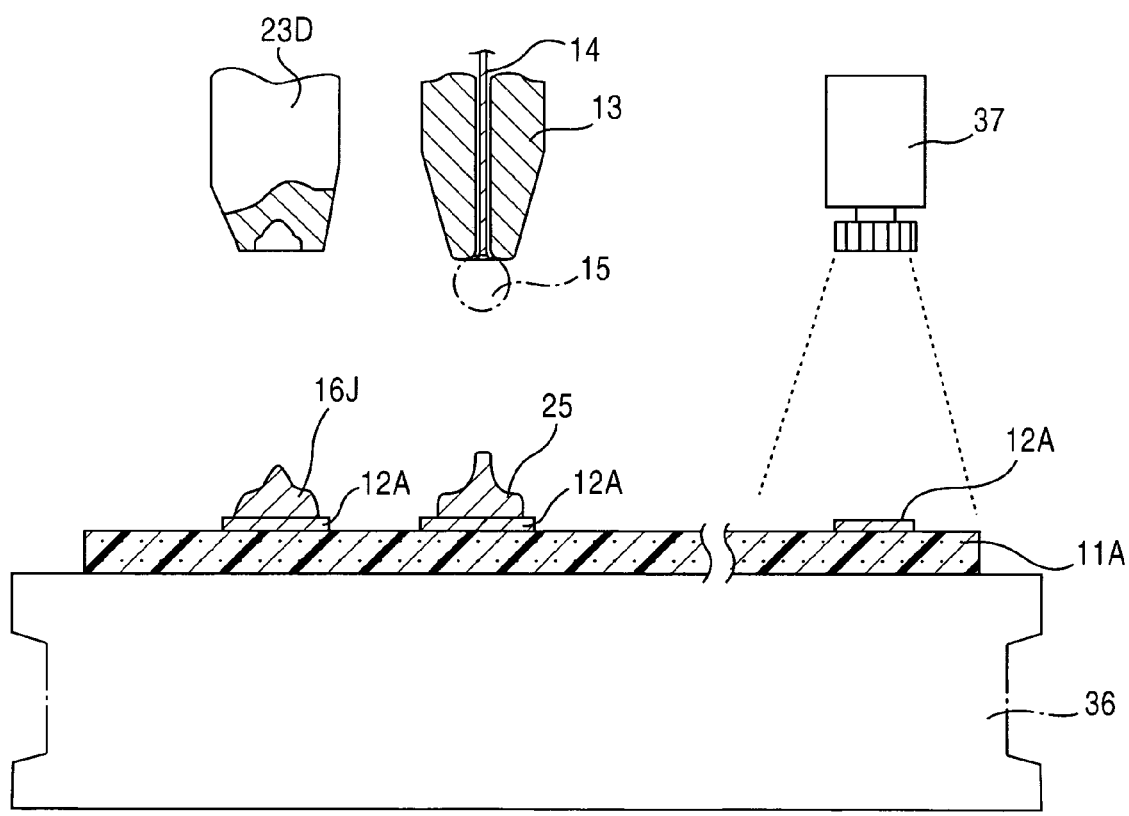
FIG. 15 is a diagram for explaining a production apparatus of the integrated circuit contactor of the present invention.

FIG. 15 shows a production apparatus of the integrated circuit contactor of the present invention. In FIG. 15, the elements which are essentially the same as corresponding elements in FIG. 1A through FIG. 14 are designated by the same reference numerals, and a description thereof will be omitted.

As shown in FIG. 15, a production apparatus 35 of the present embodiment generally has the bonding head 13, the forming tool 23D, a conveyor 36, and an image recognition device 37. The conveyor 36 acts to transport the base 11A on which the plurality of pads 12A are bonded, to a given location. The base 11A is placed on the conveyor 36, and the conveyor 36 is capable of transporting the base 11A to a given location in a two-dimensional manner (or in x-axis and y-axis horizontal directions). The bonding head 14 acts to bond a wire 14 of a conductive material to one of the plurality of pads 12A, and pull the wire apart from the pad so as to form a plurality of bumps 25 of the conductive material which are respectively bonded to the plurality of pads 12A. The forming tool 23D acts to form one of the plurality of bumps 25 into a predetermined shape (or one of the plurality of contacts 16J) after one of the plurality of bumps 25 is bonded to a corresponding one of the plurality of pads 12A. The image recognition device 37 is provided over the conveyor 36.

The image recognition device 37 includes a CCD (charge-coupled device) camera and an image processing device (not shown). By using the CCD camera and the image processing device, the image recognition device 37 recognizes an alignment mark on the base 11A. In the present embodiment, the plurality of pads 12A on the base 11A are used as the alignment mark. A relative position of the base 11A to the image recognition device 37 is detected based on the result of the recognition of the alignment mark. The conveyor 36 is controlled based on the relative position of the base 11A so as to transport the base 11A to the given location. After the base 11A is transported to the given location, the bonding head 13 and the forming tool 23D are positioned to two of the plurality of pads 12A on the base 11A.

In the production apparatus 35 of the present embodiment, the bonding head 13 and the forming tool 23D are fixed to each other with no relative movement, and the bonding head 13 and the forming tool 23D are simultaneously operated for two of the plurality of pads 12A on the base 11A at the given location. Specifically, in the production apparatus 35 of the present embodiment, the bonding head 13 and the forming tool 23D are secured to a mounting member, and a moving device acts to move the mounting member so that the bonding head 13 and the forming tool 23D are positioned to two of the plurality of pads 12A on the base 11A.

As described above, in the production apparatus 35 of the present embodiment, the bonding head 13 and the forming tool 23D are fixed to each other with no relative movement, and the bonding head 13 and the forming tool 23D are simultaneously operated for two of the plurality of pads 12A on the base 11A at the given location. It is possible for the production apparatus 35 of the present embodiment to consecutively perform the bonding step by the bonding head 13 and the forming step by the forming tool 23D for the plurality of contacts 16J. It is possible to achieve an increased productivity of the contactor with low cost.

In the embodiment of FIG. 15, the production apparatus 35 includes the forming tool 23D described with the embodiment of FIG. 9C. However, the production apparatus of the present invention is not limited to this embodiment. The production apparatus of the present invention may include any of the forming tools 23A through 23H or the leveling tools 26A through 26C described with the embodiments of FIG. 6A through FIG. 14.

In the embodiments of FIG. 1A through FIG. 14, the contacts 16A through 16Q are formed by utilizing the wire bonding technique. However, the same effect can be achieved by using instead other bonding techniques such as arc welding, plasma welding, electron-beam welding, resistance welding or the like if the bonding technique is a method to bond a wire of a conductive material to a pad in a projecting condition of the wire.

Figure 16A:
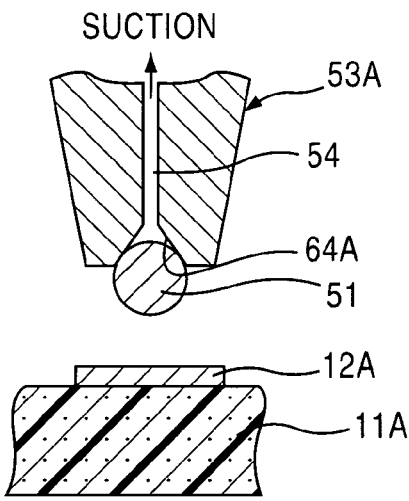
FIG. 16A, FIG. 16B and FIG. 16C are diagrams for explaining a sixteenth embodiment of the integrated circuit contactor of the present invention and a production method thereof.
Figure 16B:
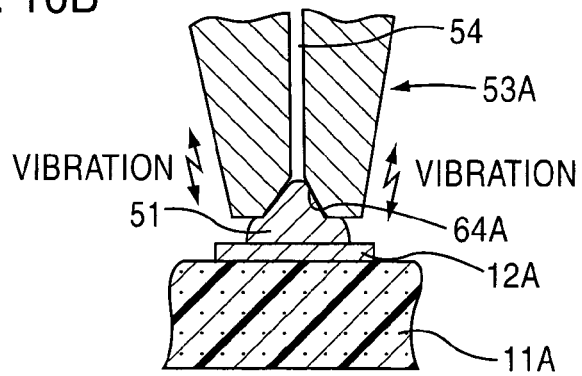
Figure 16C:
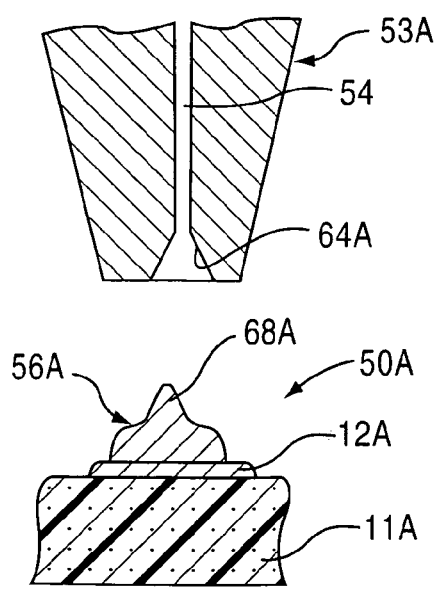

FIG. 16A, FIG. 16B and FIG. 16C show a sixteenth embodiment of the integrated circuit contactor of the present invention and a production method thereof.

FIG. 16C shows a configuration of the integrated circuit contactor 50A in the present embodiment. As shown in FIG. 16C, the contactor 50A includes the base 11A, the plurality of pads 12A bonded to the base 11A, and a plurality of contacts 56A bonded to the pads 12A respectively. In FIG. 16C, only a single pad 12A and a single contact 56A are shown for the sake of simplicity of description.

The base 11A and the pads 12A in the present embodiment are essentially the same as the base 11A and the pads 12A in the embodiment of FIG. 1A through FIG. 1C, and a description thereof will be omitted.

The contacts 56A are produced on the pads 12A from a piece 51 of a conductive material, and formed into a predetermined shape. The piece 51 may be formed in the shape of a ball or a sphere. The contactor 50A of the present embodiment having the contacts 56A is different from a conventional LSI socket having a leaf spring or the like in that the contactor 50A achieves very fine pitch interconnects of the integrated circuit terminals with the contacts 56A.

The contacts 56A or the pieces 51 are made of a conductive material, and the conductive material has a hardness larger than a hardness of the terminals of the LSI device. In the contactor 50A of the present embodiment, the conductive material of the contacts 56A is selected depending on the kind of the conductive material of the terminals of the LSI device similar to the embodiment of FIG. 1A through FIG. 1C.

As described above, in the contactor 50A of the present embodiment, the conductive material of the contacts 56A has a hardness larger than a hardness of the terminals of the LSI device. When the LSI device has a large number of pins (or the terminals) or when the pressure exerted on the contactor 50A by the terminals of the LSI device is high, it is possible to prevent damaging of the contacts 56A of the contactor 50A by the terminals of the LSI device. Generally, a number of LSI devices are repetitively connected to the contacts 56A of the integrated circuit contactor 50A. However, it is possible for the contactor 50A of the present embodiment to prevent damaging of the contacts 56A by the terminals of the LSI devices even when the pressure exerted on the contacts 56A of the contactor 50A by the terminals of the LSI devices is high. Hence, it is possible to assure good reliability of electric connections between the LSI device terminals and the contacts 56A of the contactor 50A.

The contacts 56A are not produced by plating as in the conventional membrane contactor 1 of FIG. 40 which requires a comparatively long time. Each of the contacts 56A is produced by bonding the piece 51 to a corresponding one of the pads 12A and forming the piece into the predetermined shape. The contacts 56A can be speedily formed, and each contact 56A has a projecting edge 68A with a roughness produced by the bonding and forming of the piece. The contacts 56A are supported on the base 11A through the pads 12A, and the base 11A is elastically deformable when a pressure is exerted on the contactor 50A by the terminals of the LSI device. Even when there are variations of the height of the contacts 56A and the terminals, they may be absorbed by the elastic deformation of the base 11A. Hence, it is possible to assure good reliability of electric connections between the LSI device terminals and the contacts 56A.

Further, in the contactor 50A of the present embodiment, the terminals of the LSI device are electrically connected to the contacts 56A only when a pressure is exerted onto the contacts 56A by the terminals of the LSI device, and the terminals of the LSI device are separated from the contacts 56A when no pressure is exerted onto the contacts 56A.

A production method of the contactor 50A of the present embodiment will be explained with reference to FIG. 16A through FIG. 16C.

As shown in FIG. 16A, a base 11A on which a plurality of pads 12A are bonded at positions corresponding to positions of the terminals on the LSI device is prepared. In FIG. 16A, only one pad 12A is shown for the sake of simplicity of description. A bonding head 53A in which a vacuum passage 54 extends along a central axis of the bonding head 53A is transported so that the bonding head 53A is positioned above a center of the pad 12A on the base 11A. The vacuum passage 54 is connected with a vacuum pump (not shown). The piece 51 of the conductive material is held at the leading edge of the bonding head 53A by subjecting the vacuum passage 54 to suction.

The bonding head 53A in the present embodiment is provided with a heater (not shown) and an ultrasonic vibration source (not shown). The heater supplies a thermal energy to soften the piece 51 when forming the piece 51 into the contact 56A. The ultrasonic vibration source acts to ultrasonically vibrate the piece 51 via the bonding head 53A when forming the piece 51 into the contact 56A.

As shown in FIG. 16B, the bonding head 53A is lowered to the pad 12A, and a thermosonic bonding is performed with the bonding head 53A so that the piece 51 is bonded to the pad 12A. In the thermosonic bonding, the piece 51 is compressed while the bonding head 53A is ultrasonically vibrated. The bonding head 53A includes a cavity 64A at a bottom position of the bonding head 53A merging with the end of the vacuum passage 54. The cavity 64A of the bonding head 53A acts to form the piece 51 into the predetermined shape of the contact 56A when the bonding head 53A is lowered to the pad 12A.

As described above, the thermosonic bonding is performed with the bonding head 53A. During the thermosonic bonding, a surface layer of each of the plurality of contacts 56A is hardened by the vibration of the bonding head 53A, so that each contact 56A is covered by the hardened surface layer. Hence, the production method of the present embodiment can assure good reliability of electric connections between the LSI device terminals and the contacts 56A of the contactor 50A.

As shown in FIG. 16C, the bonding head 53A is lifted, and the cavity 64A is separated from the pad 12A so as to form the contact 56A bonded to the pad 12A. The contact 56A has a projecting edge 68A with a roughness produced by the bonding and forming of the piece 51. The above procedure is repeated with respect to each of the plurality of pads 12A on the base 11A, and a plurality of contacts 56A bonded to the pads 12A are produced. Each of the contacts 56A has the projecting edge 68A with a roughness produced by the bonding and forming of the piece 51.

As described above, according to the production method of the integrated circuit contactor 50A in the present embodiment, the contactor 50A having the contacts 56A can be produced by utilizing existing wire bonding equipment. It is not necessary to use a newly prepared production equipment. Hence, it is possible to achieve an increased productivity of the integrated circuit contactor with low cost.

According to the production method of the contactor 50A in the present embodiment, the size and height of the contacts 56A being produced, the diameter of the wire 14 being used, and the bonding conditions (including the diameter of the piece 51, the bonding pressure being exerted on the pad 12A, the heating temperature, and the ultrasonic energy input) may be controlled so as to form a desired shape of the contacts 56A and suit the requirement of the LSI device.

According to the production method of the contactor 50A in the present embodiment, the contacts 56A can be speedily and easily formed by using the bonding head 53A, and each contact 56A has the projecting edge 68A with a roughness produced by the bonding and forming of the piece. This is effective in increasing the reliability of electric connections between the terminals of the LSI device and the contacts 56A of the contactor 50A.

Figure 17:
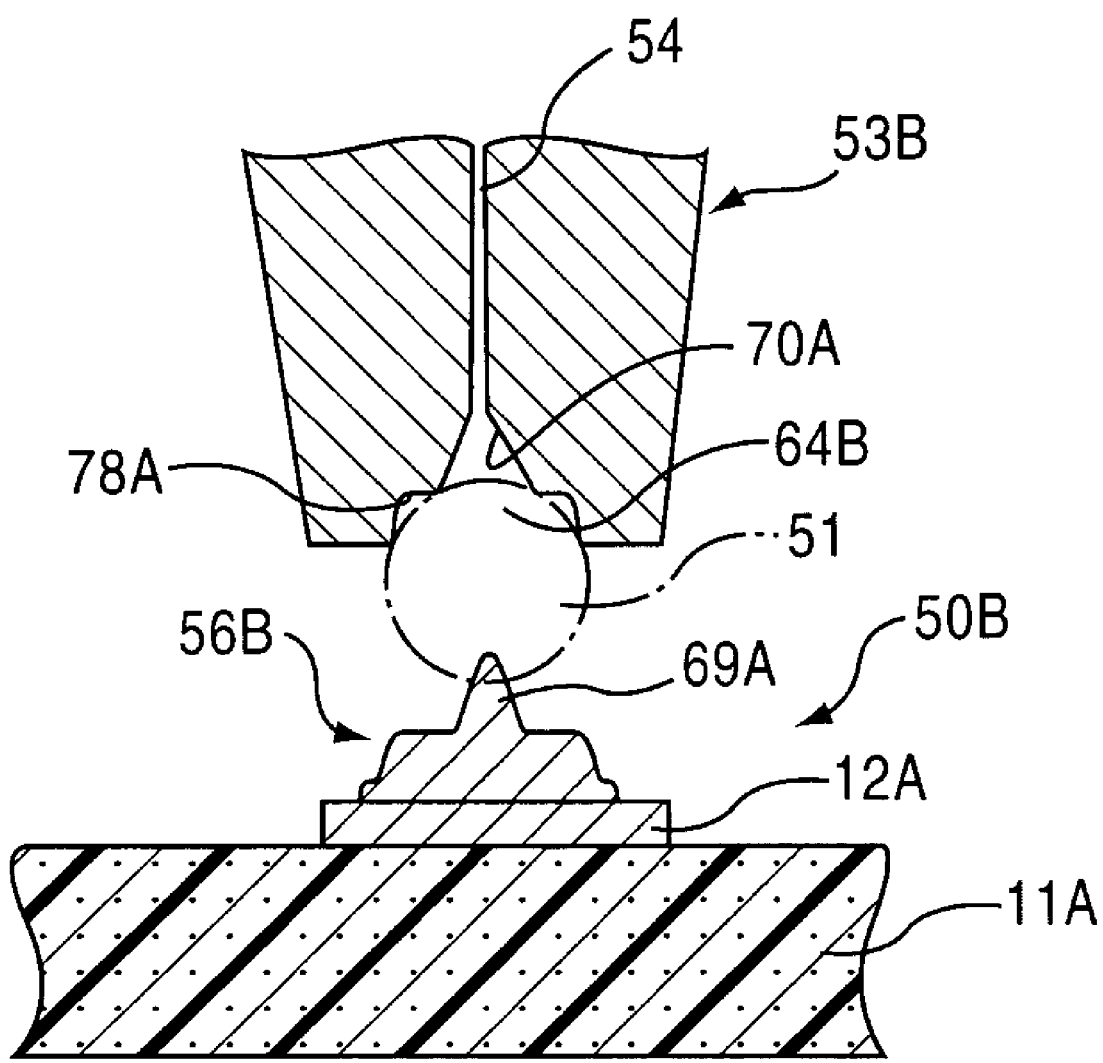
FIG. 17 is a diagram for explaining a seventeenth embodiment of the integrated circuit contactor of the present invention and a production method thereof.

FIG. 17 shows a seventeenth embodiment of the integrated circuit contactor of the present invention and a production method thereof. In FIG. 17, the elements which are essentially the same as corresponding elements in FIG. 16A through FIG. 16C are designated by the same reference numerals, and a description thereof will be omitted.

As shown in FIG. 17, a bonding head 53B which includes the vacuum passage 54 and a cavity 64B is transported so that the bonding head 53B is positioned above a center of one of the pads 12A on the base 11A. Similar to the embodiment of FIG. 16A and FIG. 16B, the piece 51 of the conductive material is bonded to the pad 12A. When the bonding head 53B is lowered, the cavity 64B of the bonding head 53B acts to form the piece 51 into a predetermined shape of a contact 56B.

The bonding head 53B in the present embodiment is provided with a heater (not shown) and an ultrasonic vibration source (not shown). The heater supplies a thermal energy to soften the piece 51 when forming the piece 51 into the contact 56B. The ultrasonic vibration source acts to ultrasonically vibrate the piece 51 via the bonding head 53B when forming the piece 51 into the contact 56B.

The bonding head 53B is lowered to the pad 12A, and a thermosonic bonding is performed with the bonding head 53B so that the piece 51 is bonded to the pad 12A. In the thermosonic bonding, the piece 51 is compressed while the bonding head 53B is ultrasonically vibrated. The bonding head 53B includes a cavity 64B at a bottom position of the bonding head 53B, a conical recess 70A at the center of the cavity 64B, merging with the end of the vacuum passage 54, and a pressing peripheral portion 78A between the cavity 64B and the conical recess 70A. The cavity 64B of the bonding head 53B acts to form the piece 51 into the predetermined shape of the contact 56B when the bonding head 53B is lowered to the pad 12A. The pressing peripheral portion 78A is used to compress a periphery of the piece 51 around the center of the piece 51 against the base 11A when forming the piece 51 into the predetermined shape. The cavity 64B does not touch neighboring ones of the pads 12A on the base 11A when forming the piece 51 into the contact 56B. The plurality of contacts 56B are sequentially produced one by one by using the bonding head 53B. The contactor 50B of the present embodiment is effective in providing good reliability of electric connections between the terminals 41 of the LSI device 40 and the contacts 56B of the contactor 50B.

As described above, the thermosonic bonding is performed with the bonding head 53B. During the thermosonic bonding, a surface layer of each of the plurality of contacts 56B is hardened by the vibration of the bonding head 53B, so that each contact 56B is covered by the hardened surface layer. Hence, the production method of the present embodiment can assure good reliability of electric connections between the LSI device terminals and the contacts 56B of the contactor 50B.

The bonding head 53B in the present embodiment is provided with a heater (not shown) and an ultrasonic vibration source (not shown). The heater supplies a thermal energy to soften the piece 51 when forming the piece 51 into the contact 56B. The ultrasonic vibration source acts to ultrasonically vibrate the piece 51 via the bonding head 53B when forming the piece 51 into the contact 56B.

The bonding head 53B in the present embodiment has the cavity 64B and the recess 70A, and the cavity 64B and the recess 70A are used to form the piece 51 into the predetermined shape of the contact 56B, the cavity 64B and the recess 70A not touching neighboring ones of the pads 12A when forming the piece 51 into the contact 56B. The plurality of contacts 56B are sequentially produced one by one by using the bonding head 53B. The use of the bonding head 53B allows the forming of each of the plurality of contacts into the predetermined shape with good accuracy. Variations of the shape of the plurality of contacts on the contactor can be eliminated by the use of the bonding head 53B.

Figure 18:
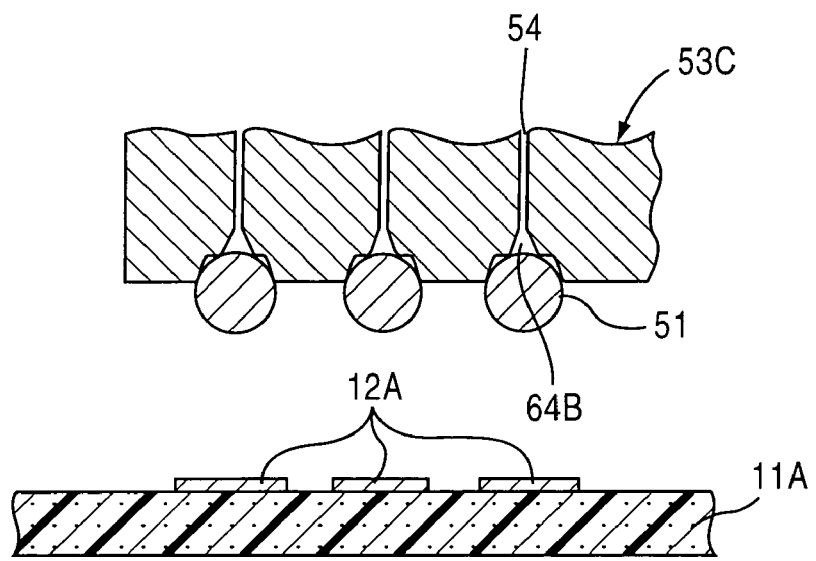
FIG. 18 is a diagram for explaining an eighteenth embodiment of the integrated circuit contactor of the present invention and a production method thereof.

FIG. 18 shows an eighteenth embodiment of the integrated circuit contactor of the present invention and a production method thereof.

As shown in FIG. 18, a bonding head 53C in the present embodiment includes a plurality of vacuum passages 54 (each corresponding to the passage 54 of FIG. 17) and a plurality of cavities 64B (each corresponding to the cavity 64B of FIG. 17). A plurality of pieces 51 are respectively held at the leading edges of the vacuum passages 54 of the bonding head 53C by subjecting the vacuum passages 54 to suction.

According to the production method of the contactor of the present embodiment, the plurality of contacts on the pads 12A are formed from the pieces 51 by one operation of the bonding head 53C so that the plurality of contacts have the predetermined shape according to the cavities 64B. Hence, the production method of the present embodiment is more effective in achieving an increased productivity of the integrated circuit contactor with low cost.

Figure 19:
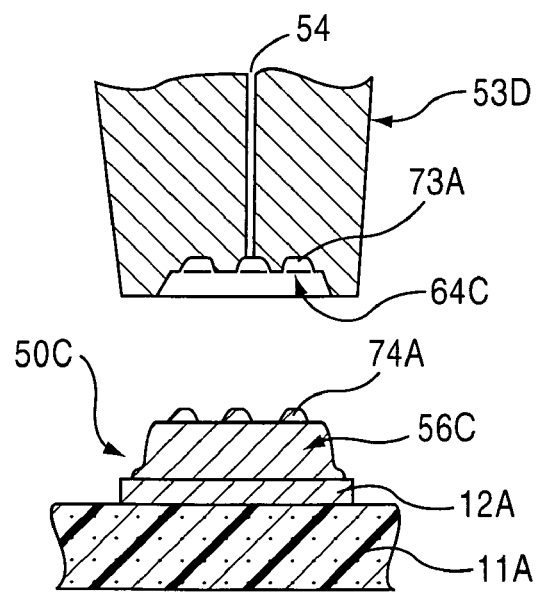
FIG. 19 is a diagram for explaining a nineteenth embodiment of the integrated circuit contactor of the present invention and a production method thereof.

FIG. 19 shows a nineteenth embodiment of the integrated circuit contactor of the present invention and a production method thereof.

As shown in FIG. 19, a bonding head 53D in the present embodiment includes the vacuum passage 54, a cavity 64C, and a projection/depression forming portion 73A. The projection/depression forming portion 73A is placed into contact with one of the plurality of pieces 51 on the pads 12A when forming the corresponding piece into a predetermined shape. In the resulting contactor 50C, each of a plurality of contacts 56C has a top surface 74A which is formed into projections and depressions by the projection/depression forming portion 73A. The projection/depression forming portion 73A is provided at a bottom position of the bonding head 53D. The projection/depression forming portion 73A is used to compress the corresponding piece against the base 11A when forming the corresponding piece 51 into the predetermined shape.

The bonding head 53D in the embodiment of FIG. 19 is provided with a heater (not shown) and an ultrasonic vibration source (not shown). The heater supplies a thermal energy to soften the piece 51 when forming the piece 51 into the contact 56C. The ultrasonic vibration source acts to ultrasonically vibrate the piece 51 via the bonding head 53D when forming the piece 51 into the contact 56C.

In the contactor 50C of the present embodiment, the plurality of contacts 56C have the respective top surfaces 74A which are formed into projections and depressions by using the bonding head 53D. When the terminals 41 of the LSI device 40 are connected to the contacts 56C of the contactor 50C, it is possible to assure good reliability of electric connections between the LSI device terminals 41 and the contacts 56C because of the projection/depression surfaces 74A.

Figure 20A:
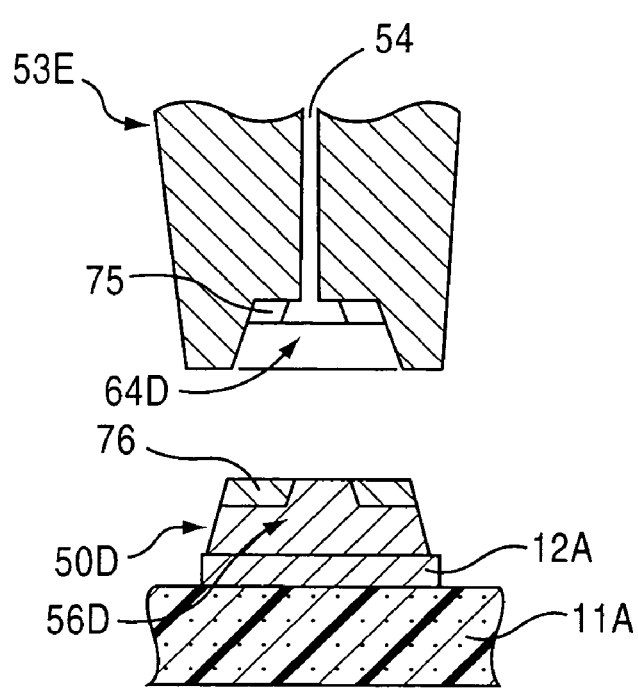
FIG. 20A and FIG. 20B are diagrams for explaining a twentieth embodiment of the integrated circuit contactor of the present invention and a production method thereof.
Figure 20B:
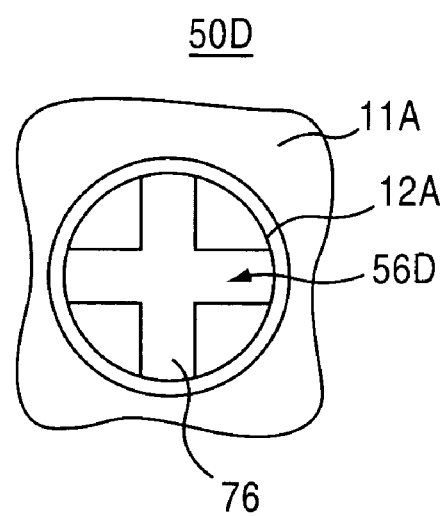

FIG. 20A and FIG. 20B show a twentieth embodiment of the integrated circuit contactor of the present invention and a production method thereof. FIG. 20A is a side view of the contactor 50D of the present embodiment, and FIG. 20B is a top view of the contactor 50D.

As shown in FIG. 20A and FIG. 20B, in the contractor 50D of the present embodiment, the plurality of contacts 56D have respective top surfaces which are formed into cross-shaped slits 76 by using a bonding head 53E. When the terminals 41 of the LSI device 40 are connected to the contacts 56D of the contactor 50D, it is possible to assure good reliability of electric connections between the LSI device terminals 41 and the contacts 56D because of the cross-shaped slits 76.

The bonding head 53E in the present embodiment includes the vacuum passage 54, a cavity 64D, and a cross-shaped slit forming groove 75. The cross-shaped slit forming groove 75 is placed into contact with one of the plurality of pieces 51 on the pads 12A when forming the corresponding piece into a predetermined shape. In the resulting contactor 50D, each of the plurality of contacts 56D has a top surface formed into the cross-shaped slit 76 by the cross-shaped slit forming groove 75. The cross-shaped slit forming groove 75 is provided at a bottom position of the bonding head 53E. The cross-shaped slit forming groove 75 is used to compress the corresponding piece. 51 against the base 11A when forming the piece 51 into the predetermined shape.

The bonding head 53E in the embodiment of FIG. 20A is provided with a heater (not shown) and an ultrasonic vibration source (not shown). The heater supplies a thermal energy to soften the piece 51 when forming the piece 51 into the contact 56D. The ultrasonic vibration source acts to ultrasonically vibrate the piece 51 via the bonding head 53E when forming the piece 51 into the contact 56D. According to the production method of the present embodiment, when the terminals 41 of the LSI device 40 are connected to the contacts 56D of the contactor 50D, it is possible to assure good reliability of electric connections between the LSI device terminals 41 and the contacts 56D because of the cross-shaped slits 76.

Figure 22:
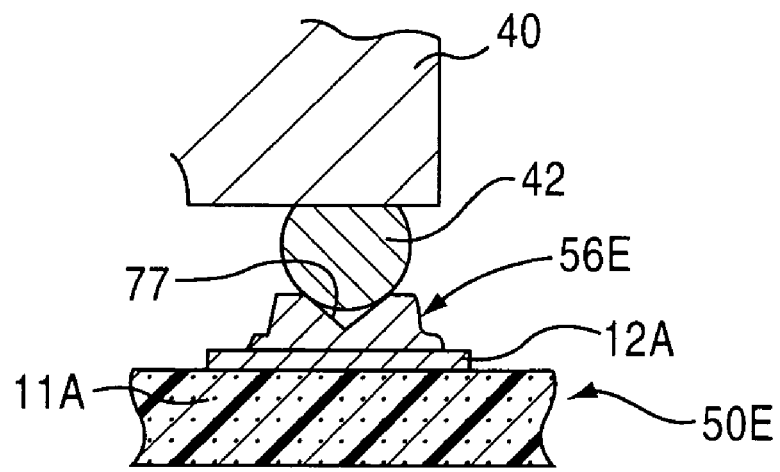
FIG. 22 is a diagram for explaining a configuration of the contactor of FIG. 21 connected to an LSI device.

FIG. 21 shows a twenty-first embodiment of the integrated circuit contactor of the present invention and a production method thereof. FIG. 22 shows a configuration of the contactor 50E of FIG. 21 connected to the LSI device 40.

As shown in FIG. 22, in a case of the LSI device 40 having ball bumps 42 as the terminals of the LSI device 40, the ball bumps 42 can be easily connected to recessed contacts 56E of a contactor 50E of the present embodiment. The contactor 50E of the present embodiment can assure good reliability of electric connections of the LSI device ball bumps 42 and the contacts 56E.

Similar to the contactor 50B of FIG. 17, an integrated circuit contactor in which a plurality of pieces 51 are bonded to the pads 12A on the base 11A is prepared. Hereinafter, this contactor will be called the intermediate contactor. As shown in FIG. 21, the contactor 50E of the present embodiment is produced from the intermediate contactor by using a bonding head 53F. In FIG. 21, only a single pad 12A and a single contact 56E are shown for the sake of simplicity of description. After the intermediate contactor is prepared, the bonding head 53F which includes a cavity 64E and a raised conical portion 69B is transported so that the bonding head 53F is positioned above a center of one of the pieces 51 on the intermediate contactor. When the bonding head 53F is lowered, the raised conical portion 69B of the bonding head 53F acts to form the bump into a predetermined shape of the contact 56E.

As shown in FIG. 21, the piece 51 is formed into the predetermined shape of the contact 56E by the raised conical portion 69B of the bonding head 53F. The resulting contact 56E has a recessed conical portion 77 in the center of the contact 56E. The above procedure is repeated with respect to each of the plurality of pads 12A on the base 11A, and a plurality of contacts 56E on the pads 12A are produced.

The bonding head 53F in the present embodiment is provided with a heater (not shown) and an ultrasonic vibration source (not shown). The heater supplies a thermal energy to soften the piece 51 when forming the piece 51 into the contact 56E. The ultrasonic vibration source acts to ultrasonically vibrate the corresponding piece 51 via the bonding head 53F when forming the piece 51 into the contact 56E.

The bonding head 53F in the present embodiment has the raised conical portion 69B, and the raised conical portion 69B is used to form one of the pieces 51 of the intermediate contactor into the predetermined shape of the contact 56E, the raised conical portion 69B not touching neighboring ones of the pads 12A of the intermediate contactor when forming the piece 51 into the contact 56E. The plurality of contacts 56E are sequentially produced one by one by using the bonding head 53F.

Figure 23:
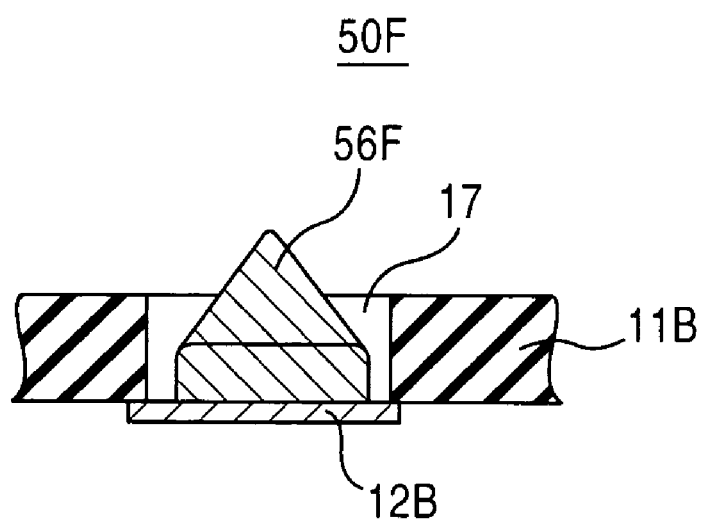
FIG. 23 is a diagram for explaining a twenty-second embodiment of the integrated circuit contactor of the present invention.

FIG. 23 shows a twenty-second embodiment of the integrated circuit contactor of the present invention.

As shown in FIG. 23, the contactor 50F of the present embodiment includes a plurality of openings 17 in the base 11B at positions corresponding to positions of the terminals 41 on the LSI device 40 (see FIG. 22). Similar to the embodiment of FIG. 2, the contactor 50F includes the base 11B, the plurality of pads 12B bonded to the base 11B, and a plurality of contacts 56F bonded to the pads 12B respectively. The pads 12B are provided on a bottom surface of the base 11B such that the openings 17 are closed by the pads 12B. The contacts 56F are respectively provided within the openings 17. In FIG. 23, only a single opening 17, a single pad 12B and a single contact 56F are shown for the sake of simplicity of description.

Source materials and configuration of the base 11B, the pads 12B and the contacts 56F, and a production method of the contactor 50F of the present embodiment are essentially the same as those of the embodiment of FIG. 16A through 16C. The openings 17 may be formed in the base 11B by a press forming, an etching or a laser cutting.

In the contactor 50F of the present embodiment, the contacts 56F are respectively provided within the openings 17. When a pressure is exerted onto the contactor 50F by the terminals of the LSI device 40, the LSI device is brought into contact with a top surface of the base 11B while the terminals of the LSI device are connected to the contacts 56F. It is possible to prevent the contacts 56F from being excessively compressed by the pressure of the terminals of the LSI device. It is possible for the contactor 50F of the present embodiment to prevent damaging of the contacts 56F by the terminals of the LSI device even when the pressure exerted on the contacts 56F of the contactor 50F by the terminals of the LSI devices is high.

Figure 24:
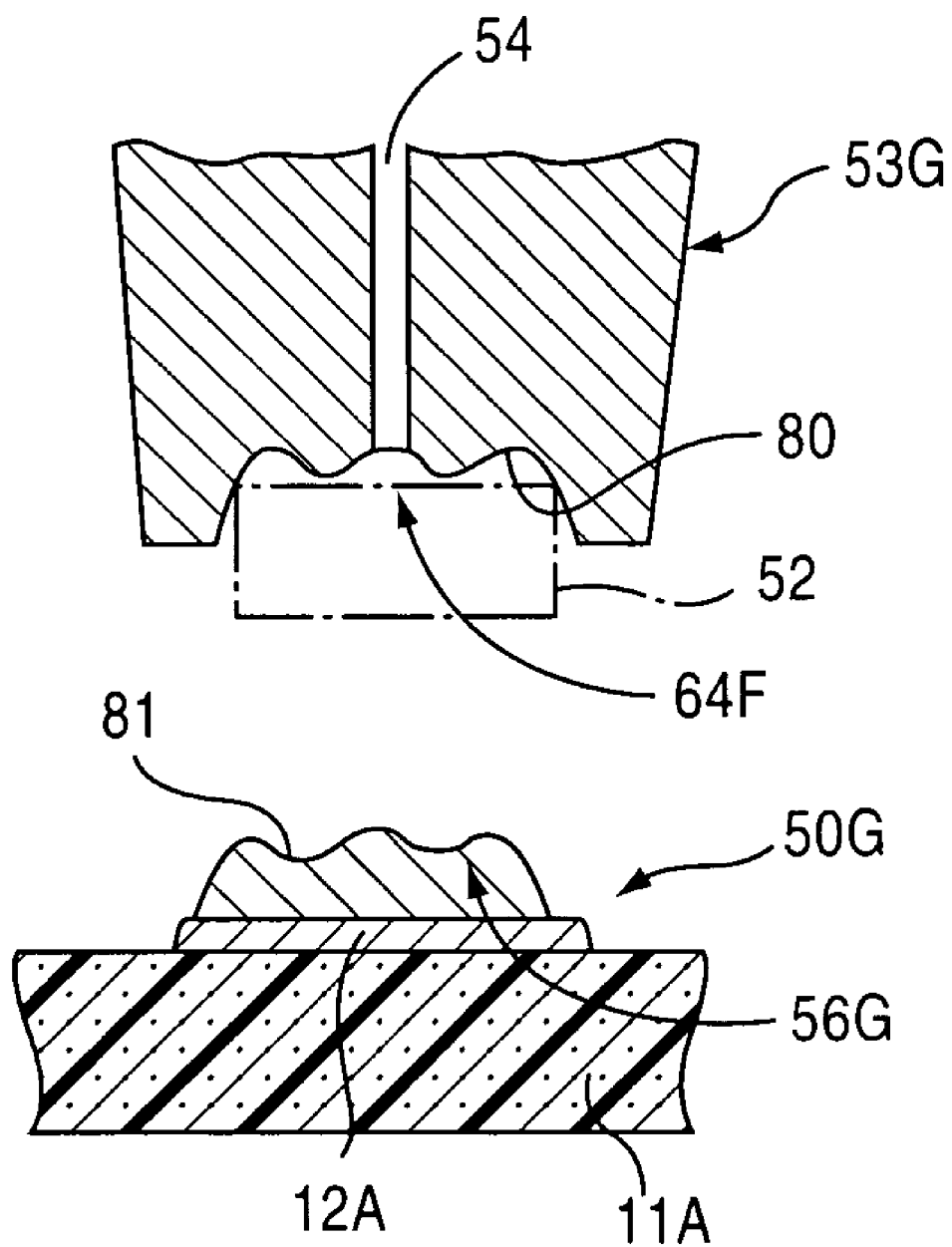
FIG. 24 is a diagram for explaining a twenty-third embodiment of the integrated circuit contactor of the present invention and a production method thereof.

FIG. 24 shows a twenty-third embodiment of the integrated circuit contactor of the present invention and a production method thereof.

As shown in FIG. 24, a bonding head 53G in the present embodiment includes the vacuum passage 54, a cavity 64F, and a wavy surface forming portion 80. The wavy surface forming portion 80 is placed into contact with one of a plurality of blocks 52 on the pads 12A when forming the corresponding piece into a predetermined shape. In the resulting contactor 50G, each of a plurality of contacts 56G has a top surface 81 which is formed into a wavy surface by the wavy surface forming portion 80. The wavy surface forming portion 80 is provided at a bottom position of the bonding head 53G. The wavy surface forming portion 80 is used to compress the block 52 against the base 11A when forming the block 52 into the predetermined shape.

The bonding head 53G in the embodiment of FIG. 24 is provided with a heater (not shown) and an ultrasonic vibration source (not shown). The heater supplies a thermal energy to soften the block 52 when forming the block 52 into the contact 56G. The ultrasonic vibration source acts to ultrasonically vibrate the block 52 via the bonding head 53G when forming the block 52 into the contact 56G.

In the contactor 50G of the present embodiment, the plurality of contacts 56G have the respective top surfaces 81 which are formed into the wavy surfaces by using the bonding head 53G. When the terminals of the LSI device 40 are connected to the contacts 56G of the contactor 50G, it is possible to assure good reliability of electric connections between the LSI device terminals and the contacts 56G because of the wavy top surfaces 81.

Figure 25A:
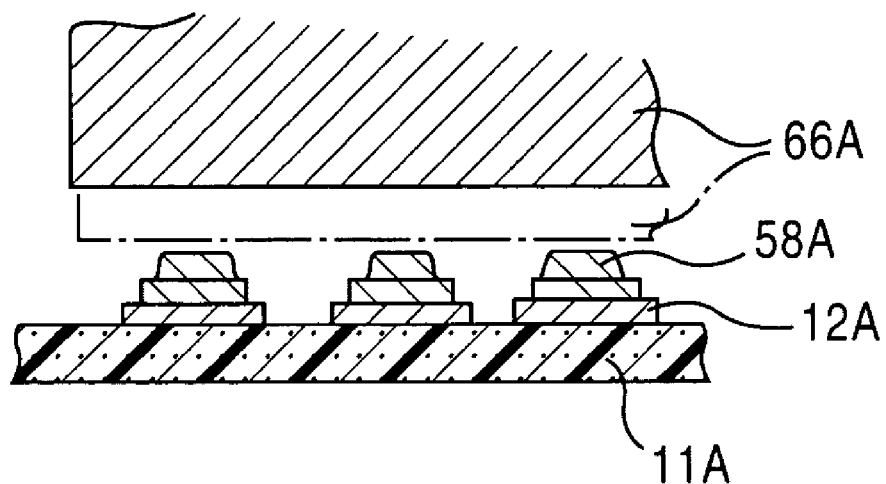
FIG. 25A and FIG. 25B are diagrams for explaining a production method of the integrated circuit contactor of the present invention.
Figure 25B:
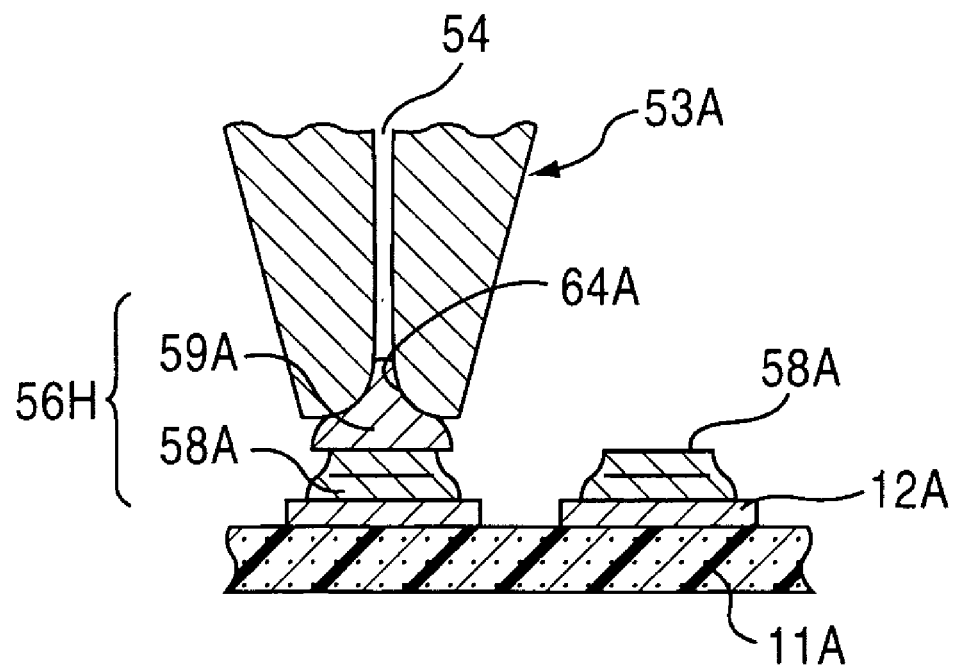

FIG. 25A and FIG. 25B show a production method of the integrated circuit contactor of the present invention.

As shown in FIG. 25A, an integrated circuit contactor in which a plurality of first pieces 58A are bonded to the pads 12A on the base 11A is prepared. A leveling tool 66A has a flat bottom surface, and the bottom surface of the leveling tool 66A is placed in contact with the first pieces 58A on the pads 12A. By using the leveling tool 66A, the first pieces 58A on the base 11A have respective top surfaces which are leveled with each other. After the first pieces 58A are formed, the leveling tool 66A is lifted and dislocated.

As shown in FIG. 25B, the bonding head 53A in which the vacuum passage 54 extends along the central axis of the bonding head 53A is transported so that the bonding head 53A is positioned above a center of one of the first pieces 58A on the base 11A. The vacuum passage 54 is connected with a vacuum pump (not shown). A second piece 59A of the conductive material is held at the leading edge of the bonding head 53A by subjecting the vacuum passage 54 to suction. The bonding head 53A is lowered to the first piece 58A, and the thermosonic bonding is performed with the bonding head 53A so that the second piece 59A at the leading edge of the bonding head 53A is bonded to the first piece 58A. In the thermosonic bonding, the second piece 59A is compressed while the bonding head 53A is ultrasonically vibrated.

After the second piece 59A bonded to the first piece 58A is formed through the thermosonic bonding, the bonding head 53A is lifted so as to form a contact 56H bonded to the pad 12A. The contact 56H has a projecting edge 64A with a roughness produced by the bonding and forming of the second piece 59A. The above procedure is repeated with respect to each of the plurality of pads 12A on the base 11A, and a plurality of contacts 56H bonded to the pads 12A are produced. Each of the contacts 56H has a projecting edge with a roughness produced by the bonding and forming of the second piece 59A.

As described above, according to the production method of the contactor of the present embodiment, the contactor having the contacts 56H can be produced by utilizing existing wire bonding equipment. Hence, it is possible to achieve an increased productivity of the integrated circuit contactor with low cost.

According to the production method of the contactor of the present embodiment, the first pieces 58A on the base 11A have the respective top surfaces leveled with each other by using the leveling tool 66A, and the second pieces 59A are bonded to the first pieces 58A by using the bonding head 53A, so as to form the plurality of contacts 56H bonded to the pads 12A on the base 11A. Each of the plurality of contacts 56H is constituted by the two pieces 58A and 59A of the same conductive material which are laminated together. As the bonding strength of the second pieces 59A to the first pieces 58A can be increased by the production method of the present embodiment, this makes it possible to increase the mechanical strength of the contacts 56H in the integrated circuit contactor. Hence, it is possible to assure good reliability of electric connections between the terminals of the LSI device 40 and the contacts 56H.

In the present embodiment, each of the contacts 56H is constituted by the two pieces 58A and 59A of the same conductive material. However, the contactor of the present invention is not limited to this embodiment, and each of the contacts 56H may be constituted by three or more pieces of the same conductive material.

Figure 26:
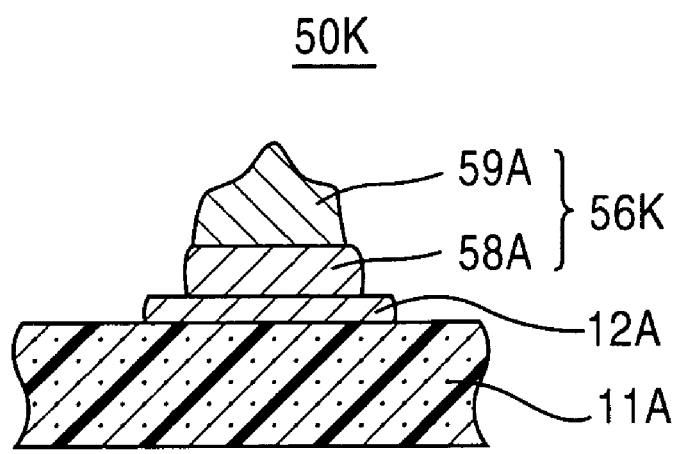
FIG. 26 is a diagram for explaining a twenty-fourth embodiment of the integrated circuit contactor of the present invention.

FIG. 26 shows a twenty-fourth embodiment of the integrated circuit contactor of the present invention.

FIG. 26 shows a configuration of a contactor 50K which is produced by the production method of the embodiment of FIG. 25A and FIG. 25B. As shown in FIG. 26, the contactor 50K includes the base 11A, the plurality of pads 12A bonded to the base 11A, and a plurality of contacts 56K bonded to the pads 12A respectively. Each of the contacts 56K is constituted by the two pieces 58A and 59A of the same conductive material.

Figure 27:
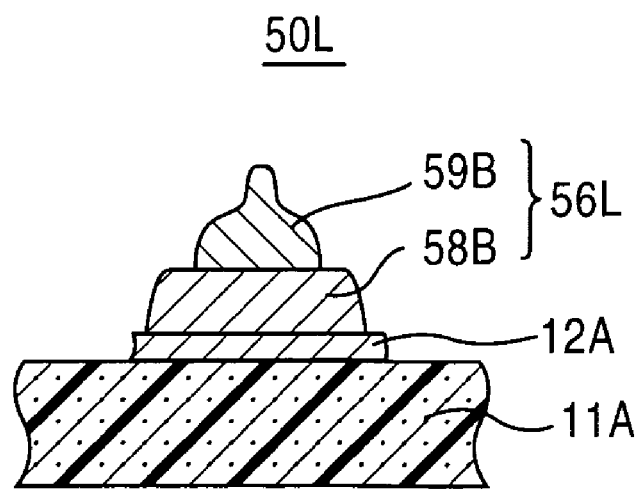
FIG. 27 is a diagram for explaining a twenty-fifth embodiment of the integrated circuit contactor of the present invention.

FIG. 27 shows a twenty-fifth embodiment of the integrated circuit contactor of the present invention.

As shown in FIG. 27, the integrated circuit contactor 50L of the present embodiment includes the base 11A, the plurality of pads 12A bonded to the base 11A, and a plurality of contacts 56L bonded to the pads 12A respectively. In the present embodiment, each of the contacts 56L is constituted by two pieces of different conductive materials which are laminated together. In FIG. 27, only a single pad 12A and a single contact 56L are shown for the sake of simplicity of description. The contact 56L is constituted by a first piece 58B and a second piece 59B which are of different conductive materials and laminated together. For example, the first piece 58B is made of gold (Au) and the second piece 59B is made of palladium (Pd). In order to prevent damaging of the contacts 56L of the contactor 50L by the terminals of the LSI device, it is desirable that a hardness of the conductive material of the first piece 58B, which is at a lower position, is smaller than a hardness of the conductive material of the second piece 59B, which is at an upper position.

The production method of the contactor 50L in the present embodiment is essentially the same as the production method of the embodiment of FIG. 25A and FIG. 25B. The contactor 50L having the contacts 56L can be produced by utilizing existing wire bonding equipment. Hence, it is possible to achieve an increased productivity of the integrated circuit contactor with low cost.

According to the production method of the contactor 50L of the present embodiment, the size and height of the contacts 56L being produced, the diameter of the pieces 58B and 59B being used, and the bonding conditions (including the bonding pressure being exerted on the pad 12A, the heating temperature, and the ultrasonic energy input) may be controlled so as to form a desired shape of the contacts 56L and suit the requirement of the LSI device.

According to the production method of the contactor 50L of the present embodiment, the height of the contacts 56L can be varied by changing the number of the pieces laminated together. Even when there are variations of the height of the contacts 56L and the LSI device terminals, they may be absorbed by the elastic deformation of the base 11A. Hence, it is possible to assure good reliability of electric connections between the terminals of the LSI device and the contacts 56L.

In the present embodiment, each of the contacts 56L is constituted by the two pieces 58B and 59B of different conductive materials. However, the contactor of the present invention is not limited to this embodiment, and each of the contacts 56L may be constituted by three or more pieces of different conductive materials.

Figure 28A:
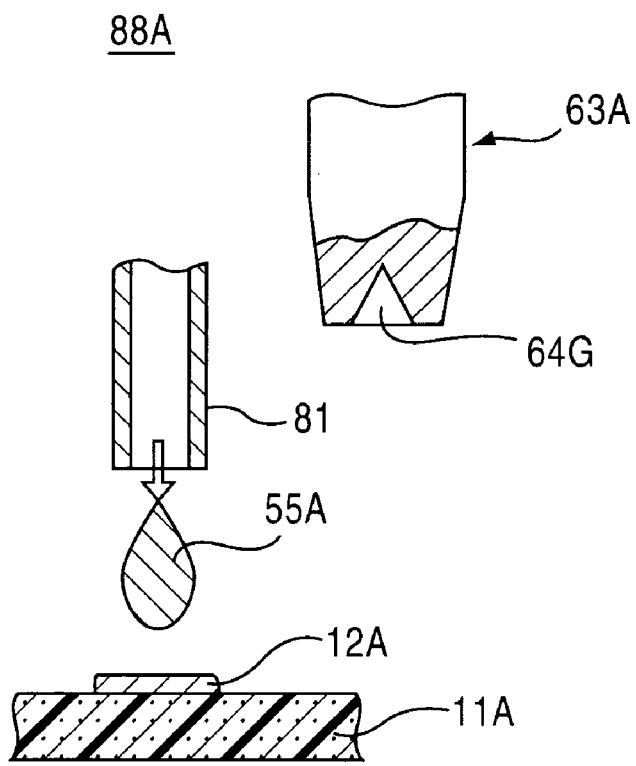
FIG. 28A and FIG. 28B are diagrams for explaining a twenty-sixth embodiment of the integrated circuit contactor of the present invention and a production apparatus thereof.
Figure 28B:
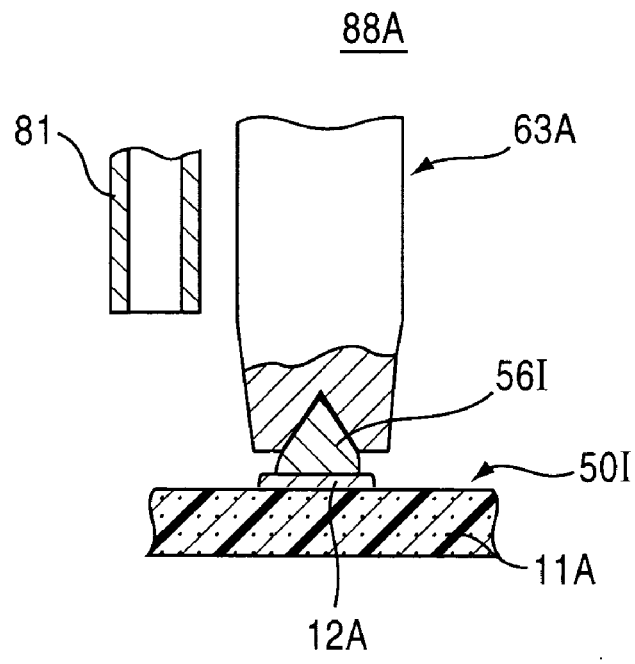

FIG. 28A and FIG. 28B show a twenty-sixth embodiment of the integrated circuit contactor of the present invention, and a production apparatus thereof.

As shown in FIG. 28A and FIG. 28B, a production apparatus 88A of the present embodiment generally has a dispenser 81 and a forming tool 63A. The dispenser 81 acts to dispense a molten drop 55A of a conductive material to one of the plurality of pads 12A on the base 11A. The forming tool 63A acts to form the drop 55A of the conductive material on the pad 12A into a contact 56I. By repeating this procedure, a plurality of contacts 56I of the conductive material bonded to the plurality of pads 12A are produced, each contact 56I having a projecting edge with a roughness produced by the forming of the drop. In FIG. 28A and FIG. 28B, only a single pad 12A, a single contact 56I and a single drop 55A are shown for the sake of simplicity of description.

The dispenser 81 is connected with a melting device for melting the conductive material and a supplying device for supplying the conductive material. A certain amount of the conductive material in a molten condition is supplied from the supplying device to the dispenser 81. The dispenser 81 converts the amount of the molten conductive material into the molten drop 55A and dispenses it to one of the plurality of pads 12A on the base 11A. The dispenser 81 is attached to a moving device, and the moving device moves the dispenser 81 so that the dispenser 81 is positioned to one of the plurality of pads 12A on the base 11A.

The forming tool 63A includes a cavity 64G, and the cavity 64G is formed in the shape of a cone. The cavity 64G of the forming tool 63A is used to form the molten drop 55A on the pad 12A into the contact 56I when the forming tool 63A is lowered to compress the molten drop 55A. The cavity 64G does not touch neighboring ones of the pads 12A on the base 11A when forming the molten drop 55A into the contact 56I. The plurality of contacts 56I are sequentially produced one by one by using the forming tool 63A.

A production method of producing the integrated circuit contactor 50I of the present embodiment by using the production apparatus 88A will now be explained. As shown in FIG. 28A, the dispenser 81 is moved so that the dispenser 81 is positioned to one of the pads 12A on the base 11A. The dispenser 81 dispenses the molten drop 55A of the conductive material to one of the plurality of pads 12A on the base 11A. The drop 55A is electrically connected to the pad 12A.

As shown in FIG. 28B, the dispenser 81 is moved and separated from the pad 12A. The forming tool 63A is moved so that the forming tool 63A is positioned to the drop 55A on the pad 12A. The forming tool 63A is lowered to form the drop 55A of the conductive material on the pad 12A into the contact 56I. The above procedure is repeated with respect to each of the plurality of pads 12A on the base 11A, so that the plurality of contacts 56I bonded to the plurality of pads 12A are produced. Each of the contacts 56I has a projecting edge with a roughness produced by the forming of the drop 55A by the forming tool 63A.

In the production apparatus 88A of the present embodiment and the production method of the contactor 50I, the molten drop 55A of the conductive material is dispensed to one of the pads 12A on the base 11A by the dispenser 81. It is not necessary to form a piece of the conductive material into a bump as in the embodiments of FIG. 16A through FIG. 23, and it is possible to achieve an increased productivity of the contactor with low cost. The production apparatus 88A of the present embodiment does not require a holding device which holds the piece of the conductive material, nor a heater which supplies a thermal energy to soften the piece when forming the piece into the contact. The production apparatus 88A of the present embodiment can be simply and easily constructed. Hence, the production apparatus 88A of the present embodiment can achieve an increased productivity of the contactor with low cost.

In the present embodiment, the conductive material of the contacts 56I may be gold (Au), palladium (Pd), a solder alloy, or an alloy containing, as a major constituent of the alloy, any of gold (Au), palladium (Pd) and a solder alloy.

Figure 29:
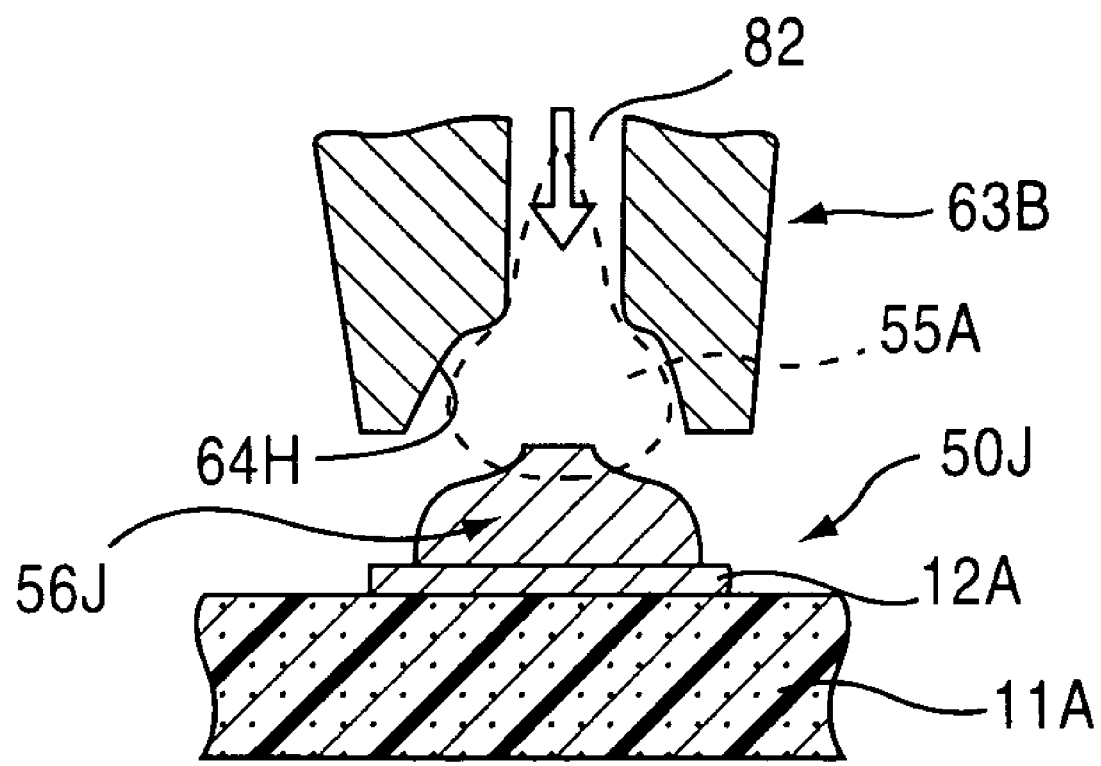
FIG. 29 is a diagram for explaining a production method of the integrated circuit contactor of the present invention and a production apparatus thereof.

FIG. 29 shows a production method of the integrated circuit contactor of the present invention, and a production apparatus thereof.

In the embodiment of FIG. 28A and FIG. 28B, the production apparatus 88A includes the dispenser 81 and the forming tool 63 which are separately provided. As shown in FIG. 29, a production apparatus 88B of the present embodiment includes only a forming tool 63B which incorporates a dispenser therein.

The forming tool 63B includes a dispensing passage 82 extending along a central axis of the forming tool 63B. The dispensing passage 82 acts to dispense a molten drop 55A of a conductive material to one of the plurality of pads 12A on the base 11A. The forming tool 63B further includes a cavity 64H merging with an end of the dispensing passage 82. The cavity 64H acts to form the drop 55A of the conductive material on the pad 12A into a contact 56J. By repeating this procedure, a plurality of contacts 56I of the conductive material bonded to the plurality of pads 12A are produced, each contact 56J having a projecting edge with a roughness produced by the forming of the drop. In FIG. 29, only a single pad 12A, a single contact 56J and a single drop 55A are shown for the sake of simplicity of description.

In the production apparatus 88B of the present embodiment and the production method of the contactor 50J, the dispensing of the molten drop 55A of the conductive material to one of the pads 12A and the forming of the drop 55A into the contact 56J are performed by using the forming tool 63B only. Hence, it is possible to achieve a further increased productivity of the contactor with low cost.

The production apparatus 88B of the present embodiment does not require a holding device which holds the piece of the conductive material, nor a heater which supplies a thermal energy to soften the piece when forming the piece into the contact. The production apparatus 88B of the present embodiment can be simply and easily constructed. Hence, the production apparatus 88B of the present embodiment can achieve an increased productivity of the contactor with low cost.

Figure 30:
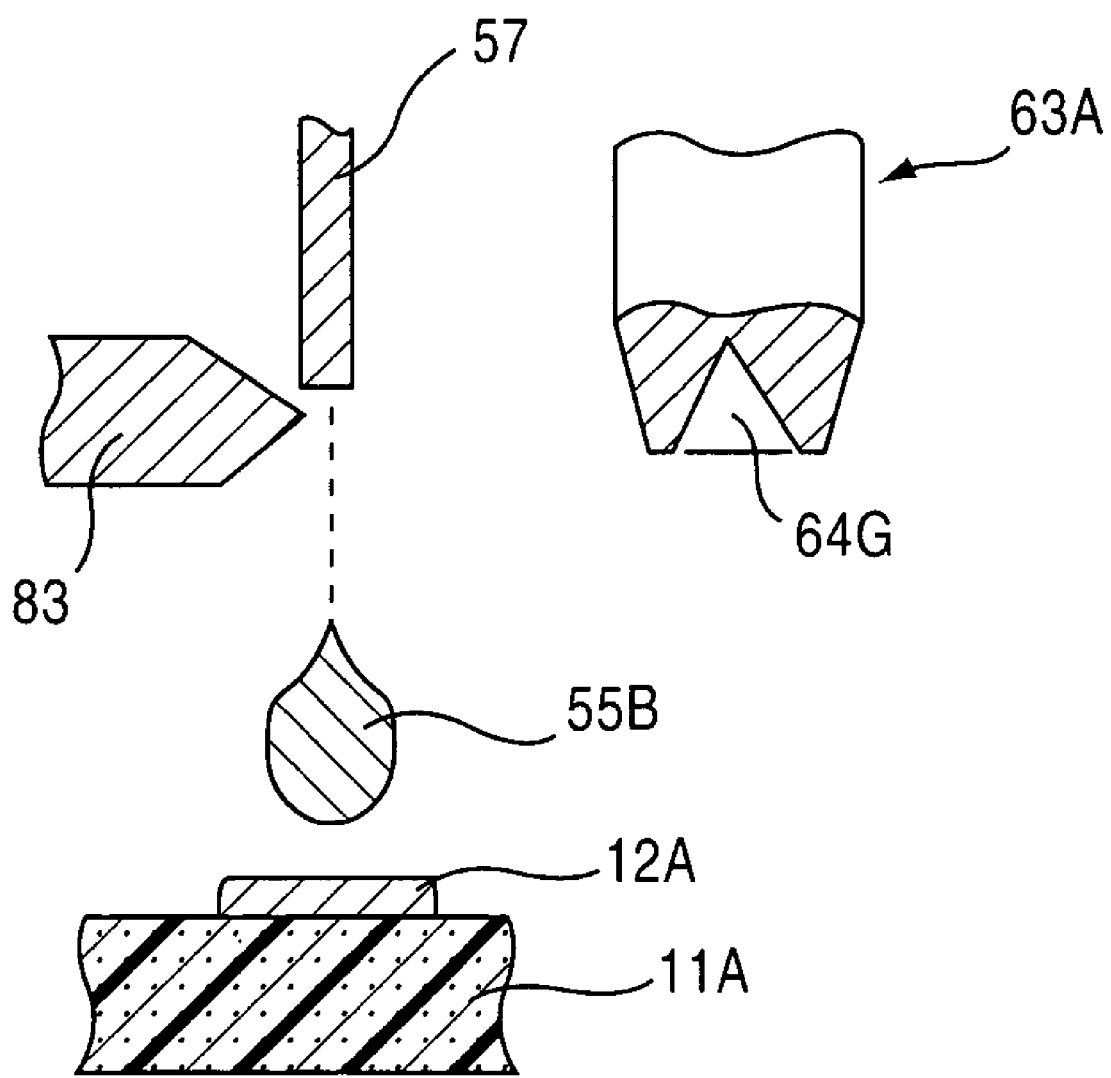
FIG. 30 is a diagram for explaining a production method of the integrated circuit contactor of the present invention and a production apparatus thereof.

FIG. 30 shows a production method of the integrated circuit contactor of the present invention, and a production apparatus thereof. In FIG. 30, the elements which are essentially the same as corresponding elements in FIG. 28A and FIG. 28B are designated by the same reference numerals, and a description thereof will be omitted.

As shown in FIG. 30, a production apparatus 88C of the present embodiment generally has a dispenser and the forming tool 63A. The dispenser includes a wire 57 of a conductive material, and a welding torch 83. The welding torch 83 heats the wire 57 of the conductive material to a temperature above a melting point of the conductive material so as to produce a molten drop 55B. The drop 55B is dispensed to one of the plurality of pads 12A on the base 11A. The forming tool 63A, which is the same as the forming tool 63A of FIG. 28B, acts to form the drop 55B of the conductive material on the pad 12A into a contact. By repeating this procedure, a plurality of contacts of the conductive material bonded to the plurality of pads 12A are produced, each contact having a projecting edge with a roughness produced by the forming of the drop. In FIG. 30, only a single pad 12A and a single drop 55B are shown for the sake of simplicity of description.

In the present embodiment, the conductive material of the wire 57 may be gold (Au), palladium (Pd), platinum (Pt), nickel (Ni), rhodium (Rh), a solder alloy, or an alloy containing, as a major constituent of the alloy, any of gold (Au), palladium (Pd), platinum (Pt) and rhodium (Rh). The welding torch 83 may be replaced by a spark rod or a heating head.

In the production apparatus 88C of the present embodiment and the production method of the contactor, the molten drop 55B of the conductive material is dispensed to one of the pads 12A on the base 11A. It is not necessary to form a piece of the conductive material into a bump as in the embodiments of FIG. 16A through FIG. 23, and it is possible to achieve an increased productivity of the contactor with low cost. The production apparatus 88C of the present embodiment does not require a holding device which holds the piece of the conductive material, nor a heater which supplies a thermal energy to soften the piece when forming the piece into the contact. The production apparatus 88C of the present embodiment can be simply and easily constructed. Hence, the production apparatus 88C of the present embodiment can achieve an increased productivity of the contactor with low cost.

In the previous embodiments of FIG. 16A through FIG. 24, the bonding heads 53A through 53G have the forming function to form the piece into the predetermined shape of the contact. However, according to the present invention, the forming tool of the production apparatus 88A, 88B or 88C in the embodiments of FIG. 28A through FIG. 30 may be adapted to have the forming function of such bonding heads and used in the embodiments of FIG. 16A through FIG. 24. A description will be now be given of such variations and modifications of the production apparatus of the present invention, and embodiments of the integrated circuit contactor of the present invention produced by such production apparatus, with reference to FIG. 31A through FIG. 38.

Figure 31A:
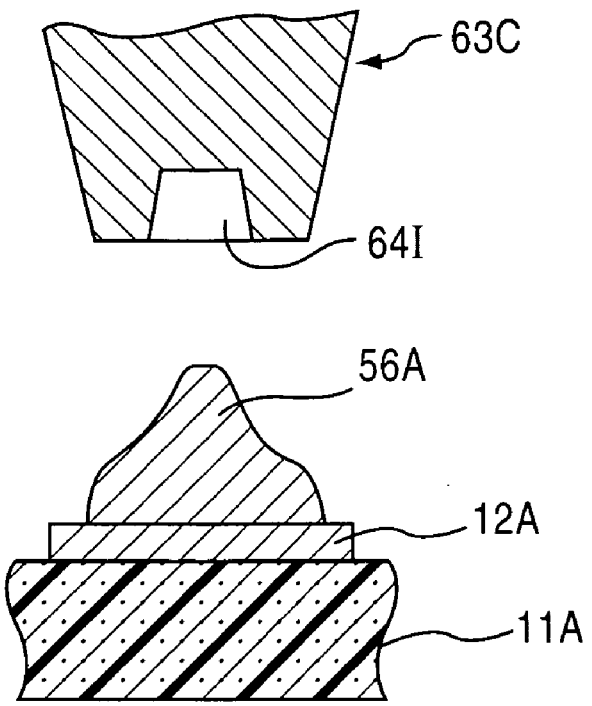
FIG. 31A and FIG. 31B are diagrams for explaining a twenty-seventh embodiment of the integrated circuit contactor of the present invention and a production method thereof.
Figure 31B:
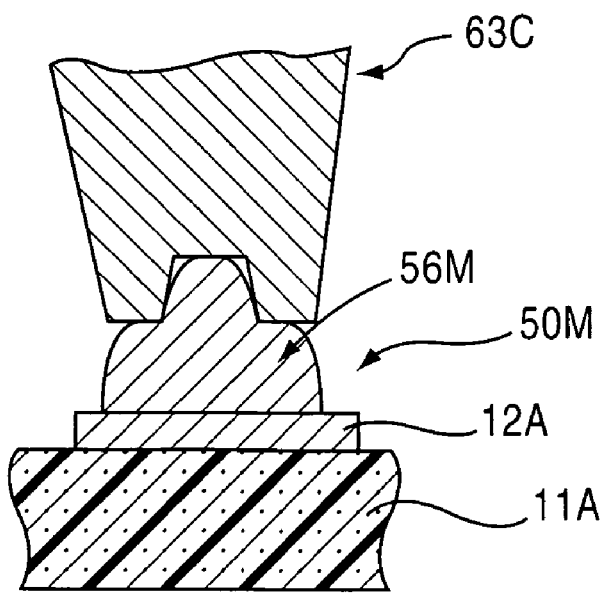

FIG. 31A and FIG. 31B show a twenty-seventh embodiment of the integrated circuit contactor of the present invention and a production method thereof.

As shown in FIG. 31A and FIG. 31B, a forming tool 63C of the present embodiment has a recessed cavity 64I. The recessed cavity 64I is formed in the shape of a truncated cone. The recessed cavity 64I is used to form one of the intermediate contacts 56A (which is similar to the contact 56A of FIG. 16C) on the pads 12A of the intermediate contactor into a contact 56M. In the resulting contactor 50M, the contact 56M has a projecting edge with a roughness produced by the forming of the intermediate contact 56A by the forming tool 63C. The recessed cavity 64I does not touch neighboring ones of the pads 12A on the base 11A when forming the intermediate contact 56A into the contact 56M. The plurality of contacts 56M are sequentially produced one by one by using the forming tool 63C. The contactor 50M of the present embodiment is effective in providing good reliability of electric connections between the LSI device terminals and the contacts 56M of the contactor 50M. The use of the forming tool 63C allows the forming of each of the plurality of contacts 56M into the predetermined shape with good accuracy. Variations of the shape or height of the plurality of contacts 56M on the contactor 50M can be eliminated by the use of the forming tool 63C.

Figure 32:
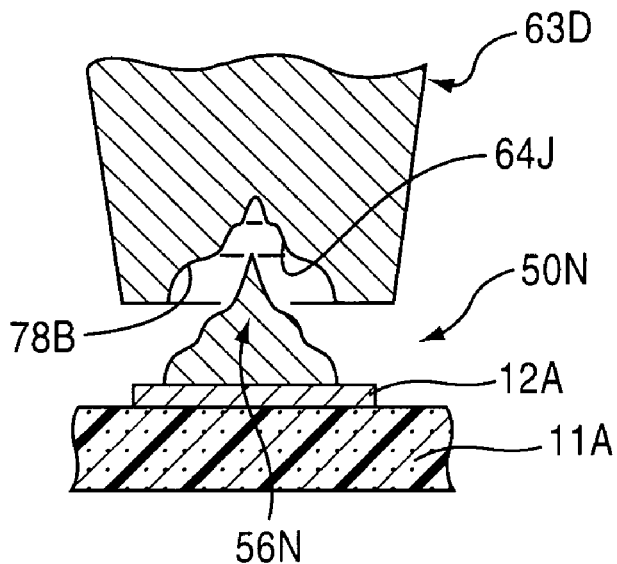
FIG. 32 is a diagram for explaining a twenty-eighth embodiment of the integrated circuit contactor of the present invention and a production method thereof.

FIG. 32 shows a twenty-eighth embodiment of the integrated circuit contactor of the present invention and a production method thereof.

As shown in FIG. 32, a forming tool 63D of the present embodiment has a recessed cavity 64J. The cavity 64J is formed to have a stepped central portion and a pressing peripheral portion 78B. The cavity 64J is used to form one of the intermediate contacts (which may be either the contact 56A of FIG. 16C or the molten drop 55A of FIG. 28A) on the pads 12A of the intermediate contactor into a contact 56N. The pressing peripheral portion 78B is used to compress a periphery of the intermediate contactor around the center thereof against the base 11A when forming the intermediate contact into a predetermined shape of the contact 56N. In the resulting contactor 50N, the contact 56N has a projecting edge with a roughness produced by the forming of the intermediate contact by the forming tool 63D. The use of the pressing peripheral portion 78B and the stepped central portion in the forming tool 63D allows an increase of the stiffness of the contact 56N and an increase of the contact pressure for the LSI device terminals. The cavity 64J does not touch neighboring ones of the pads 12A on the base 11A when forming the intermediate contact into the contact 56N. The plurality of contacts 56N are sequentially produced one by one by using the forming tool 63D.

The contactor 50N of the present embodiment is effective in providing good reliability of electric connections between the LSI device terminals and the contacts 56N of the contactor 50N. The use of the forming tool 63D allows the forming of each of the plurality of contacts 56N into the predetermined shape with good accuracy. Variations of the shape or height of the plurality of contacts 56N on the contactor 50N can be eliminated by the use of the forming tool 63D.

Figure 33:
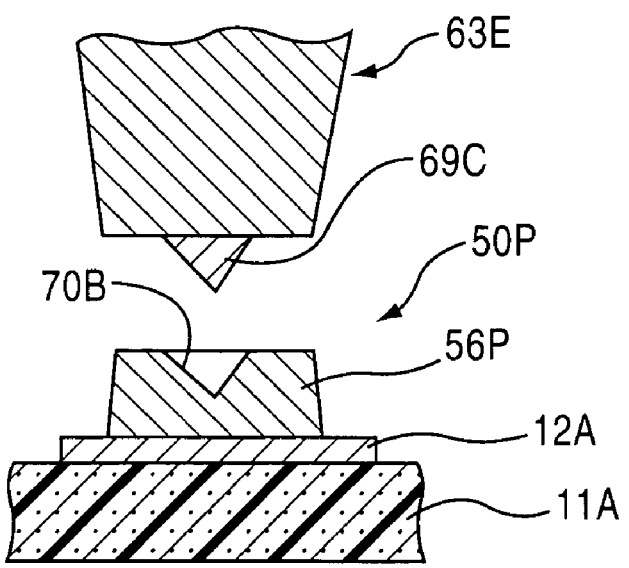
FIG. 33 is a diagram for explaining a twenty-ninth embodiment of the integrated circuit contactor of the present invention and a production method thereof.

FIG. 33 shows a twenty-ninth embodiment of the integrated circuit contactor of the present invention and a production method thereof.

As shown in FIG. 33, a forming tool 63E of the present embodiment has a raised conical portion 69C at a bottom position of the forming tool 63E. The raised conical portion 69C acts to form one of the intermediate contacts (which may be either the contact 56A of FIG. 16C or the molten drop 55A of FIG. 28A) on the pads 12A of the intermediate contactor into a contact 56P. In the resulting contactor 50P, the contact 56P has a recessed conical portion 70B in the center of the contact 56P, and the portion 70B has a roughness produced by the forming of the intermediate contact by the forming tool 63E. The forming tool 63E does not touch neighboring ones of the pads 12A on the base 11A when forming the intermediate contact into the contact 56P. The plurality of contacts 56P are sequentially produced one by one by using the forming tool 63E. The contactor 50P of the present embodiment is effective in providing good reliability of electric connections between the LSI device ball bumps and the contacts 56P of the contactor 50P.

Figure 34:
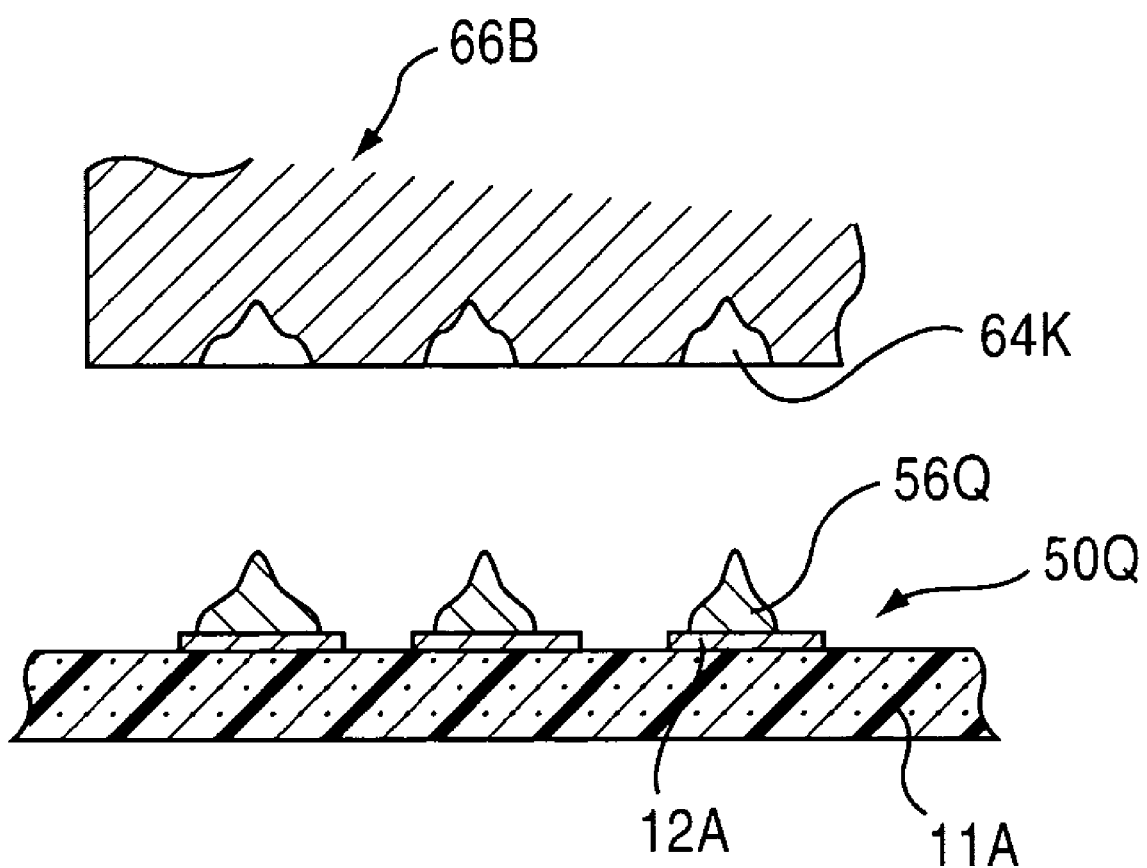
FIG. 34 is a diagram for explaining a production method of the integrated circuit contactor of the present invention.

FIG. 34 shows a production method of the integrated circuit contactor of the present invention.

As shown in FIG. 34, a leveling tool 66B having a plurality of equal cavities 64K on its bottom surface is used in the production method of the present embodiment. The leveling tool 66B is placed in contact with the intermediate contacts (which may be either the contact 56A of FIG. 16C or the molten drop 55A of FIG. 28A) on the pads 12A of the intermediate contactor. The plurality of equal cavities 64K act to form the intermediate contacts on the pads 12A of the intermediate contactor into a plurality of contacts 56Q. In the resulting contactor 50Q, the contacts 56Q have the predetermined shape of each cavity 64K of the forming tool 66B, each contact 56Q having a projecting edge with a roughness produced by the forming of the intermediate contacts by the forming tool 66B.

The contactor 50Q of the present embodiment is effective in providing good reliability of electric connections between the LSI device ball bumps and the contacts 56Q of the contactor 50Q. Further, according to the production method of the contactor 50Q of the present embodiment, the plurality of contacts 56Q are formed by one operation of the leveling tool 66B so that the plurality of contacts 56Q have the respective top surfaces leveled with each other and the same configuration with good accuracy. Hence, the production method of the present embodiment is effective in achieving an increased productivity of the integrated circuit contactor with low cost.

The shape and height of the contacts 56Q produced according to the production method of the present embodiment can be held with good accuracy. In addition, the production method of the present embodiment can speedily produce the contactor 50Q having the contacts 56Q.

Figure 35A:
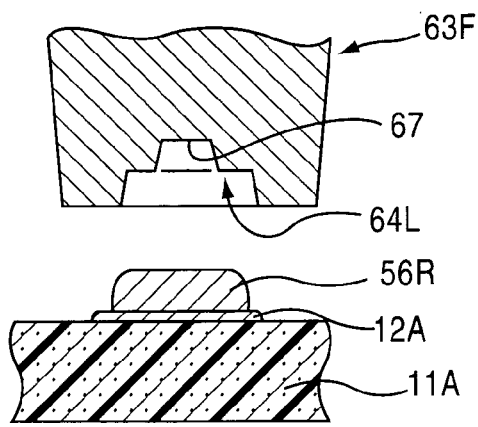
FIG. 35A, FIG. 35B and FIG. 35C are diagrams for explaining a thirtieth embodiment of the integrated circuit contactor of the present invention and a production method thereof.
Figure 35B:
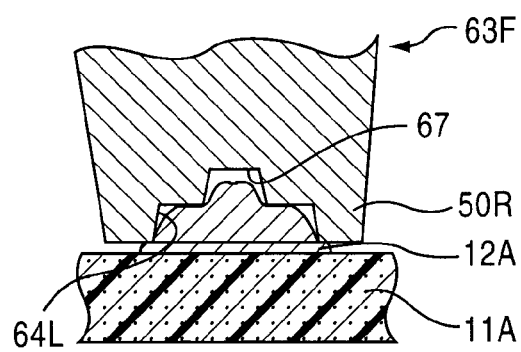
Figure 35C:
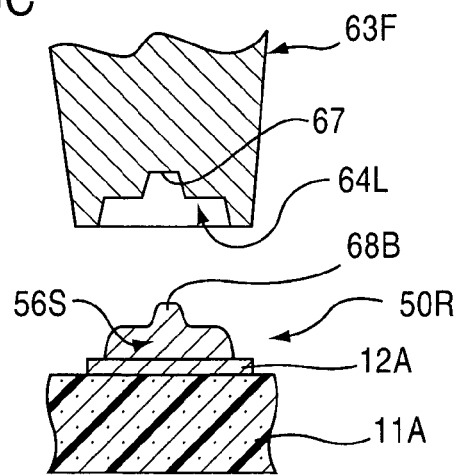

FIG. 35A, FIG. 35B and FIG. 35C show a thirtieth embodiment of the integrated circuit contactor of the present invention and a production method thereof.

As shown in FIG. 35A, in an integrated circuit contactor which is repeatedly used with LSI devices over an extended period of time, the plurality of contacts bonded to the pads 12A on the base 11A are rounded (such contactor will be called the used contactor). The projecting edges of the contacts in the original contactor are removed from the used contactor due to wear of the contacts with the LSI device terminals. The used contactor of FIG. 35A does not provide reliability of electric connections between the LSI device terminals and the contacts 56R.

In the production method of the contactor 50R of the present embodiment, the rounded contacts 56R of the used contactor of FIG. 35A are formed into a plurality of contacts 56S, each having a projecting edge 68B with a roughness produced by the forming, as in the contactor 50R of FIG. 35C. It is possible for the production method of the present embodiment to increase the operating life of the contactor 50R.

As shown in FIG. 35A, a forming tool 63F is placed above a center of a corresponding one of the rounded contacts 56R on the used contactor. The forming tool 63F includes a cavity 64L and a recess 67 in the middle of the cavity 64L. The cavity 64L and the recess 67 are used to form the corresponding rounded contact 56R on the base 11A into a contact 56S having a predetermined shape. When the forming tool 63F is lowered, the cavity 64L and the recess 67 act to form the rounded contact 56R into the contact 56S.

As shown in FIG. 35B, the forming tool 63F is lowered to the rounded contact 56R so as to form the contact 56S on the pad 12A.

As shown in FIG. 35C, the forming tool 63F is lifted from the contact 56S. The rounded contact 56R is formed into the predetermined shape of the contact 56S by the cavity 64L and the recess 67 of the forming tool 63F. The resulting contact 56S has the projecting edge 68B with a roughness produced by the forming of the contact 56S by the forming tool 63F. The above procedure is repeated with respect to each of the plurality of pads 12A on the base 11A, and a plurality of contacts 56S on the pads 12A in the contactor 50R are produced. It is possible for the production method of the present embodiment to increase the operating life of the contactor 50R.

The forming tool 63F in the present embodiment is provided with a heater (not shown) and an ultrasonic vibration source (not shown). The heater supplies a thermal energy to soften the rounded contact 56R when forming the rounded contact 56R into the contact 56S. The ultrasonic vibration source acts to ultrasonically vibrate the rounded contact 56R via the forming tool 63F when forming the rounded contact 56R into the contact 56S.

The forming tool 63F in the present embodiment has, as shown in FIG. 35A, the cavity 64L and the recess 67, and the cavity 64L and the recess 67 are used to form one of the rounded contacts 56R into the predetermined shape of the contact 56S, the forming tool 63F not touching neighboring ones of the rounded contacts 56R when forming the corresponding rounded contact 56R into the contact 56S. The plurality of contacts 56S are sequentially produced one by one by using the forming tool 63F.

Figure 36:
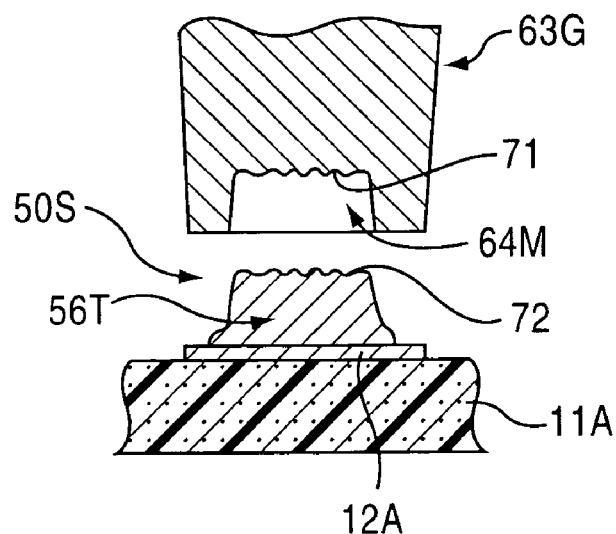
FIG. 36 is a diagram for explaining a thirty-first embodiment of the integrated circuit contactor of the present invention and a production method thereof.

FIG. 36 shows a thirty-first embodiment of the integrated circuit contactor of the present invention and a production method thereof.

In the embodiment of FIG. 36, a forming tool 63G includes a cavity 64M and a coarse-surface forming portion 71. The coarse-surface forming portion 71 is placed into contact with one of the plurality of contacts (which may be either the contact 56A of FIG. 16C or the molten drop 55A of FIG. 28A) on the base 11A of the intermediate contactor when forming the corresponding contact into a predetermined shape. In the resulting contactor 50S, each of a plurality of contacts 56T on the pads 12A has a top surface 72 which is made coarse by the coarse-surface forming portion 71. The coarse-surface forming portion 71 is provided at a bottom position of the forming tool 63G. The coarse-surface forming portion 71 is used to compress the corresponding contact against the base 11A of the intermediate contactor when forming the corresponding contact into the predetermined shape.

The forming tool 63G in the embodiment of FIG. 36 is provided with a heater (not shown) and an ultrasonic vibration source (not shown). The heater supplies a thermal energy to soften the bump when forming the intermediate contact into the contact 56T. The ultrasonic vibration source acts to ultrasonically vibrate the bump via the forming tool 63G when forming the bump into the contact 56T. The use of the forming tool 63G allows the forming of each of the plurality of contacts on the intermediate contactor into the predetermined shape with good accuracy. Variations of the shape of the plurality of contacts on the contactor can be eliminated by the use of the forming tool 63G.

In the contactor 50S of the present embodiment, the plurality of contacts 56T have the respective top surfaces 72 which are made coarse by using the forming tool 63G. When the terminals of the LSI device 40 are connected to the contacts 56T of the contactor 50S, it is possible to assure good reliability of electric connections between the LSI device terminals and the contacts 56T because of the. coarse surfaces 72.

Figure 37:
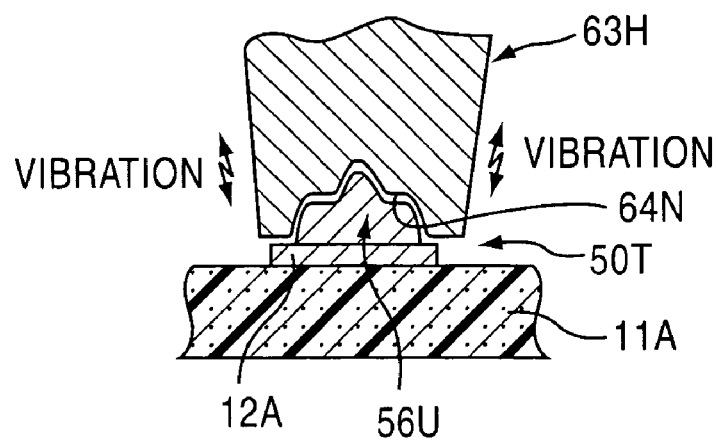
FIG. 37 is a diagram for explaining a thirty-second embodiment of the integrated circuit contactor of the present invention and a production method thereof.

FIG. 37 shows a thirty-second embodiment of the integrated circuit contactor of the present invention and a production method thereof.

In the production method of the embodiment of FIG. 37, after or during the step of forming the plurality of intermediate contacts (which may be either the contact 56A of FIG. 16C or the molten drop 55A of FIG. 28A) into a plurality of contacts on the pads 12A, a step of hardening a surface layer of each of the plurality of contacts is further performed by using a forming tool 63H. Each of the resulting contacts 56U is covered by the hardened surface layer.

Specifically, in the production method of the embodiment of FIG. 37, the forming tool 63H has a cavity 64N which is similar to the cavity 64L of the forming tool 63F of FIG. 35A. During the step of hardening, the forming tool 63H is ultrasonically vibrated so as to harden the surface layer of one of the plurality of contacts 56U. The contactor 50T of the present embodiment in which each contact 56U is covered by the hardened surface layer can prevent damaging of the contacts 56U by the terminals of the LSI device even when the pressure exerted on the contacts 56U of the contactor 50T by the terminals of the LSI devices is high. It is possible to assure good reliability of electric connections between the LSI device terminals and the contacts 56U because of the hardened surface layers thereof.

Figure 38:
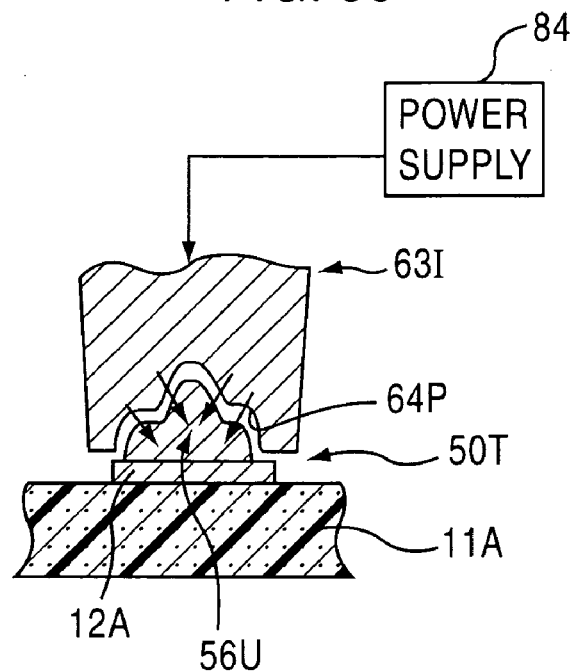
FIG. 38 is a diagram for explaining another production method of the integrated circuit contactor of FIG. 37.

FIG. 38 shows another production method of the integrated circuit contactor of FIG. 37.

In the production method of the embodiment of FIG. 38, a forming tool 63I has a cavity 64P which is similar to the cavity 64L of the forming tool 63F of FIG. 35A, and a power supply 84 which is electrically connected to the forming tool 63I. During the step of hardening, a predetermined voltage from the power supply 84 is supplied to the forming tool 63I to produce a discharge between the forming tool 63I and one of the plurality of contacts 56U. Hence, a surface layer of one of the plurality of contacts 56U is hardened by the discharge produced. The contactor 50T of the present embodiment in which each contact 56U is covered by the hardened surface layer can prevent damaging of the contacts 56U by the terminals of the LSI device even when the pressure exerted on the contacts 56U of the contactor 50T by the terminals of the LSI devices is high. It is possible to assure good reliability of electric connections between the LSI device terminals and the contacts 56U because of the hardened surface layers thereof.

Figure 39:
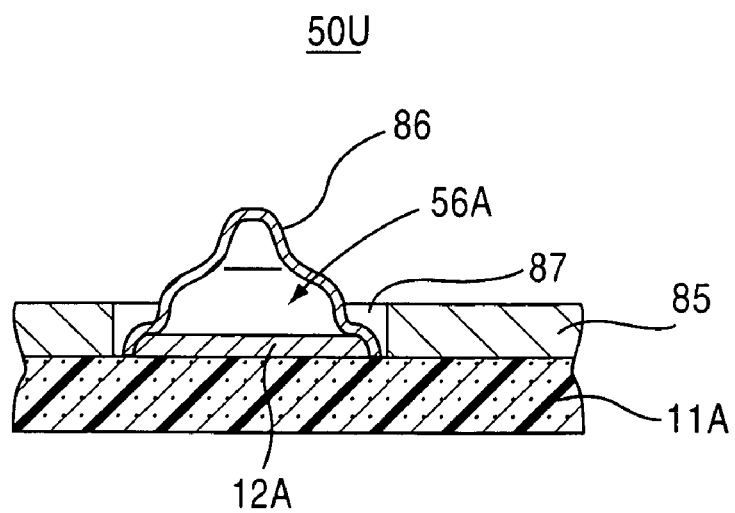
FIG. 39 is a diagram for explaining a thirty-third embodiment of the integrated circuit contactor of the present invention and a production method thereof.

FIG. 39 shows a thirty-third embodiment of the integrated circuit contactor of the present invention and a production method thereof.

In the production method of the embodiment of FIG. 39, after or during the step of forming the plurality of intermediate contacts (which may be either the contact 56A of FIG. 16C or the molten drop 55A of FIG. 28A) into a plurality of final contacts, a step of plating a surface of each of the plurality of final contacts with another conductive material is further performed. As shown in FIG. 39, in order to perform the plating, the base 11A is covered by a mask 85 at positions other than the positions of the contacts 56A on the base 11A, and openings 87 are formed at the positions of the contacts 56A. The surface of each resulting contact is covered by the plating 86 of the conductive material. The plating 86 of the conductive material (for example, gold (Au), palladium (Pd) or rhodium (Rh)) has a hardness larger than a hardness of the contacts 56A.

Alternatively, a sputtering or evaporation technique may be performed instead of the plating in the production method of the present embodiment.

According to the production method of the present embodiment, it is possible to easily and speedily produce the plated layer 86 of each of the resulting contacts in the contactor 50U. It is possible to assure good reliability of electric connections between the LSI device terminals and the contacts because of the plated layers thereof.

The present invention is not limited to the above-described embodiments, and variations and modifications may be made without departing from the scope of the present invention.

Further, the present invention is based on Japanese priority application No. 10-061,594, filed on Mar. 12, 1998, and Japanese priority application No. 10-139,040, filed on May 20, 1998, the entire contents of which are hereby incorporated by reference.

What is claimed is:

1. A method of production of an integrated circuit contactor for testing an integrated circuit having terminals, the terminals of the integrated circuit being electrically connected to the contactor only when a pressure is exerted onto the contactor by the terminals of the integrated circuit, the method comprising the steps of:

preparing a base of an insulating material on which a plurality of pads of a first conductive material are bonded at positions corresponding to positions of the terminals on the integrated circuit;

bonding a wire of a second conductive material to each of the plurality of pads, and pulling the wire apart from a corresponding one of the plurality of pads so as to form a plurality of contacts of the second conductive material bonded to the plurality of pads, respectively, each contact having a projecting edge with a roughness produced by said step of bonding and pulling of the wire; and bonding, after said step of bonding and pulling of the wire, a second wire of a third conductive material to each of the plurality of contacts, and pulling the second wire apart from a corresponding one of the plurality of contacts so as to laminate the contacts of the second conductive material by a plurality of second contacts of the third conductive material, each second contact having a projecting edge with a roughness produced by said step of bonding and pulling of the second wire.

2. A method of production of an integrated circuit contactor for testing an integrated circuit having terminals, the terminals of the integrated circuit being electrically connected to the contactor only when a pressure is exerted onto the contactor by the terminals of the integrated circuit, the method comprising the steps of:

preparing a base of an insulating material on which a plurality of pads of a first conductive material are bonded at positions corresponding to positions of the terminals on the integrated circuit;

bonding a wire of a second conductive material to each of the plurality of pads, and pulling the wire apart from a corresponding one of the plurality of pads so as to form a plurality of contacts of the second conductive material bonded to the plurality of pads, respectively, each contact having a projecting edge with a roughness produced by said step of bonding and pulling of the wire; and forming, after said step of bonding and pulling of the wire, each of the plurality of contacts into a predetermined shape by using a forming tool, the forming tool including a peripheral portion which surrounds a periphery of a corresponding contact and compresses said contact against a base of the integrated circuit contactor when the corresponding contact is formed into the predetermined shape.

3. The method according to claim 2, wherein the plurality of contacts are sequentially formed one by one by using the forming tool, the forming tool having a cavity used to form one of the plurality of contacts into the predetermined shape, the cavity of the forming tool not touching neighboring ones of the plurality of contacts when said one of the plurality of contacts is formed.

4. The method according to claim 2, wherein the forming tool is a leveling tool having a flat surface, the flat surface being placed in contact with the plurality of contacts on the plurality of pads, the plurality of contacts being formed by one operation of the leveling tool so that the plurality of contacts have respective top surfaces leveled with each other.

5. The method according to claim 2, wherein the forming tool includes a recessed cavity and a pressing peripheral portion, the recessed cavity being placed at a center of one of the plurality of contacts when forming said one of the plurality of contacts into the predetermined shape, and the pressing peripheral portion provided around the recessed cavity and used to compress a periphery of one of the plurality of contacts around the center thereof.

6. The method according to claim 2, wherein the forming tool includes a raised portion at a bottom position of the forming tool, the raised portion of the forming tool being placed into contact with one of the plurality of contacts when forming said one of the plurality of contacts into the predetermined shape.

7. The method according to claim 2, wherein the forming tool includes a coarse-surface forming portion at a bottom position of the forming tool, the coarse-surface forming portion being placed into contact with one of the plurality of contacts when forming said one of the plurality of contacts into the predetermined shape, so that the plurality of contacts have respective top surfaces that are made coarse by the coarse-surface forming portion.

8. A method of production of an integrated circuit contactor for testing an integrated circuit having terminals, the terminals of the integrated circuit being electrically connected to the contactor only when a pressure is exerted onto the contactor by the terminals of the integrated circuit, the method comprising the steps of:

preparing a base of an insulating material on which a plurality of pads of a first conductive material are bonded at positions corresponding to positions of the terminals on the integrated circuit;

bonding a wire of a second conductive material to each of the plurality of pads, and pulling the wire apart from a corresponding one of the plurality of pads so as to form a plurality of contacts of the second conductive material bonded to the plurality of pads, respectively, each contact having a projecting edge with a roughness produced by said step of bonding and pulling of the wire;

forming, after said step of bonding and pulling of the wire, each of the plurality of contacts into a predetermined shape by using a forming tool; and bonding, after said step of forming of each of the plurality of contacts, a second wire of a third conductive material to each of the plurality of contacts, and pulling the second wire apart from a corresponding one of the plurality of contacts so as to laminate the contacts of the second conductive material by a plurality of second contacts of the third conductive material, each second contact having a projecting edge with a roughness produced by said step of bonding and pulling of the second wire.

9. A method of production of an integrated circuit contactor for testing an integrated circuit having terminals, the terminals of the integrated circuit being electrically connected to the contactor only when a pressure is exerted onto the contactor by the terminals of the integrated circuit, the method comprising the steps of:

preparing a base of an insulating material on which a plurality of pads of a first conductive material are bonded at positions corresponding to positions of the terminals on the integrated circuit;

transporting a plurality of pieces of a second conductive material above the plurality of pads on the base by using a bonding head, the bonding head including a holding part for holding the pieces thereon and a bonding part for bonding the pieces to the plurality of pads, the pieces being held by the holding part of the bonding head during the transport of the pieces;

bonding the plurality of pieces of the second conductive material to the plurality of pads by using the bonding part of the bonding head respectively; and forming the plurality of pieces bonded to the plurality of pads so as to produce a plurality of contacts of the second conductive material bonded to the plurality of pads, each contact having a projecting edge with a roughness produced by said step of forming of the pieces, wherein said steps of transporting, bonding and forming are repeated with a plurality of second pieces of a third conductive material, so that the plurality of contacts of the second conductive material are laminated by the plurality of second pieces, each of the plurality of second pieces of the third conductive material having a projecting edge with a roughness produced by forming the plurality of second pieces after the second pieces are bonded to the plurality of pieces of the second conductive material.

10. A method of production of an integrated circuit contactor for testing an integrated circuit having terminals, the terminals of the integrated circuit being electrically connected to the contactor only when a pressure is exerted onto the contactor by the terminals of the integrated circuit, the method comprising the steps of:

preparing a base of an insulating material on which a plurality of pads of a first conductive material are bonded at positions corresponding to positions of the terminals on the integrated circuit;

transporting a plurality of pieces of a second conductive material above the plurality of pads on the base by using a bonding head, the bonding head including a holding part for holding the pieces thereon and a bonding part for bonding the pieces to the plurality of pads, the pieces being held by the holding part of the bonding head during the transport of the pieces;

bonding the plurality of pieces of the second conductive material to the plurality of pads, respectively, by using the bonding part of the bonding head;

leveling the plurality of pieces of the second conductive material by using a leveling tool so that the plurality of pieces have respective top surfaces leveled with each other;

transporting a plurality of second pieces of a third conductive material above the plurality of pieces, the top surfaces of which are leveled with each other, by using the holding part of the bonding head;

bonding the plurality of second pieces of the third conductive material to the plurality of pieces, respectively, by using the bonding part of the bonding head; and forming the plurality of second pieces of the third conductive material, bonded to the plurality of pieces of the second conductive material, so as to produce a plurality of contacts of the third conductive material, each contact having a projecting edge with a roughness produced by said step of forming of the second pieces.

11. The method according to claim 10, wherein the third conductive material of the plurality of second pieces is different from the second conductive material of the plurality of pieces.

12. The method according to claim 10, wherein the plurality of pieces of the second conductive material are prepared, before said step of transporting, to have a size smaller than a size of one of the plurality of pads.

13. The method according to claim 10, wherein the plurality of pieces of the second conductive material are formed into balls before said step of transporting.

14. The method according to claim 10, wherein the bonding head further includes a forming part for forming the plurality of contacts of the third conductive material from the plurality of second pieces, and the plurality of contacts being produced by using the forming part of the bonding head during said step of forming.

15. The method according to claim 14, wherein the plurality of contacts are sequentially produced one by one by using the bonding head, the bonding head having a cavity used to form one of the second pieces of the third conductive material into a predetermined shape, the cavity of the bonding head not touching neighboring ones of the second pieces when a corresponding one of the plurality of contacts is produced.

16. The method according to claim 10, wherein the bonding head is a leveling tool, the plurality of contacts being produced by one operation of the leveling tool so that the plurality of contacts have respective top surfaces leveled with each other.

17. The method according to claim 10, wherein the bonding head includes a recessed cavity and a pressing peripheral portion, the recessed cavity being placed at a center of one of the plurality of second pieces when forming said one of the plurality of second pieces into a predetermined shape, and the pressing peripheral portion provided around the recessed cavity and used to compress a periphery of one of the plurality of second pieces around the center thereof.

18. The method according to claim 10, wherein the bonding head includes a raised portion at a bottom position of the bonding head, the raised portion of the bonding head being placed into contact with one of the plurality of second pieces when forming said one of the plurality of second pieces into a predetermined shape.

19. The method according to claim 10, wherein the bonding head includes a coarse-surface forming portion at a bottom position of the bonding head, the coarse-surface forming portion being placed into contact with one of the plurality of second pieces when forming said one of the plurality of second pieces into a predetermined shape, so that the plurality of contacts have respective top surfaces that are made coarse by the coarse-surface forming portion.

* * * * *